(12) United States Patent
Takahashi

(10) Patent No.: US 6,969,663 B2
(45) Date of Patent: Nov. 29, 2005

(54) METHOD OF MANUFACTURING A MEMORY INTEGRATED CIRCUIT DEVICE

(75) Inventor: Koji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 142 days.

(21) Appl. No.: 10/650,072

(22) Filed: Aug. 28, 2003

(65) Prior Publication Data

US 2004/0048433 A1 Mar. 11, 2004

(30) Foreign Application Priority Data

Aug. 30, 2002 (JP) .................................... 2002-255919

(51) Int. Cl.⁷ ............................................. H01L 21/76
(52) U.S. Cl. ................................................ 438/400
(58) Field of Search ........................ 438/197, 299, 438/400, 424

(56) References Cited

U.S. PATENT DOCUMENTS 6,034,416 A * 3/2000 Uehara et al. .............. 257/623
6,436,753 B1 * 8/2002 Ikeda et al. ................. 438/238
6,667,507 B2 * 12/2003 Shirota et al. .............. 257/315

FOREIGN PATENT DOCUMENTS

JP 8-186183 7/1996

* cited by examiner

*Primary Examiner*—Michael Lebentritt
*Assistant Examiner*—Scott B. Geyer
(74) *Attorney, Agent, or Firm*—Westerman, Hattori, Daniels & Adrian, LLP

(57) ABSTRACT

A method of manufacturing a memory integrated circuit device including a memory cell region and a peripheral circuit region on a semiconductor substrate includes the steps of (a) forming a first groove in the memory cell region on the semiconductor substrate; (b) forming a second groove in the peripheral circuit region on the semiconductor substrate; and (c) forming a memory cell transistor in self-alignment with the first groove in the memory cell region and forming a peripheral circuit transistor in the peripheral circuit region using the second groove as an isolation groove. The steps (a) and (b) are performed simultaneously.

17 Claims, 57 Drawing Sheets

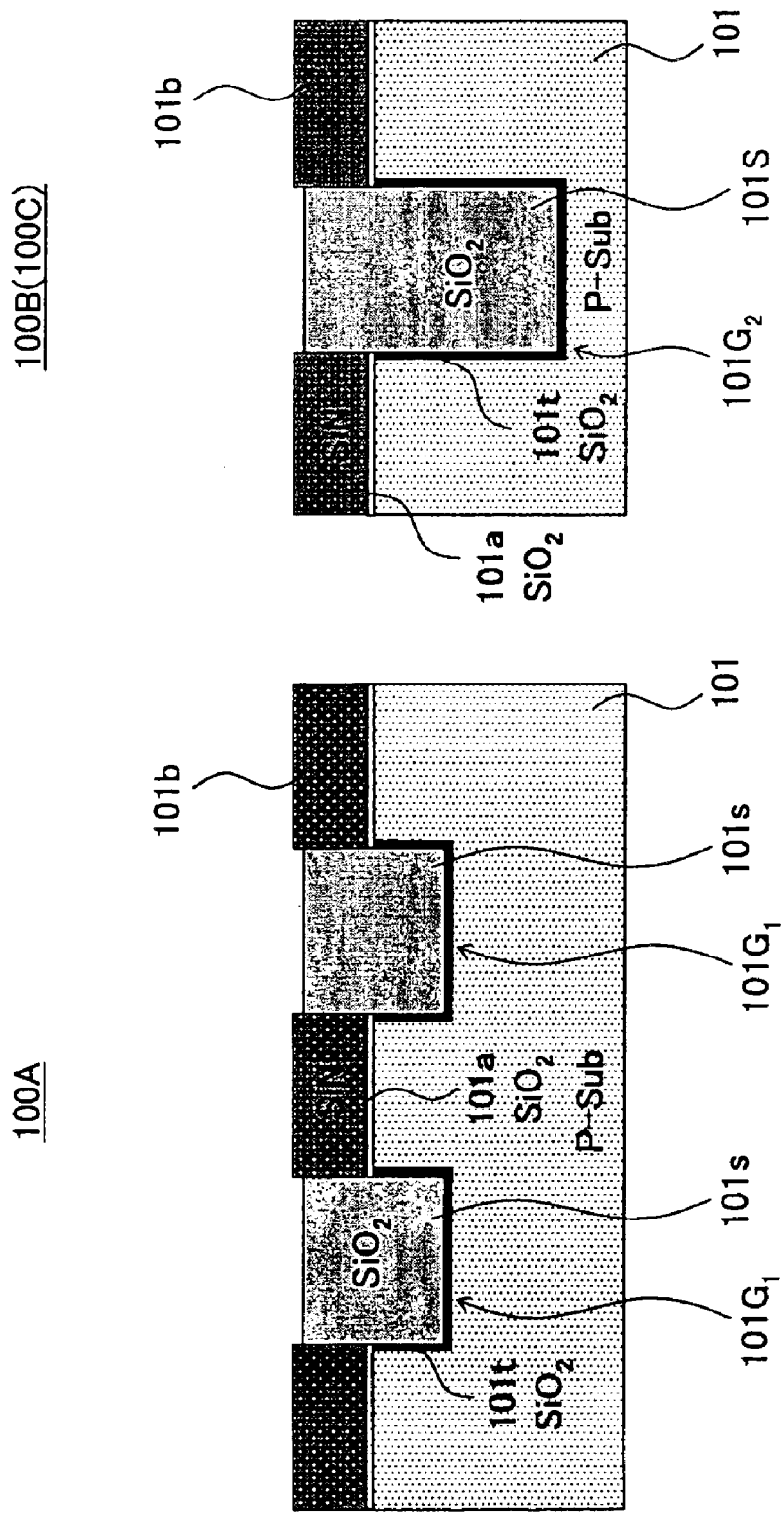

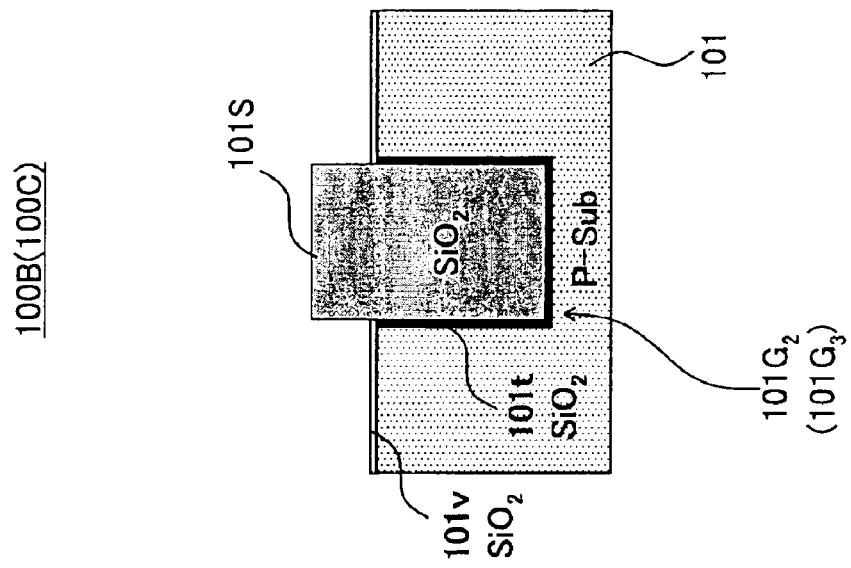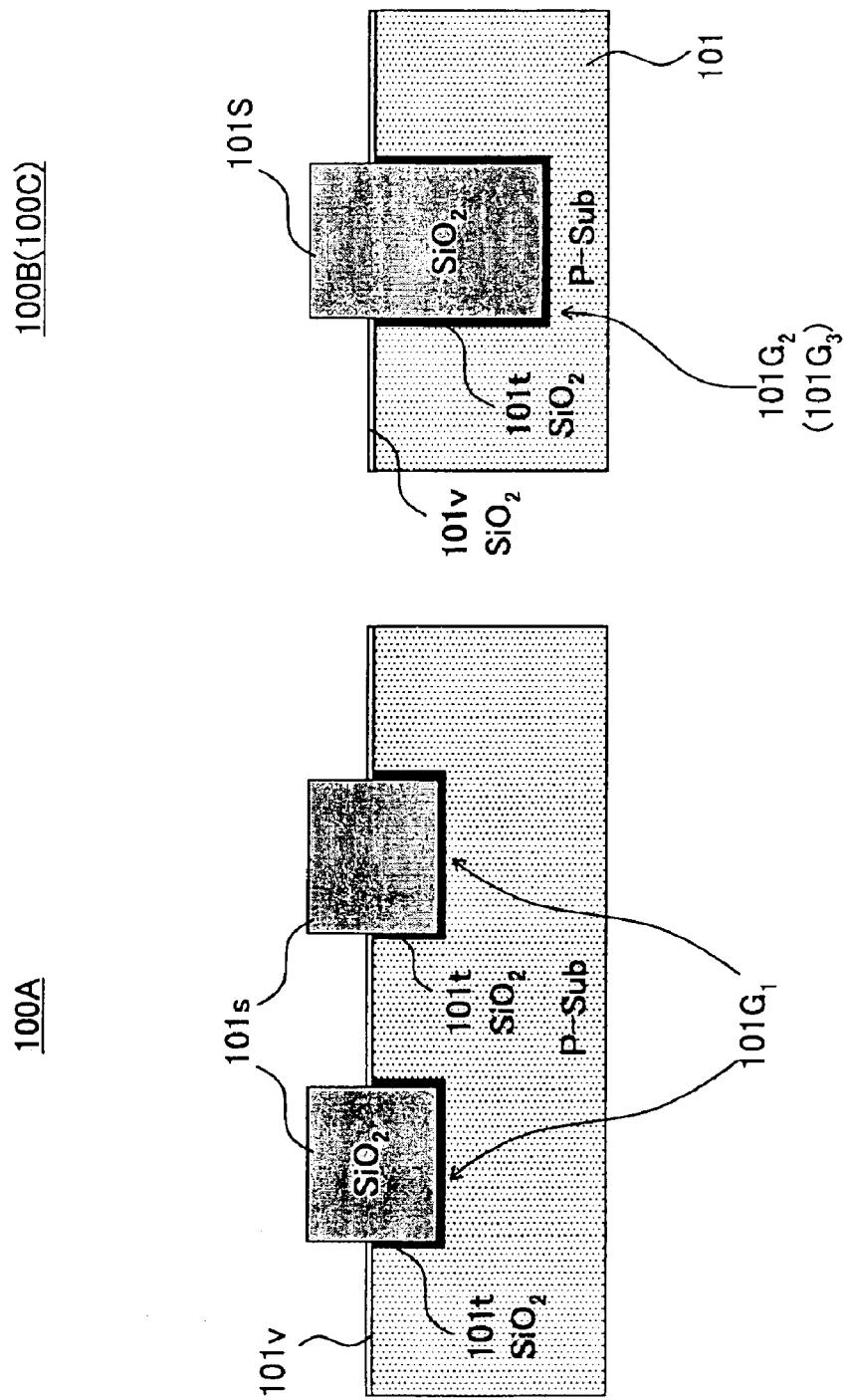

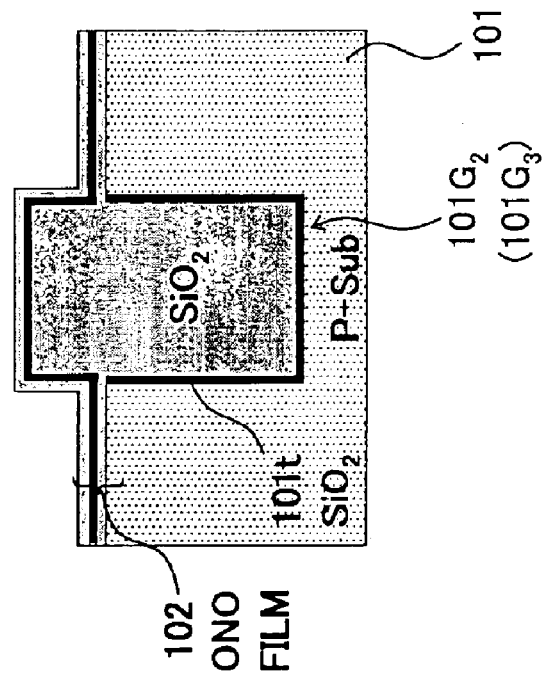
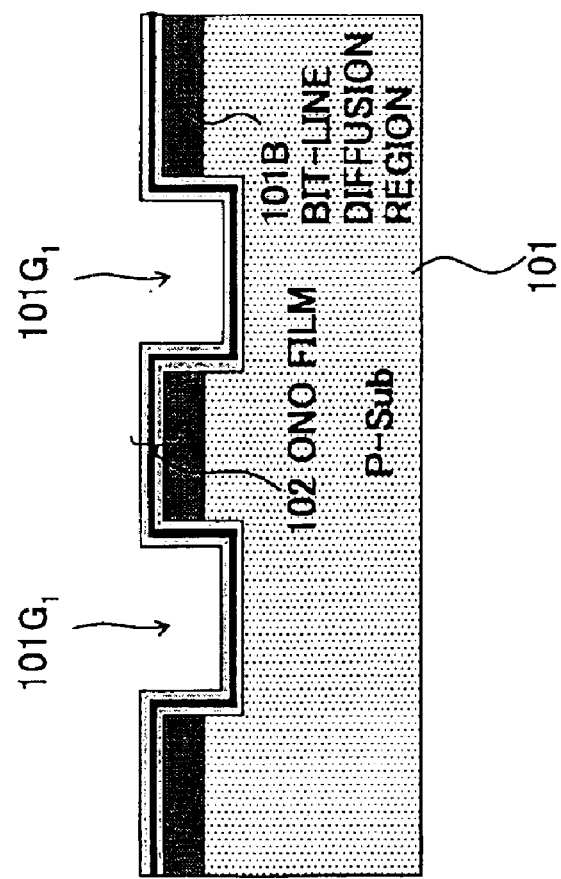

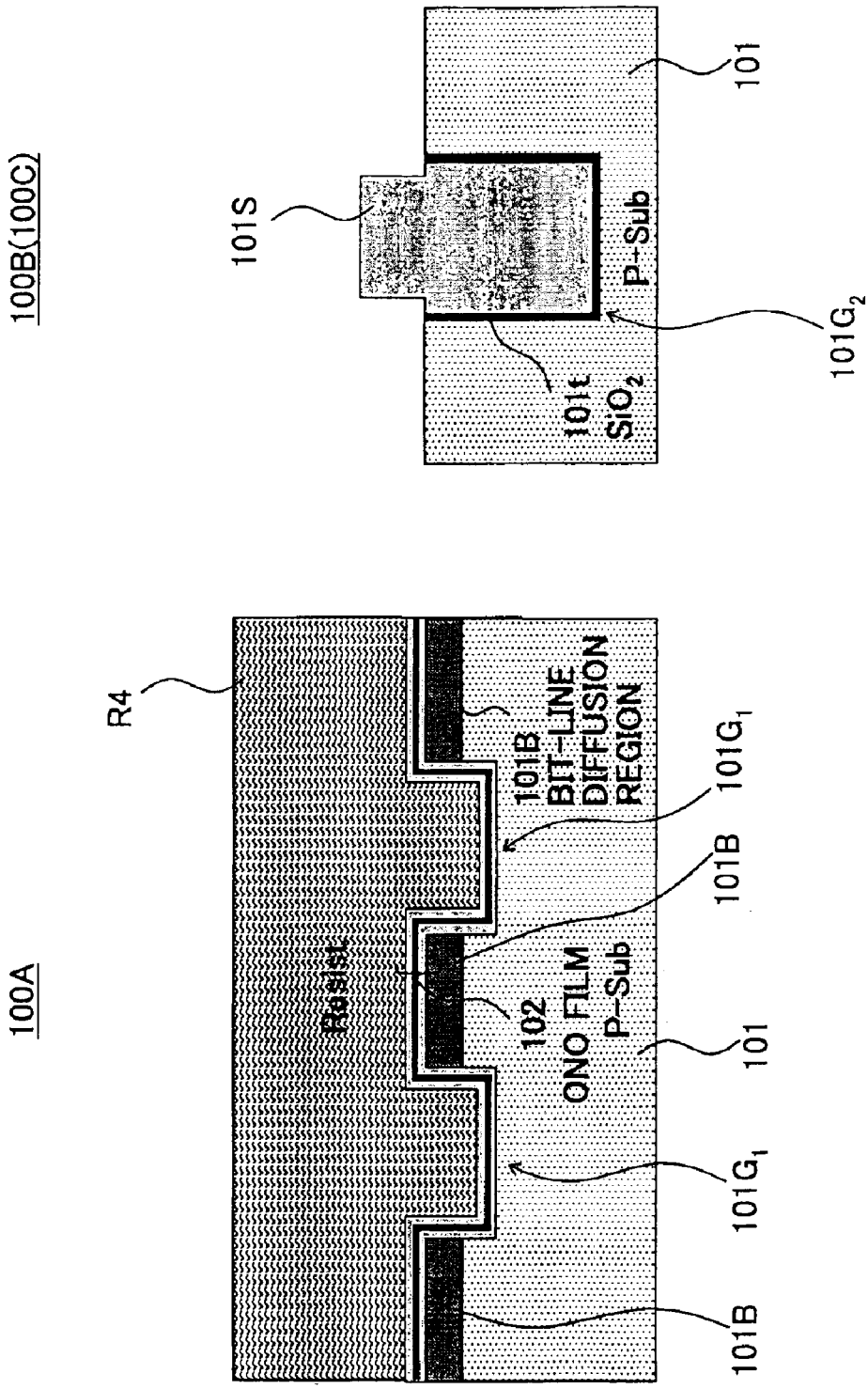

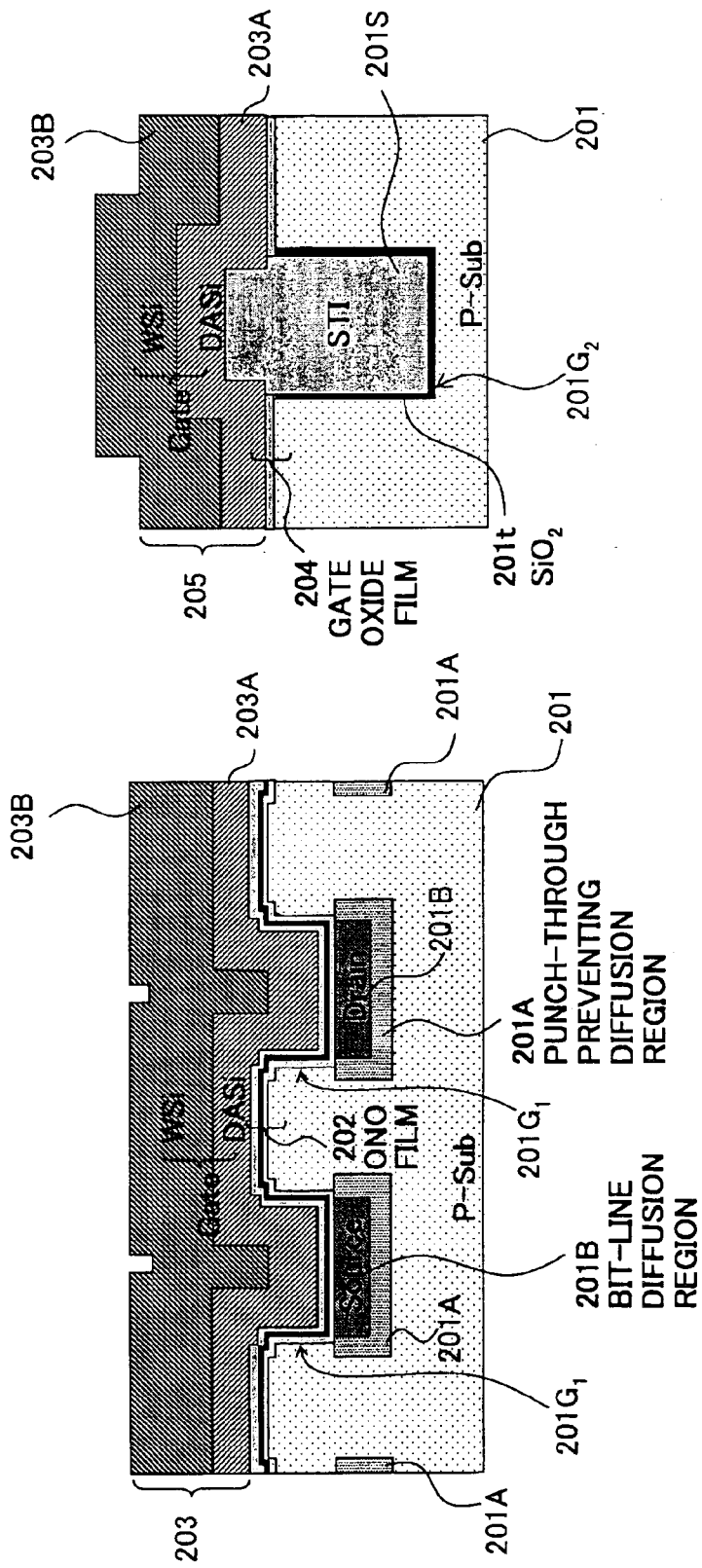

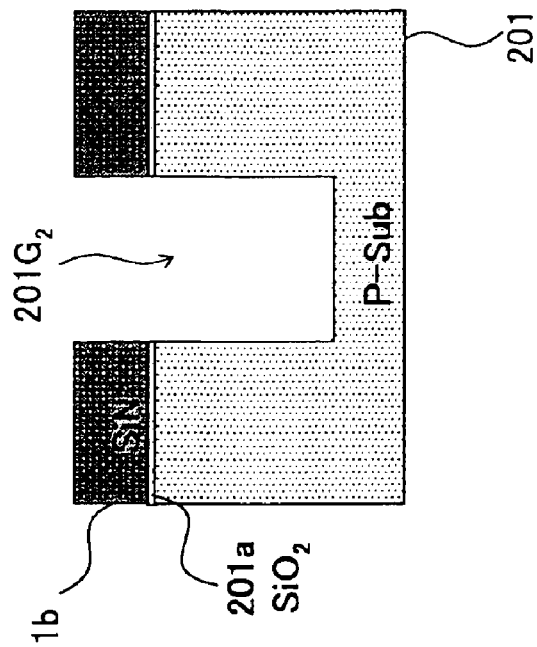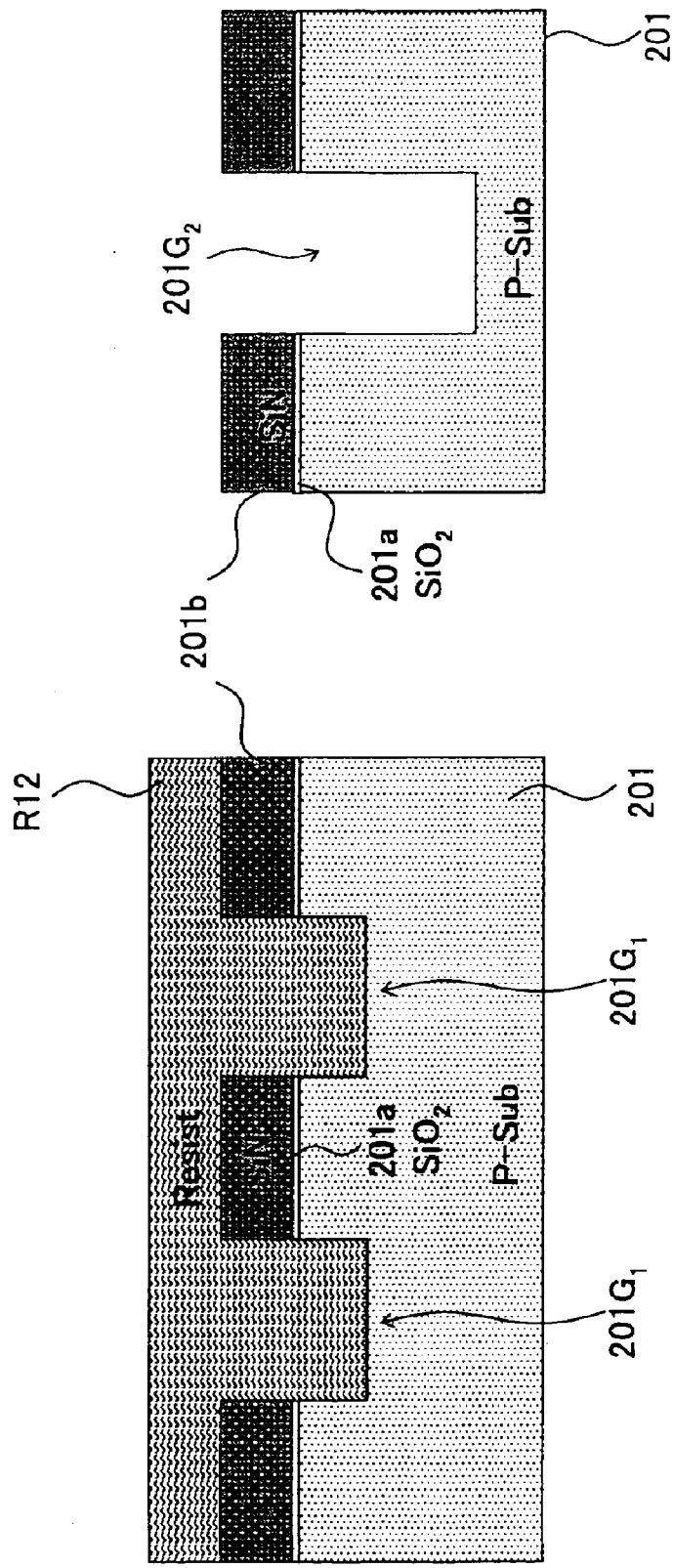

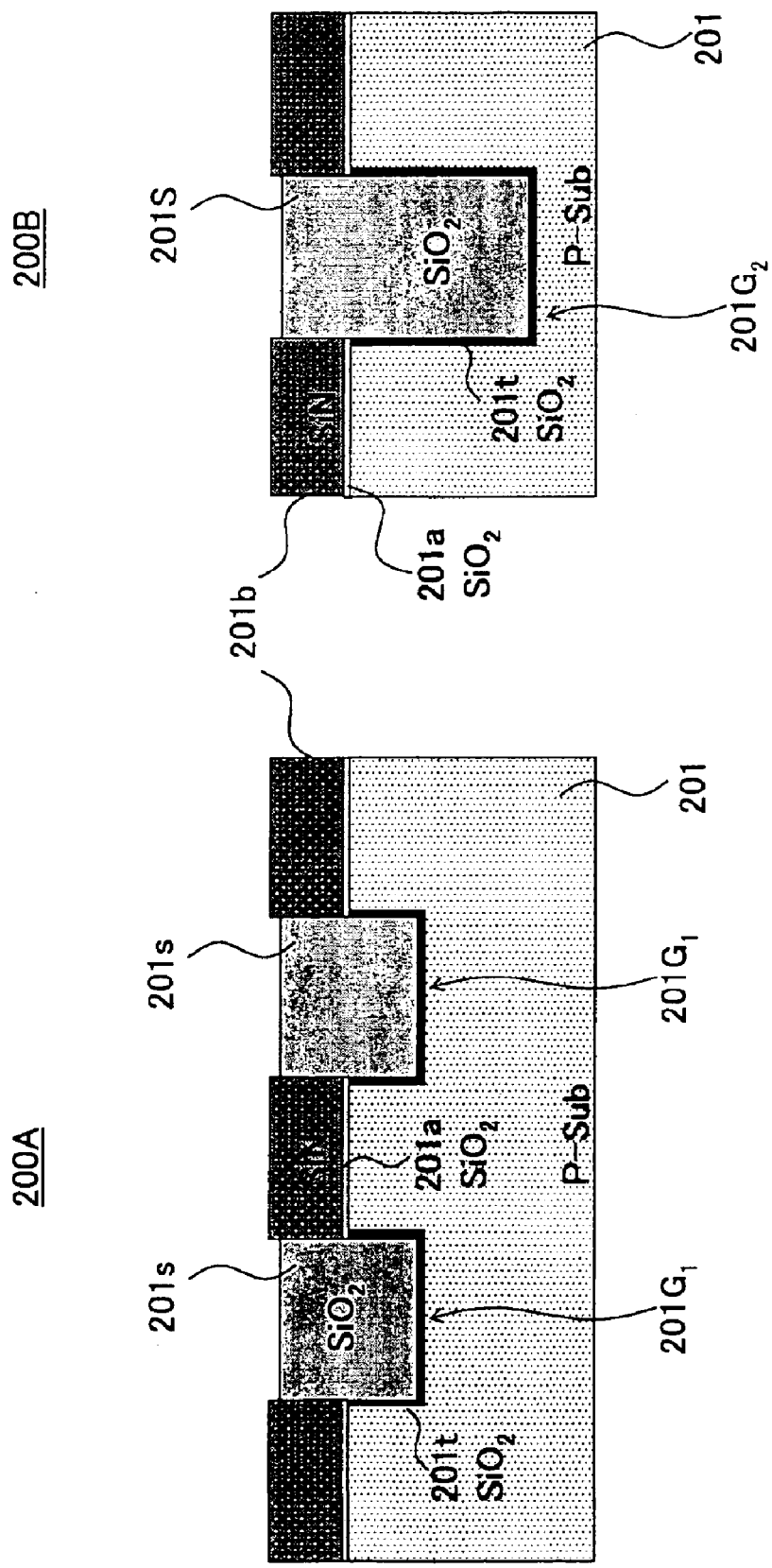

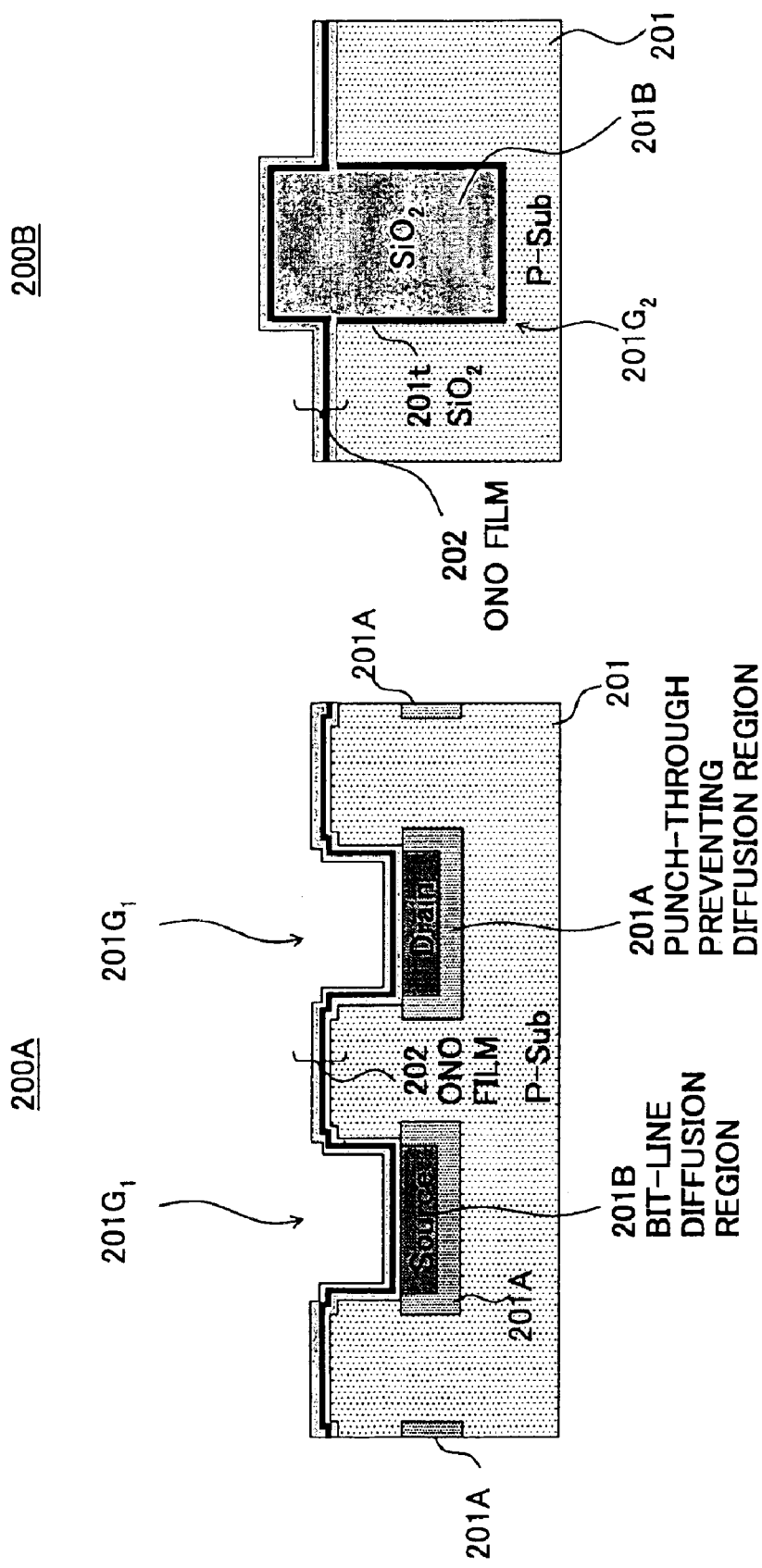

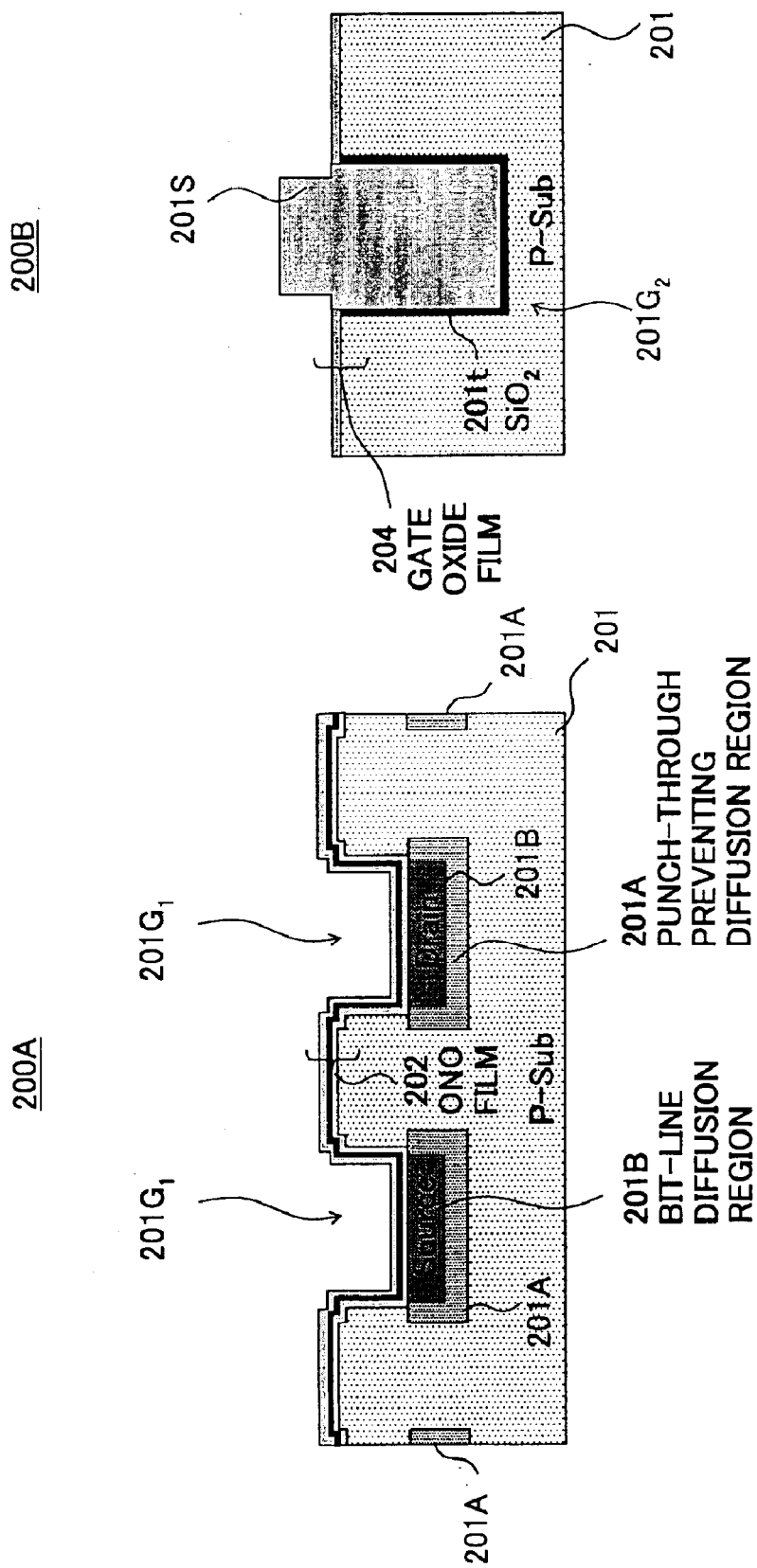

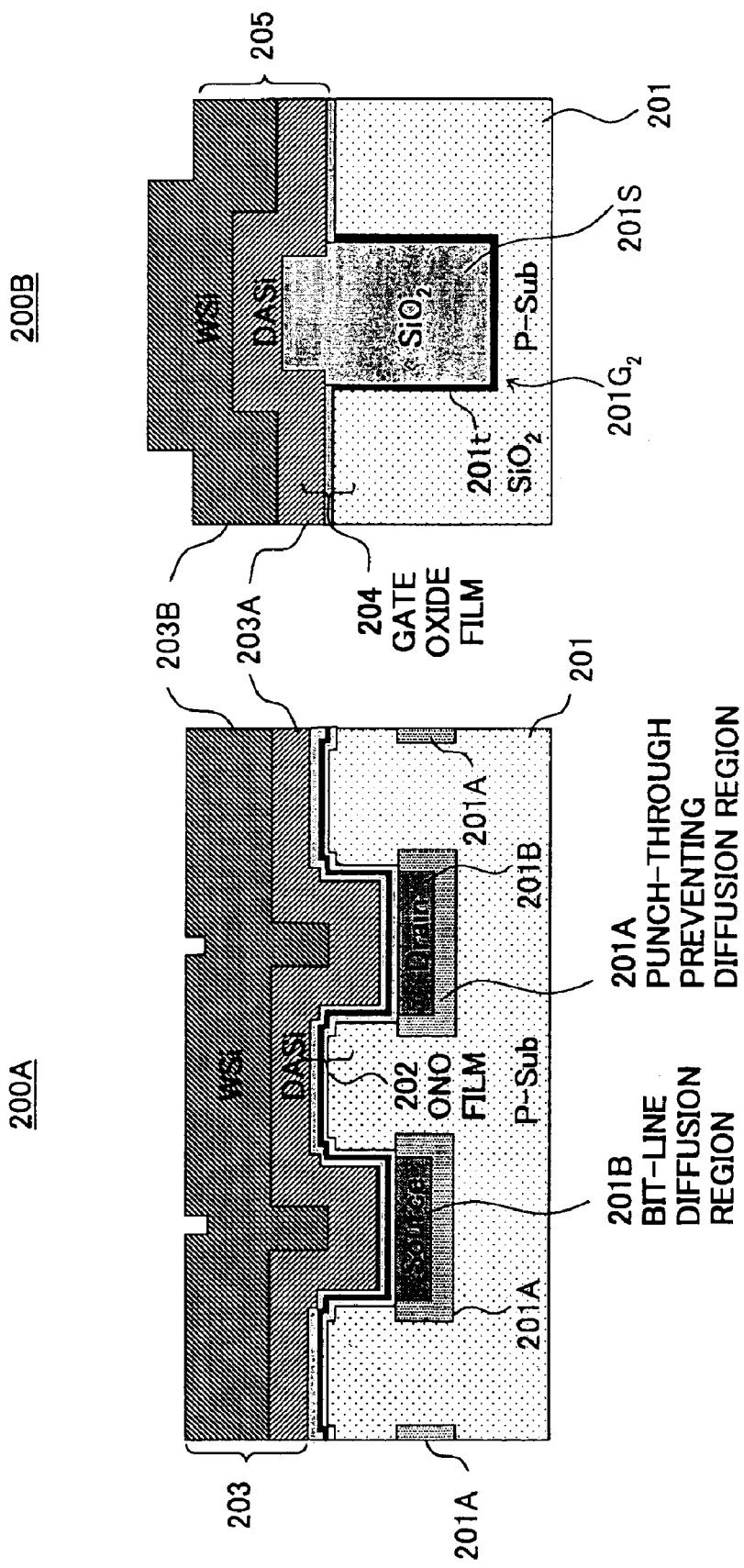

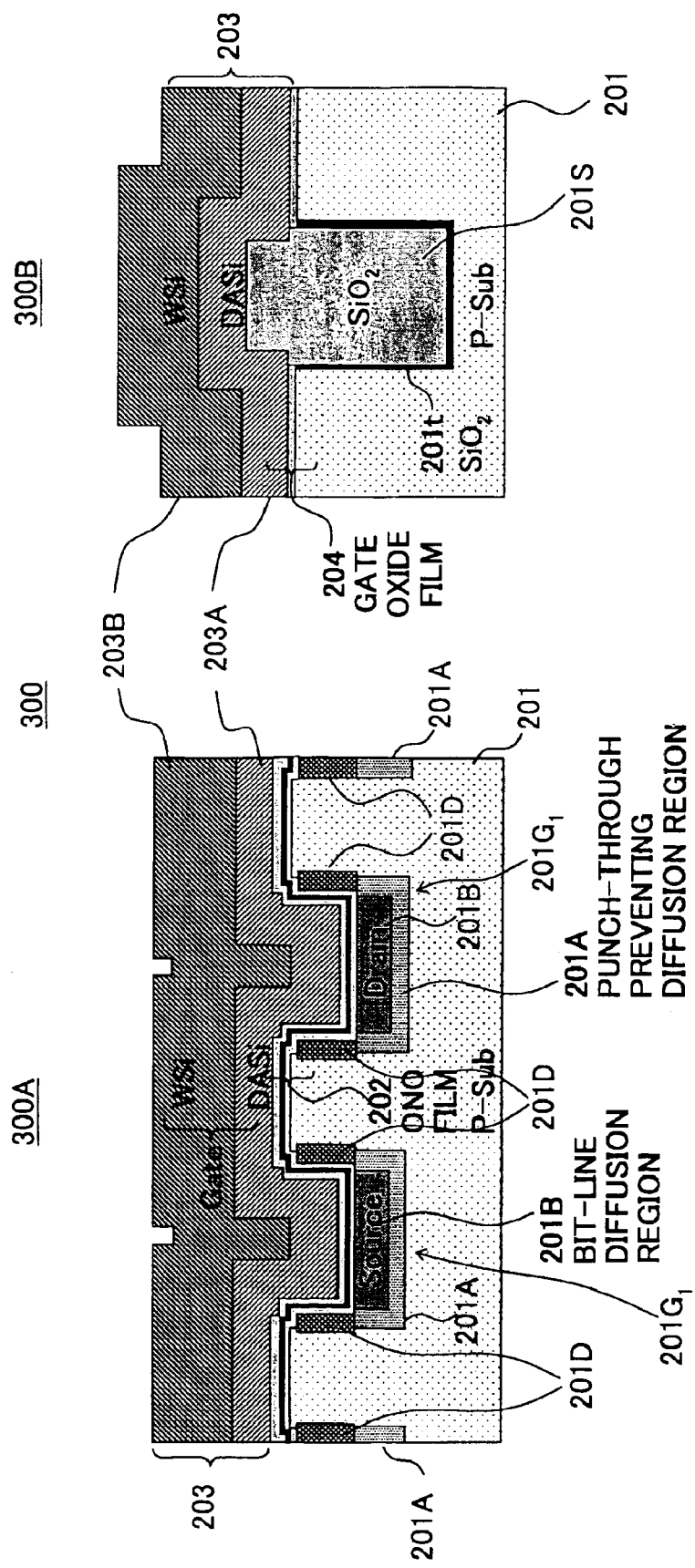

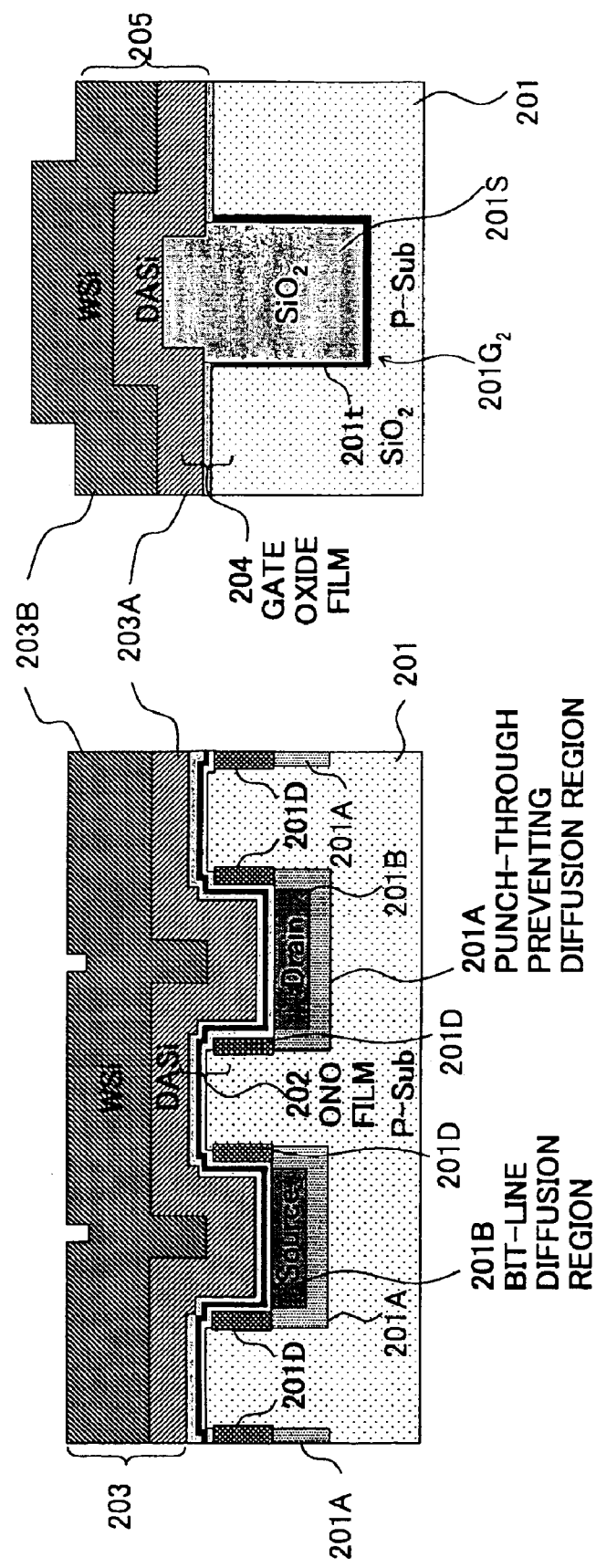

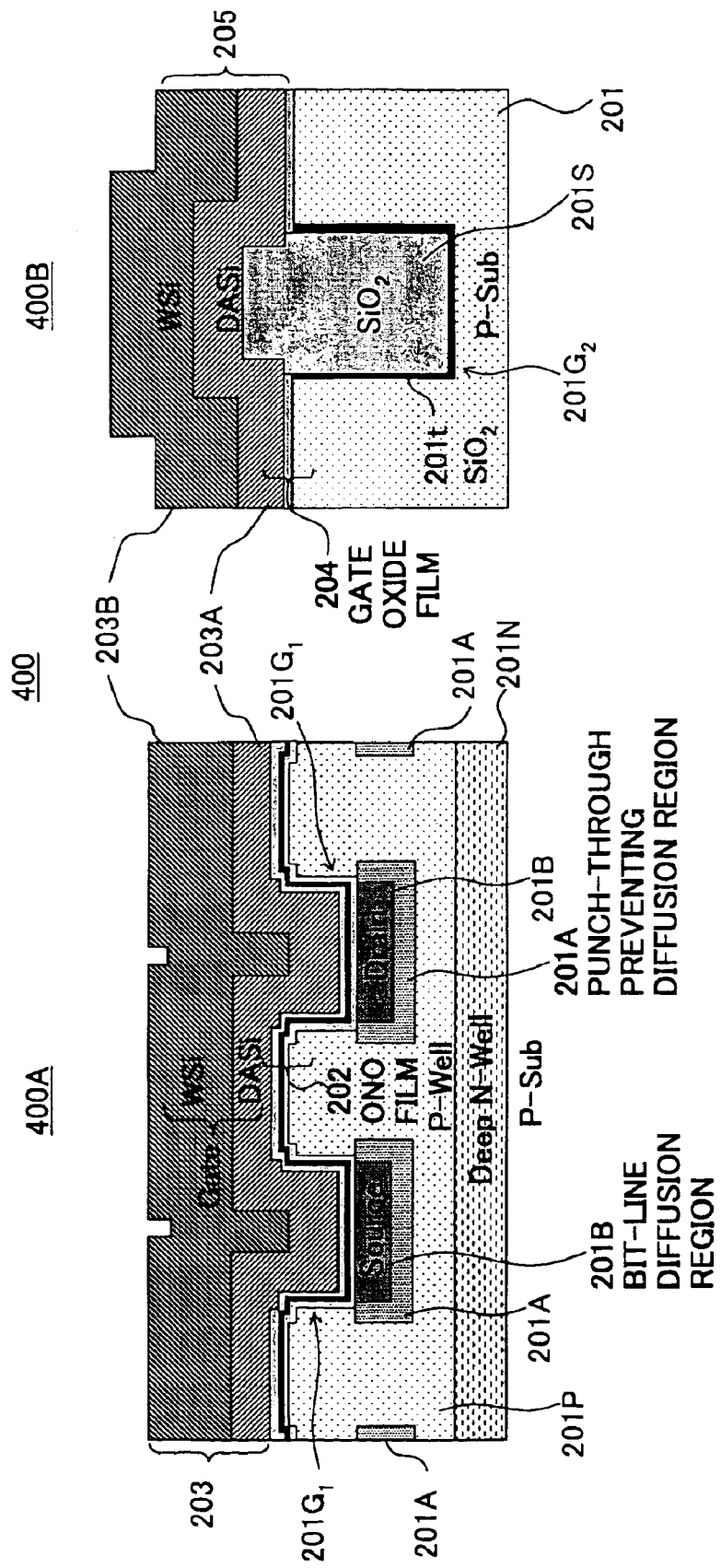

METHOD OF MANUFACTURING A MEMORY INTEGRATED CIRCUIT DEVICE

CROSS-REFERENCE TO RELATED APPLICATION

The present application is based on Japanese Laid-Open Patent Application No. 2002-255919 filed on Aug. 30, 2002, the entire contents of which are hereby incorporated by reference.

BACKGROUND OF THE INVENTION

1. Field of the Invention

The present invention generally relates to semiconductor devices, and more particularly to a nonvolatile semiconductor memory and a method of manufacturing the same.

A flash memory, which is a nonvolatile semiconductor memory having a simple device structure suitable for high integration like a DRAM, is used in a wide variety of information processing apparatuses including computers and mobile phones. Generally, in the flash memory, information is retained in the form of an electric charge using a floating gate.

On the other hand, recently, there has been proposed a nonvolatile semiconductor memory having an MONOS (metal-oxide-nitride-oxide-semiconductor) or SONOS (semiconductor-oxide-nitride-oxide-semiconductor) structure using an insulating film having an ONO structure as the gate insulating film of a MOS transistor so that the nonvolatile semiconductor memory retains information in the form of an electric charge in the ONO gate insulating film. In the nonvolatile semiconductor memory having the MONOS or SONOS structure, multi-level information may be retained by injecting an electric charge into the gate insulating film from the source or drain side.

2. Description of the Related Art

FIG. 1 is a diagram showing the circuit configuration of a conventional NOR/AND-type nonvolatile semiconductor memory 10 having a SONOS structure.

Referring to FIG. 1, the nonvolatile semiconductor memory 10 includes a memory cell array M in which a plurality of memory cell transistors $M_{11}$ through $M_{mm}$ each having a gate insulating film of an ONO structure are arranged in a matrix-like manner. In the memory cell array M, a group of memory cell transistors arranged in a row are connected to any of word lines $WL_n$, $WL_{n+1}$, $WL_{n+2}$, $WL_{n+3}$, . . . in their gate electrodes. Further, a group of memory cell transistors arranged in a column are connected to any of data bit lines $DBL_h$, $DBL_{h+1}$, $DBL_{h+2}$, $DBL_{h+3}$, $DBL_{h+4}$, . . . in their source diffusion regions and their drain diffusion regions.

Further, the nonvolatile semiconductor memory 10 includes selection gate lines SG1, SG2, SG3, SG4, . . . . The data bit lines $DBL_h$ and $DBL_{h+2}$ are connected to the corresponding main bit line $MBL_h$ via selection transistors T1 and T2 connected to the selection gate lines SG1 and SG2. The data bit lines $DBL_{h+1}$ and $DBL_{h+3}$ are connected to the corresponding main bit line $MBL_{h+1}$ via selection transistors T3 and T4 connected to the selection gate lines SG3 and SG3.

In this configuration, information is injected, in the form of channel hot electrons, into the gate insulating films of the ONO structure of the memory cell transistors $M_{11}$, $M_{12}$, . . . from their source or drain regions, and is retained.

FIG. 2 is a diagram showing the configuration of a transistor 20 forming each of the memory cell transistors $M_{11}$, $M_{12}$, . . . in the memory cell array M.

Referring to FIG. 2, the transistor 20 is formed on a Si substrate 21. Buried diffusion regions 21A and 21B are formed in the Si substrate 21 as source and drain regions, respectively. Further, the surface of the substrate 21 is covered with an ONO film 22 of layers of an oxide film 22a, a nitride film 22b, and an oxide film 22c. A polysilicon gate electrode 23 is formed on the ONO film 22.

FIGS. 3A and 3B are diagrams showing a writing operation and an erasing operation, respectively, in the memory cell transistor of FIG. 2.

Referring to FIG. 3A, at the time of writing information, the source region 21A is grounded while a large positive voltage $+V_W$ is applied to the drain region 21B and a large positive voltage $+V_{G1}$ is applied to the gate electrode 23. As a result, electrons are accelerated on the drain end in the channel region so that hot electrons are generated in the channel. The hot electrons thus formed are injected into the ONO film 22. The injected hot electrons are retained in the ONO film 22 in a part close to the above-described drain end (hereinafter, this part is referred to as a drain-end region). By performing switching so that the driving voltage is applied to the source region 21A instead of the drain region 21B, hot electrons may also be injected in the ONO film 22 in a part close to the source end of the channel region (hereinafter, this part is referred to as a source-end region). As a result, in the memory cell transistor 20 of FIG. 2, it is possible to perform writing of two bits per cell shown in FIG. 1.

Meanwhile, at the time of erasing written information, a large positive voltage $+V_e$ is applied to the drain region 21B and a large negative voltage $-V_{G2}$ is applied to the gate electrode 23 as shown in FIG. 3B. Thereby, holes are injected into the ONO film 22 from the drain region 21B, so that the electrons stored in the drain-end region of the ONO film 22 disappear. When the electrons are stored in the source-end region of the ONO film 22, the injection of holes may be performed from the source region 21A.

Further, in the case of reading out information written in the drain-end region of the ONO film 22, a predetermined gate voltage $V_g$ is applied to the gate electrode 23 while the drain region 21B is grounded and a reading voltage $V_r$ is applied to the source region 21A as shown in FIGS. 4A and 4B. As a result, if no electrons are stored in the drain-end region of the ONO film 22, carriers are allowed to flow from the drain region 21B through the channel formed right below the gate electrode 23 to the source region 21A in the Si substrate 21, so that the memory cell transistor 20 conducts electricity. On the other hand, if electrons are stored in the drain-end region of the ONO film 22, the channel right below the gate electrode 23 is blocked at the drain end so that the memory cell transistor 20 conducts no electricity.

In the case of reading out information written to the source-end region of the ONO film 22, the source region 21A may be grounded and the reading voltage $V_r$ may be applied to the drain region 21B in FIGS. 4A and 4B.

FIG. 5 is a plan view of a memory integrated circuit including such a SONOS-type flash memory, showing the configuration of the memory cell array of the memory integrated circuit. FIG. 6A is a sectional view of the memory cell array of FIG. 5 taken along the line 1–1'. FIG. 6B is a sectional view of the isolation structure and its periphery of a peripheral circuit not shown in FIG. 5.

Referring first to the sectional view of FIG. 6A, n-type regions 41A forming a bit-line diffusion layer are formed on a p-type Si substrate 41 parallel to each other. Each of the n-type regions 41A is surrounded by a p-type punch-through preventing diffusion layer 41a.

An insulating film 42 having a so-called ONO structure of layers of a $SiO_2$ film, a SiN film, and a $SiO_2$ film is deposited on the surface of the Si substrate 41. Word line patterns 43 each formed of layers of a polysilicon film 43A and a WSi film 43B are formed on the ONO film 42 parallel to each other so as to cross the drain or source regions 41A at right angles as shown in FIG. 5. As a result, the SONOS-type flash memory cells previously described with reference to FIG. 2 are formed along the cross section of FIG. 6A.

Further, as shown in the plan view of FIG. 5, a p-type isolation diffusion layer 41B is formed in the region of the surface of the Si substrate 41 excluding the regions right below the word lines 43 and the bit-line diffusion layer 41A including the punch-through preventing diffusion layer 41a. The isolation diffusion layer 41B is not shown in the sectional view of FIG. 6A.

Further, as shown in the plan view of FIG. 5, the word lines 43 are connected to word line interconnect patterns $WL_{n+1}$, $WL_{n+2}$, $WL_{n+3}$, ... $WL_{n+i}$ at contact holes 43C. The bit-line diffusion regions 41A are connected to bit line interconnect patterns $BL_{n+1}$, $BL_{n+2}$, $BL_{n+3}$, ... $BL_{n+i}$ at contact holes 41C.

On the other hand, as shown in FIG. 6B, a peripheral circuit that cooperates with the memory cells of FIG. 5 and FIG. 6A has an isolation structure 41S of an STI (shallow trench isolation) type. A gate oxide film 52 is formed on the surface of the Si substrate 41 so as to correspond to the device regions defined by the isolation structure 41S. Further, a gate electrode 53 of layers of the polysilicon film 43A and the WSi film 43B of FIG. 6A is formed on the gate oxide film 52.

The STI structure 41S is formed of an isolation groove 41G formed in the Si substrate 41 and a $CVD-SiO_2$ layer 41s filling the isolation groove 41G. A thermal oxide film 41t is formed on the interface between the isolation groove 41G and the $CVD-SiO_2$ layer 41s so as to prevent carriers from moving along the interface.

The $CVD-SiO_2$ layer 41s protrudes slightly from the surface of the Si substrate 41 in the isolation structure 41S. The gate electrode 53 formed of the polysilicon film 43A and the WSi film 43B extends so as to cover the $CVD-SiO_2$ layer 41s.

A SONOS-type flash memory of this configuration has the merits of simplicity in configuration and storability of multi-level information. However, if the density of integration of the memory integrated circuit is increased, the adjacent drain diffusion layers 41A come close to each other, so that it becomes difficult to avoid the occurrence of a punch-through phenomenon even if the punch-through preventing diffusion layer 41a is provided. Further, if the impurity density of the punch-through preventing diffusion layer 41a is increased so as to control the punch-through phenomenon, the threshold characteristics of the transistors change.

Japanese Laid-Open Patent Application No. 8-186183 proposes a SONOS-type flash memory 60 shown in FIG. 7.

Referring to FIG. 7, n-type diffusion regions 61A serving as a bit-line diffusion layer are formed on the surface of the p-type si substrate 61. Further, grooves 61G are cut into the surface of the Si substrate 61 so as to cross the n-type diffusion regions 61A. An ONO film 62 is formed in the surface of the substrate 61 on which the grooves 61G are formed. Further, a gate electrode 63 is formed on the ONO film 62.

In the flash memory 60 of this structure, the bit-line diffusion regions 61A adjacent to each other across each groove 61G form source and drain regions. A channel is formed along the ONO film 62 between the source and drain regions in the Si substrate 61. Then, information is stored in the form of an electric charge in the proximity of either on of the bit-line diffusion regions 61A in the ONO film 62 by the writing operation described previously with reference to FIG. 3A.

In the flash memory 60, even if the linear distance between the source diffusion region and the drain diffusion region is reduced as a result of miniaturization, the channel extends, bending along the surface of the groove 61G. therefor, the punch-through phenomenon can be effectively controlled.

SUMMARY OF THE INVENTION

Thus, according to the configuration of FIG. 7, a memory cell transistor is formed with respect to each groove 61G formed in the substrate 61 in the memory cell region. Therefore, for instance, the contract holes connecting the diffusion regions 62A to bit-line interconnect patterns or the contact hole connecting the gate electrode 63 to a word-line interconnect pattern is positioned with reference to the grooves 61G. Meanwhile, in the flash memory integrated circuit, isolation grooves are formed in the peripheral circuit region, and the peripheral circuit transistors are formed positioned with respect to the isolation grooves.

If the grooves 61G of FIG. 7 and the isolation grooves in the peripheral circuit region are formable with the same mask, the memory cell transistors in the memory cell region and the peripheral circuit transistors in the peripheral circuit region can be formed with the same mask with high accuracy. According to the configuration of FIG. 7, however, the grooves 61G are formed after the diffusion regions 61A are formed as shown in FIG. 8. Therefore, it is impossible to form the grooves 61G and the isolation grooves in the peripheral circuit region simultaneously with the same mask. Normally, the isolation grooves are formed first on the substrate, and are not formed after the diffusion regions 61A are formed in the memory cell region.

Therefore, when the conventional SONOS-type flash memory of FIG. 7 is formed, it is necessary to position the grooves 61G formed using a second mask with respect to the isolation grooves formed earlier in the peripheral circuit region using a first mask. Accordingly, the positioning accuracy between the devices in the peripheral circuit region and the devices in the memory cell region is inevitably degraded.

Further, according to the structure of FIG. 7, after the diffusion regions 61A are formed on the surface of the substrate 61, a thermal oxide film, which is also used as a gate insulating film in the peripheral circuit region, is typically formed to be 10 nm or over in thickness, and a nitride film and an oxide film are further formed thereon, thus depositing the ONO film 62. Therefore, the impurity density profile of the diffusion regions 61A may be degraded due to the effect of heat accompanying the formation of the ONO film 62. Particularly, in the configuration of FIG. 7, when the impurity density profile of the diffusion regions 61A changes, the channel length between the source and drain regions changes. Further, as previously described, the lowermost layer of the $SiO_2$ film forming the ONO film 62 is used as a gate insulating film in the peripheral circuit region in the flash memory of FIG. 7. In this case, it is necessary to remove the uppermost layer of the $SiO_2$ film and the next layer of the SiN film by etching. In this configuration, however, the film thickness of the gate insulating film may be reduced or a defect may be introduced into the gate insulating film when the $SiO_2$ film or the SiN film is removed by etching.

Accordingly, it is a general object of the present invention to provide a novel and useful method of manufacturing a semiconductor device in which the above-described disadvantages are eliminated.

A more specific object of the present invention is to provide a method of manufacturing a memory integrated circuit device which method makes it possible to form a device in a memory cell region and a device in a peripheral circuit region with high alignment accuracy in a memory integrated circuit device that has a groove formed in each of the memory cell region and the peripheral circuit region and further includes a pumping circuit having a trench capacitor.

The above objects of the present invention are achieved by a method of manufacturing a memory integrated circuit device including a memory cell region and a peripheral circuit region on a semiconductor substrate, the method including the steps of: (a) forming a first groove in the memory cell region on the semiconductor substrate; (b) forming a second groove in the peripheral circuit region on the semiconductor substrate; and (c) forming a memory cell transistor in self-alignment with the first groove in the memory cell region and forming a peripheral circuit transistor in the peripheral circuit region using the second groove as an isolation groove, wherein the steps (a) and (b) are performed simultaneously.

According to the present invention, the first groove and the second groove are simultaneously formed in the memory cell region and the peripheral circuit region, respectively. Therefore, it is possible to form a device in the memory cell region and a device in the peripheral circuit region in ideal positioning agreement with each other without separately forming and positioning a mask for the memory cell region and a mask for the peripheral circuit region.

Additionally, in the above-described method, the step (c) may include the steps of: (d) filling the second groove with an isolation insulating pattern in the peripheral circuit region; (e) forming a first insulating film on a surface of the semiconductor substrate so that the first insulating film successively covers the surface of the semiconductor substrate and a surface of the first groove in the memory cell region; (f) removing the first insulating film from the surface of the semiconductor substrate except for the memory cell region; (g) forming a second insulating film on the surface of the semiconductor substrate in the peripheral circuit region; and (h) forming a conductive film on the semiconductor substrate so that the conductive film covers the first insulating film in the memory cell region and the second insulating film in the peripheral circuit region.

According to the present invention, after forming the first insulating film as an electric charge storing insulating film or a tunnel insulating film in the memory cell region, the first insulating film is removed from the peripheral circuit region, and the second insulating film is newly formed as a gate insulating film in the peripheral circuit region. Therefore, the degradation of the film quality of the gate insulating film or a capacitor insulating film in the peripheral circuit region is avoidable.

BRIEF DESCRIPTION OF THE DRAWINGS

Other objects, features and advantages of the present invention will become more apparent from the following detailed description when read in conjunction with the accompanying drawings, in which:

FIGS. 14A and 14B are diagrams showing the process for manufacturing the SONOS-type flash memory integrated circuit device according to the first embodiment of the present invention;

FIGS. 16A and 16B are diagrams showing the process for manufacturing the SONOS-type flash memory integrated circuit device according to the first embodiment of the present invention;

FIGS. 19A and 19B are diagrams showing the process for manufacturing the SONOS-type flash memory integrated circuit device according to the first embodiment of the present invention;

FIGS. 20A and 20B are diagrams showing the process for manufacturing the SONOS-type flash memory integrated circuit device according to the first embodiment of the present invention;

FIGS. 31A and 31B are sectional views of a SONOS-type flash memory integrated circuit device manufactured by a manufacturing method according to a second embodiment of the present invention;

FIGS. 35A and 35B are diagrams showing the process for manufacturing the SONOS-type flash memory integrated circuit device according to the second embodiment of the present invention;

FIGS. 36A and 36B are diagrams showing the process for manufacturing the SONOS-type flash memory integrated circuit device according to the second embodiment of the present invention;

FIGS. 42A and 42B are diagrams showing the process for manufacturing the SONOS-type flash memory integrated circuit device according to the second embodiment of the present invention;

FIGS. 44A and 44B are diagrams showing the process for manufacturing the SONOS-type flash memory integrated circuit device according to the second embodiment of the present invention;

FIGS. 45A and 45B are diagrams showing the process for manufacturing the SONOS-type flash memory integrated circuit device according to the second embodiment of the present invention;

FIGS. 47A and 47B are sectional views of a SONOS-type flash memory integrated circuit device manufactured by a manufacturing method according to a third embodiment of the present invention;

FIGS. 51A and 51B are diagrams showing the process for manufacturing the SONOS-type flash memory integrated circuit device according to the third embodiment of the present invention;

FIGS. 53A and 53B are sectional views of a SONOS-type flash memory integrated circuit device manufactured by a manufacturing method according to a fourth embodiment of the present invention;

DETAILED DESCRIPTION OF THE PREFERRED EMBODIMENTS

A description will now be given, with reference to the accompanying drawings, of embodiments of the present invention.

[First Embodiment]

Figure 1:
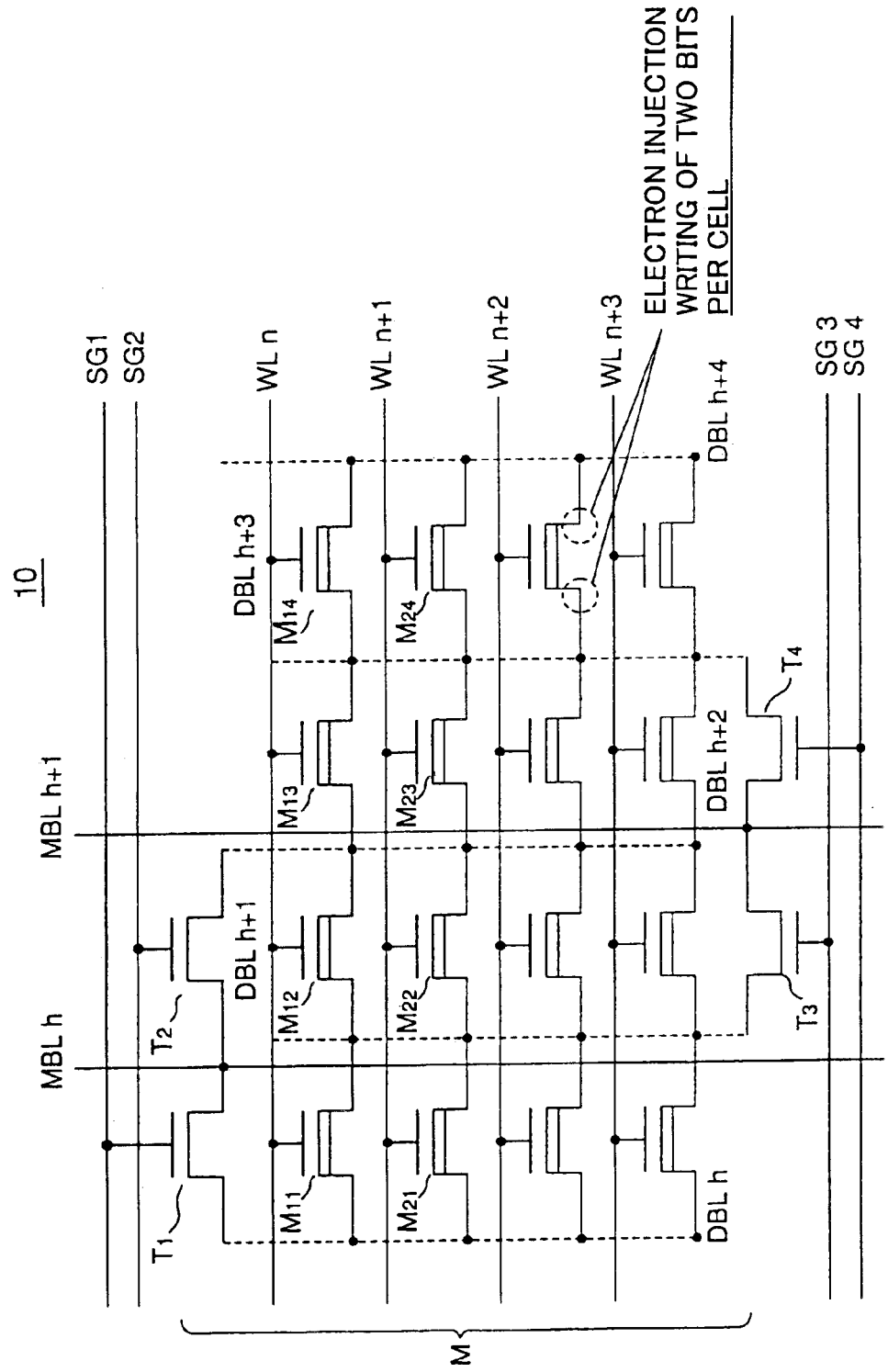
FIG. 1 is a diagram showing the circuit configuration of a conventional SONOS-type flash memory (nonvolatile semiconductor memory)
Figure 2:
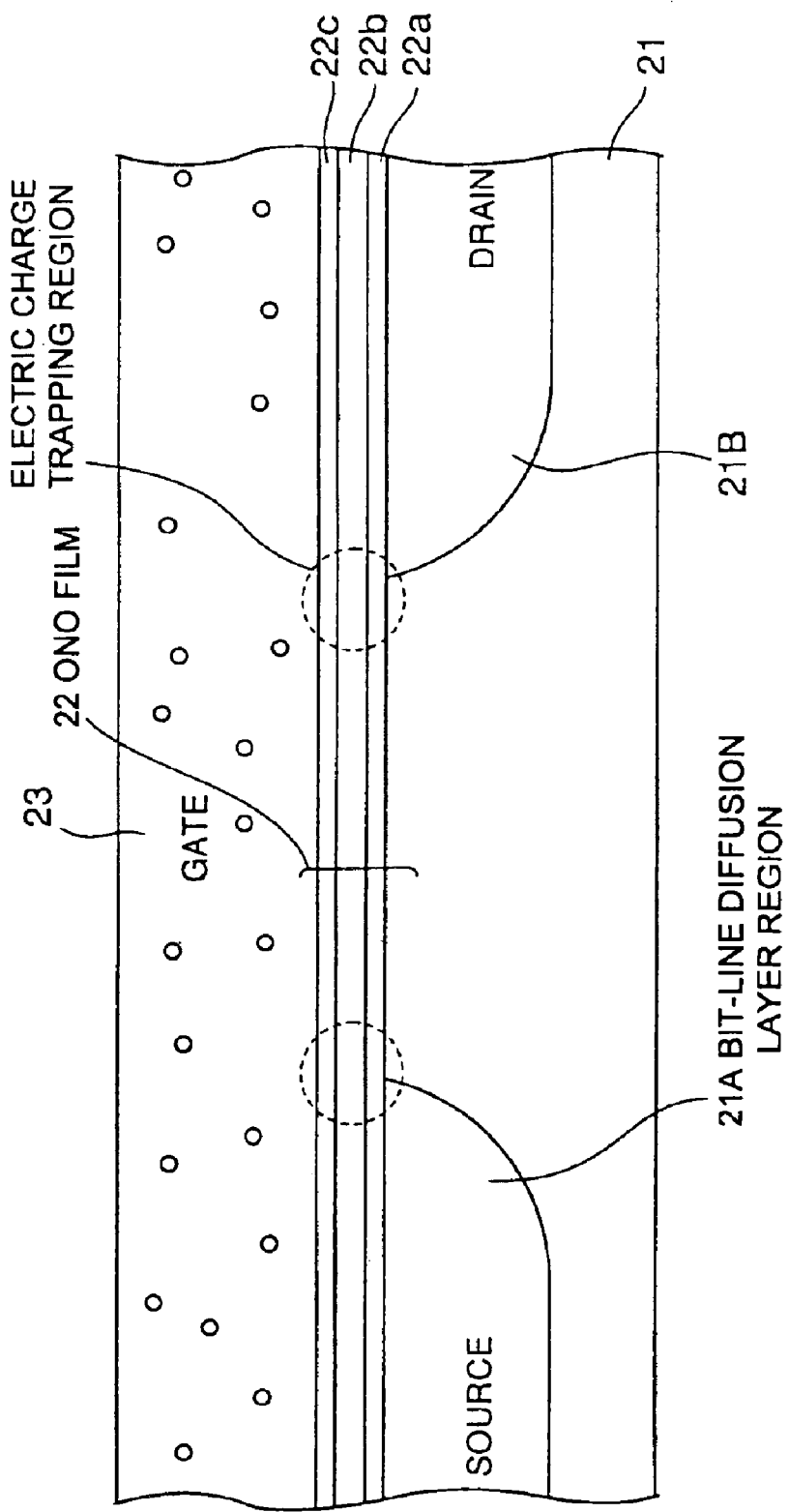
FIG. 2 is a diagram showing the basic configuration of the flash memory of FIG. 1.
Figure 3A:
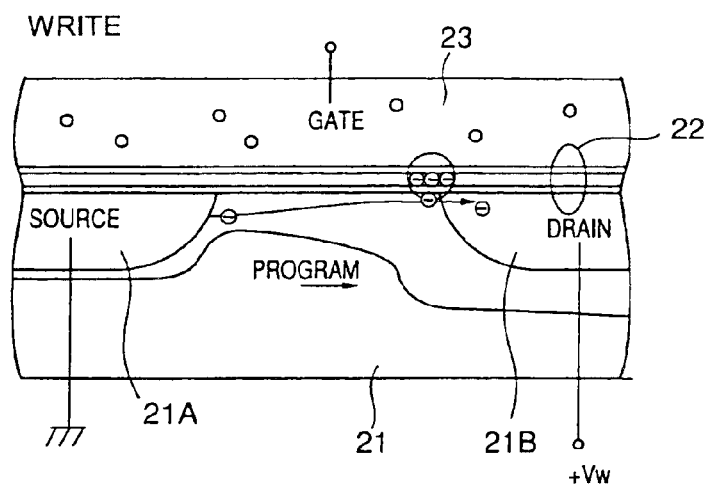
FIGS. 3A and 3B are diagrams for illustrating a writing operation and an erasing operation, respectively, in the flash memory of FIG. 1.
Figure 3B:
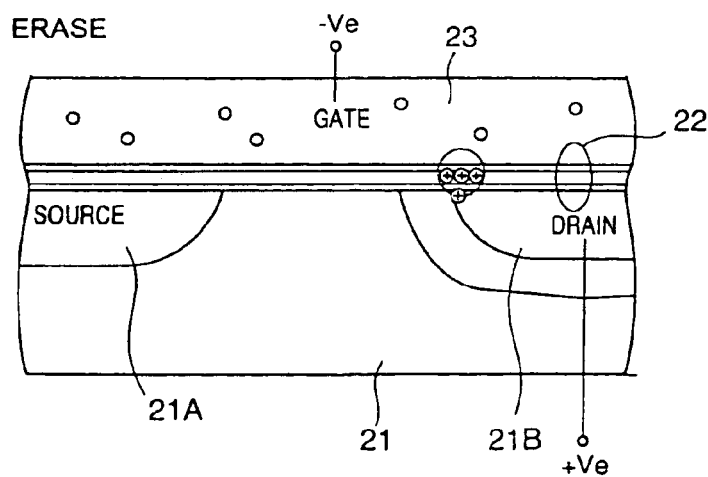
Figure 4A:
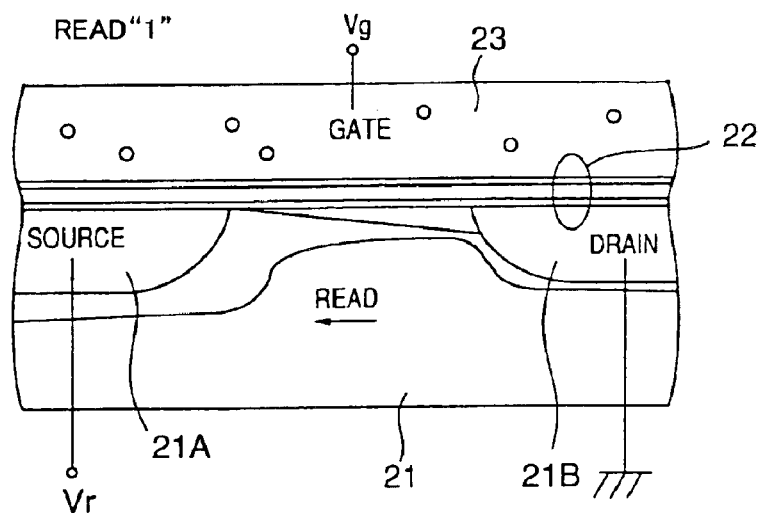
FIGS. 4A and 4B are diagrams for illustrating a reading operation in the flash memory of FIG. 1.
Figure 4B:
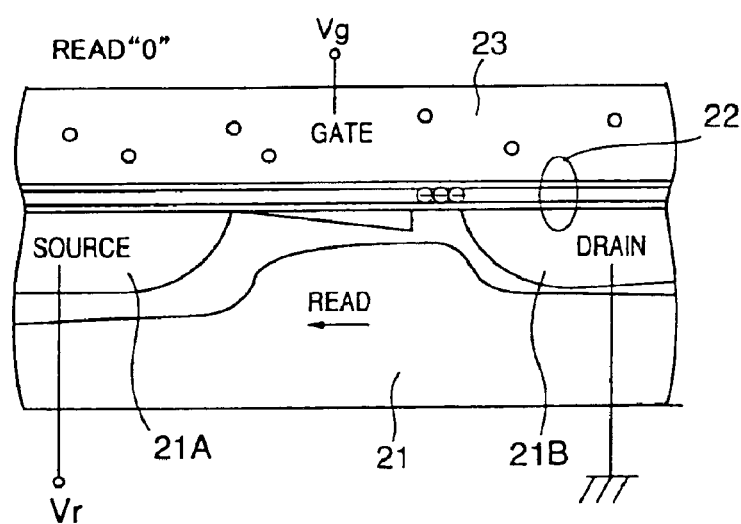
Figure 5:
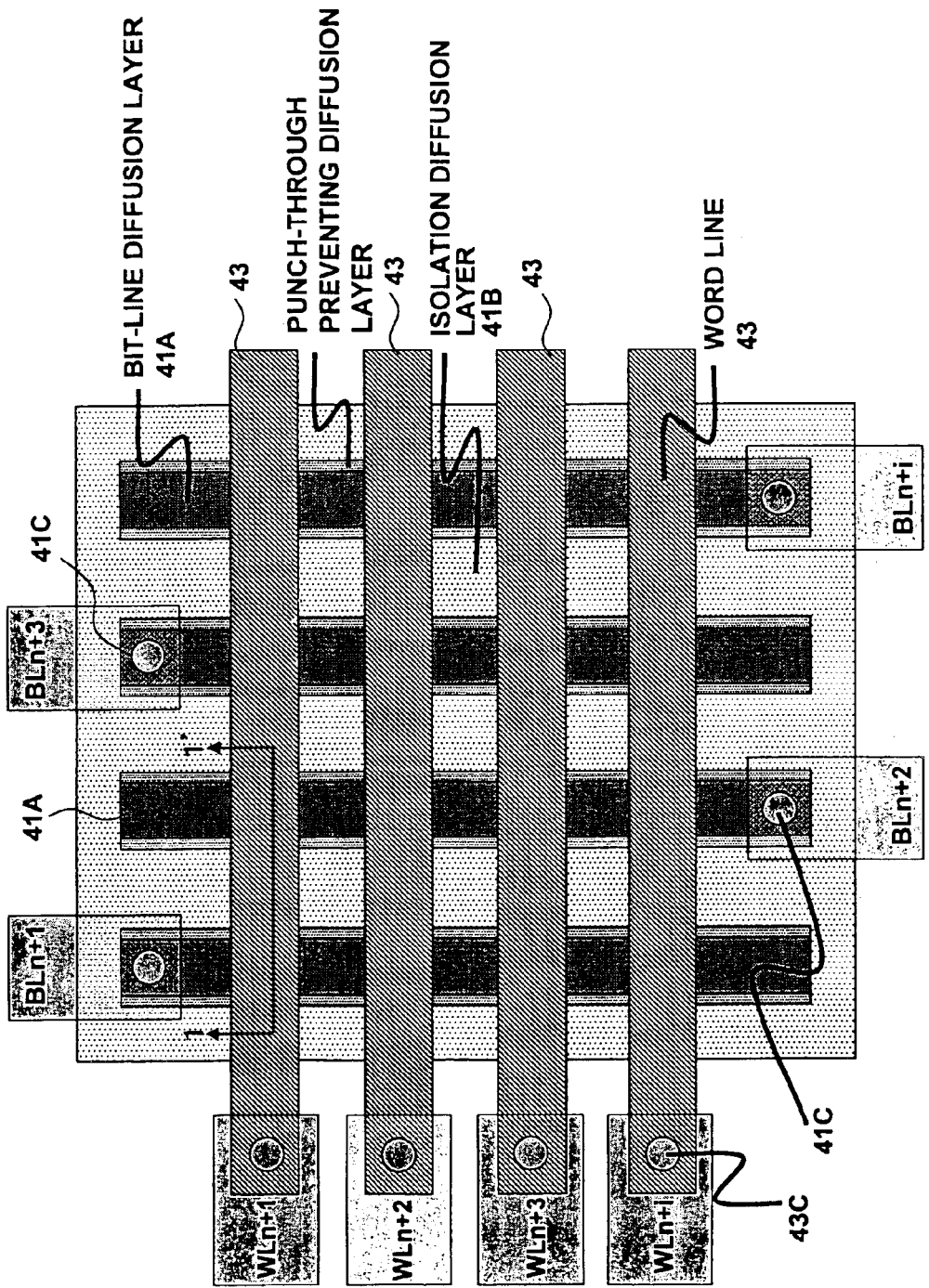
FIG. 5 is a plan view of a flash memory integrated circuit device including a conventional SONOS-type flash memory.
Figure 6:
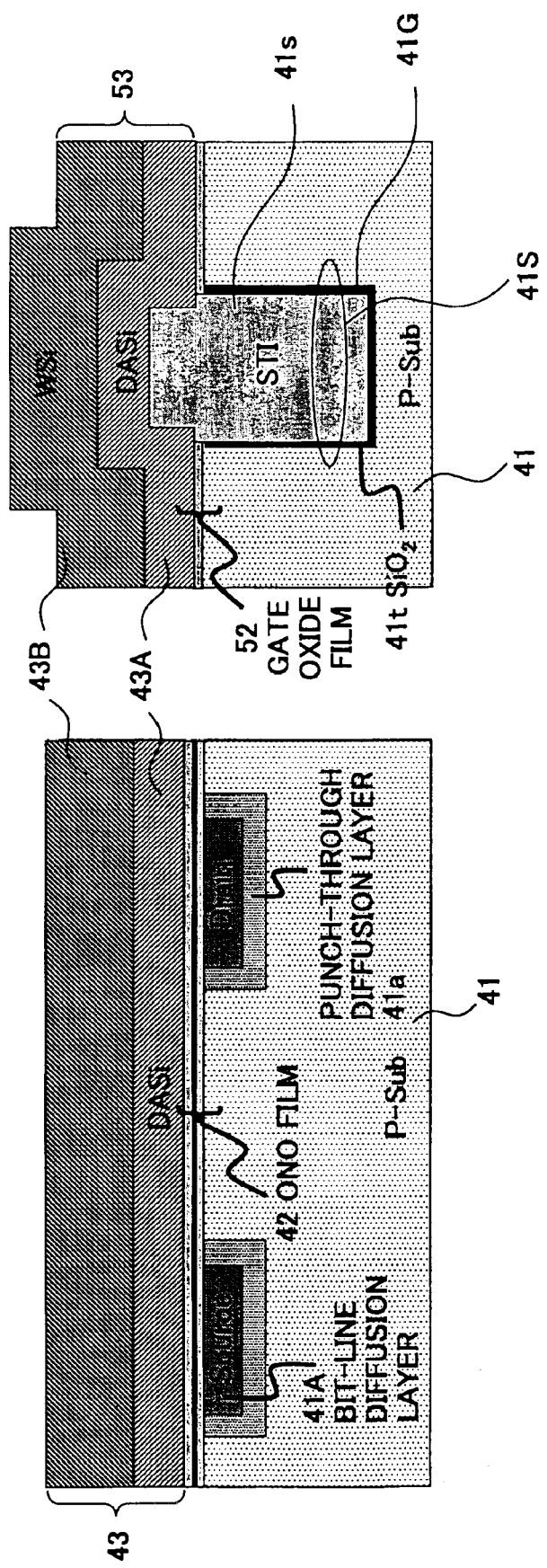
FIGS. 6A and 6B are sectional views of the flash memory integrated circuit device of FIG. 5.
Figure 7:
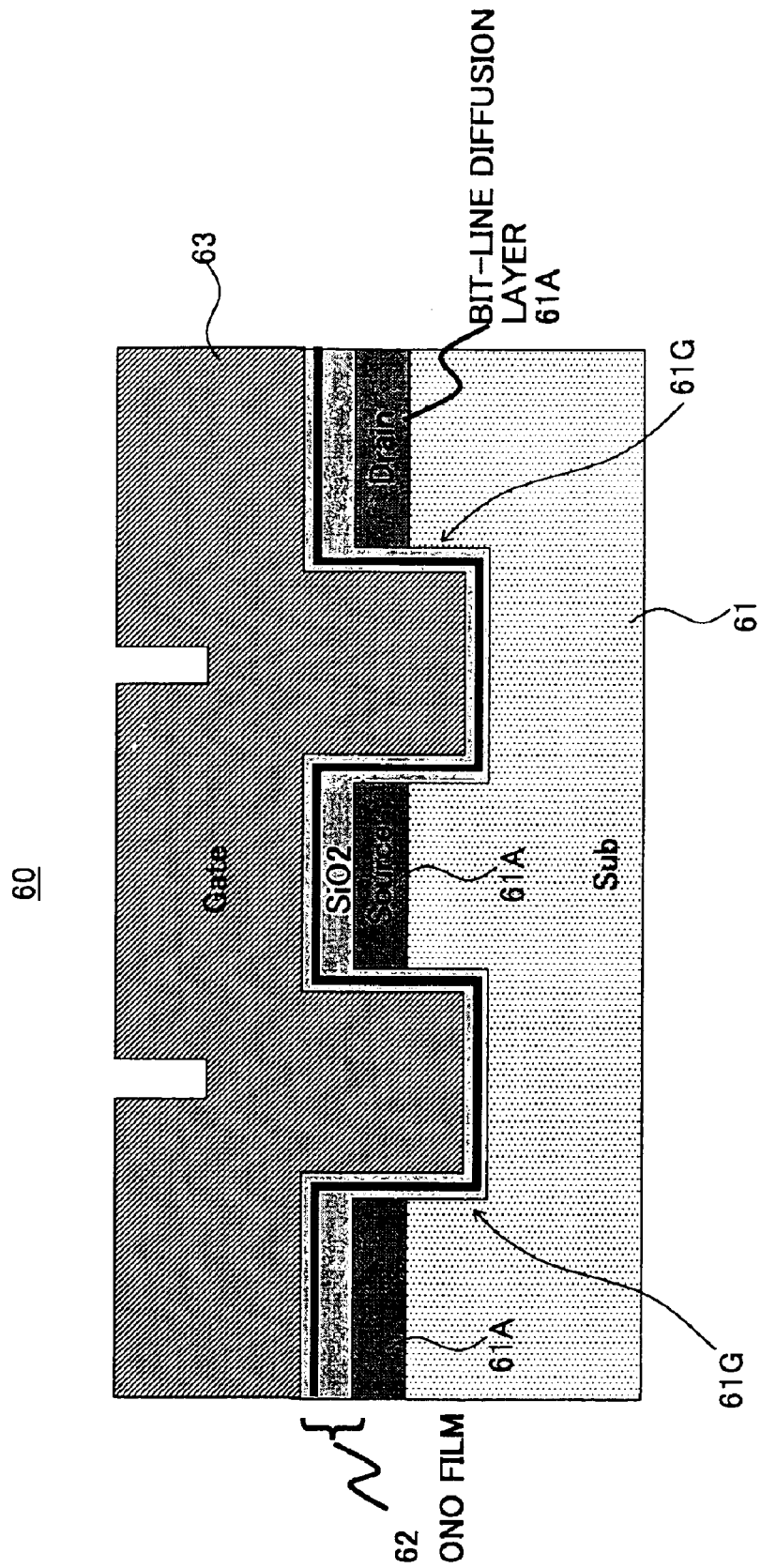
FIG. 7 is a sectional view of another conventional SONOS-type flash memory integrated circuit device.
Figure 8:
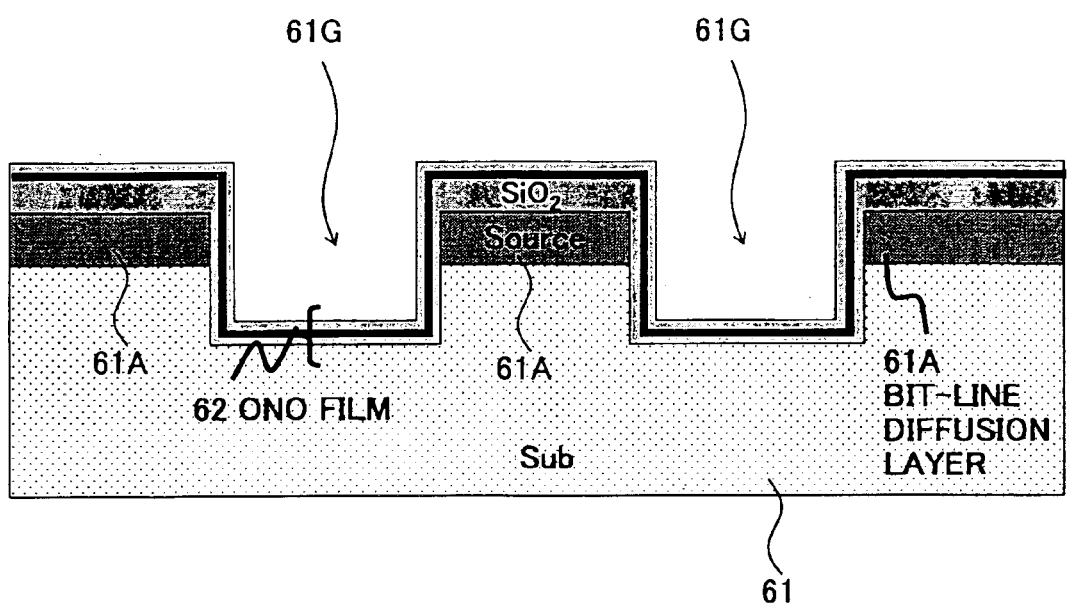
FIG. 8 is a diagram showing part of a process for manufacturing the SONOS-type flash memory integrated circuit device of FIG. 7.
Figure 9:
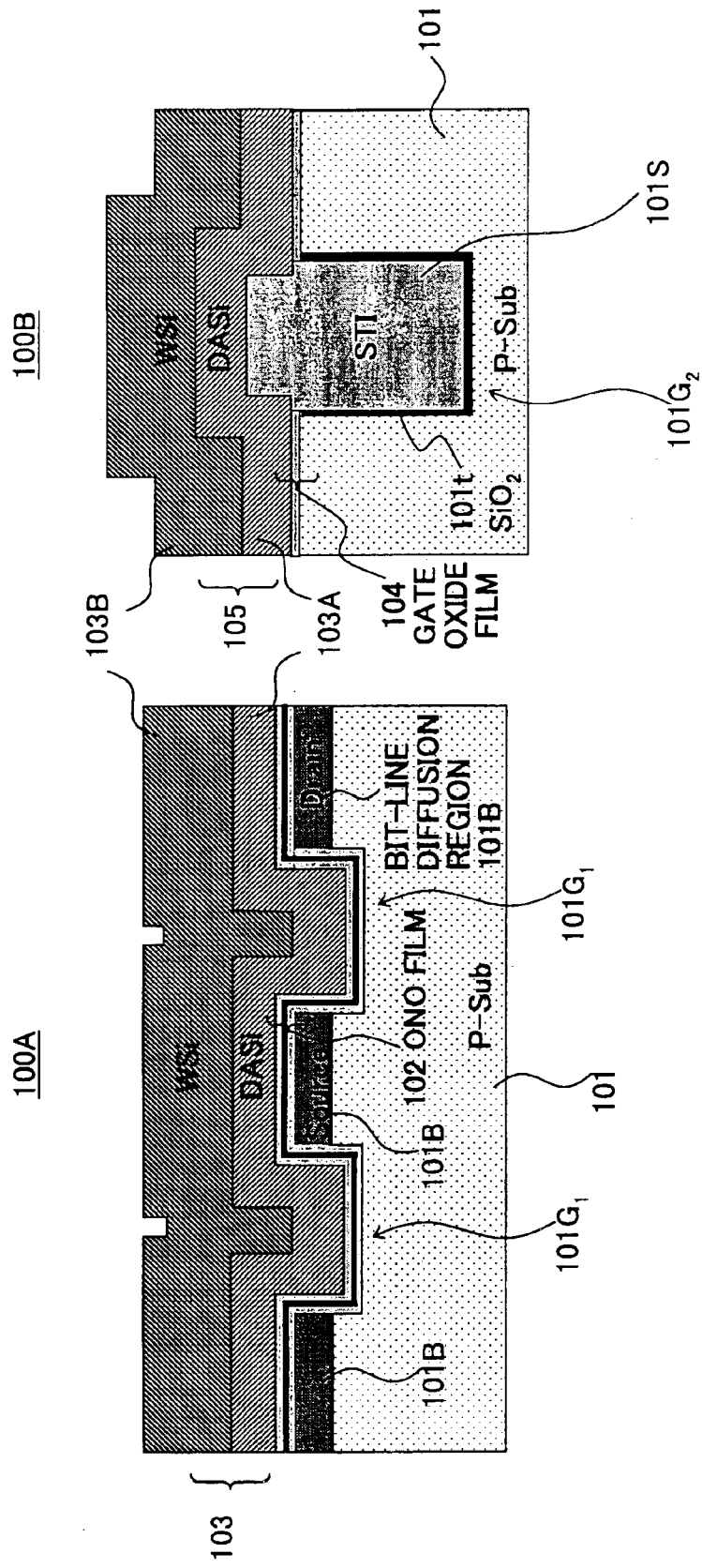
FIGS. 9A and 9B are sectional views of a SONOS-type flash memory integrated circuit device manufactured by a manufacturing method according to a first embodiment of the present invention.
Figure 10:
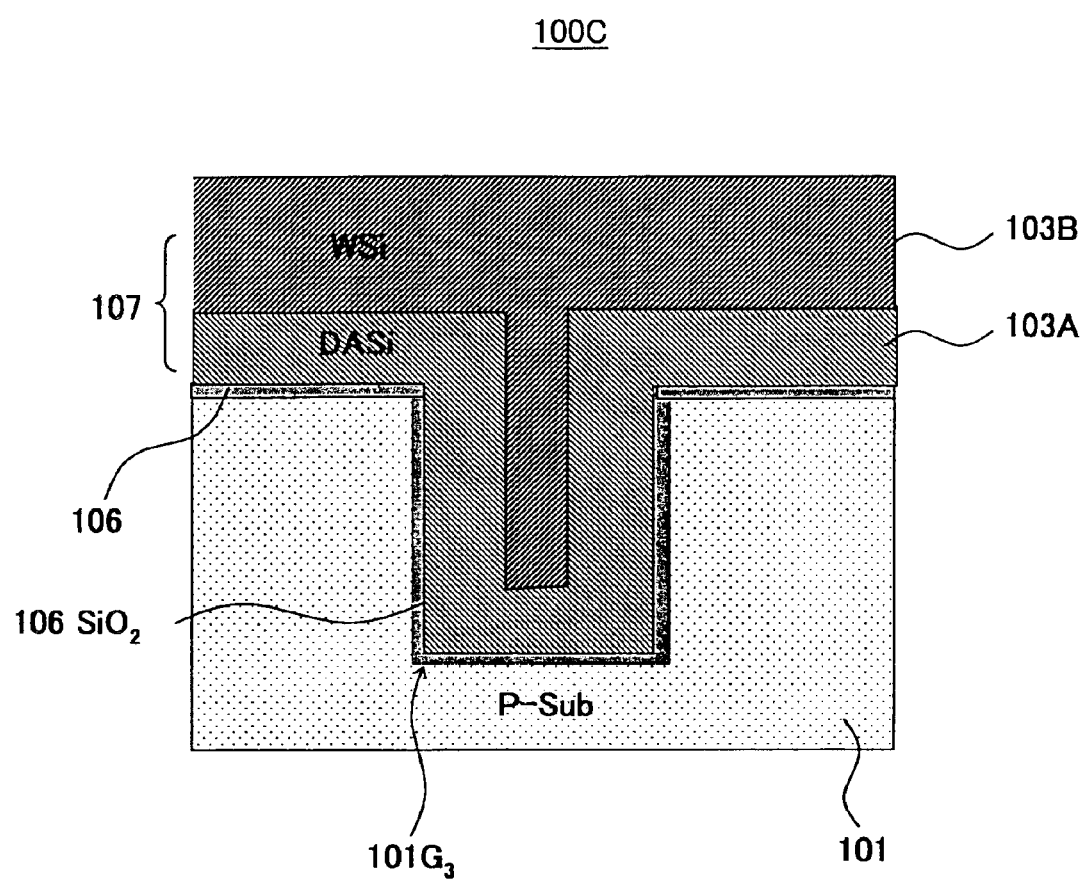
FIG. 10 is another sectional view of the SONOS-type flash memory integrated circuit device manufactured by the manufacturing method according to the first embodiment of the present invention.

FIGS. 9A, 9B, and 10 are sectional views of a memory integrated circuit device 100 including a SONOS-type flash memory manufactured by a manufacturing method according to a first embodiment of the present invention.

Referring to the drawings, the memory integrated circuit device 100, which is formed on a p-type Si substrate 101, includes a memory cell region 10A shown in FIG. 9A, a peripheral circuit region 100B shown in FIG. 9B, and a pumping circuit region 100C shown in FIG. 10.

Referring to FIG. 9A, a plurality of grooves 101$G_1$ are formed on the surface of the Si substrate 101 parallel to each other in the memory cell region 100A. A plurality of n-type bit-line diffusion regions 101B are further formed on the surface of the Si substrate 101, separated by the grooves 101$G_1$.

As shown in FIG. 9A, the depth of the grooves 101$G_1$ is greater than the thickness of the diffusion regions 101B. Further, an electric charge storing film 102 having an ONO structure is formed along the shapes of the grooves 101$G_1$ on the surface of the Si substrate 101.

Further, a gate electrode (film) 103 of layers of a polysilicon film 103A and a WSi film 103B is formed on the uppermost layer of a $SiO_2$ film of the electric charge storing film 102 so as to extend in a direction to cross the grooves 101$G_1$ at right angles.

On the other hand, an isolation groove 101$G_2$ having a greater depth than the grooves 101$G_1$ is formed in the Si substrate 101 in the peripheral circuit region 100B of FIG. 9B. The isolation groove 101$G_2$ is filled, through a thermal oxide film 101$t$ formed on the surface of the isolation groove 101$G_2$, with an isolation insulating pattern 101S having an STI structure.

Thus, in the SONOS-type flash memory shown in FIG. 9A, one of the paired bit-line diffusion regions 101B adjacent to each other across each groove 101$G_1$ forms a source region, and the other forms a drain region. Further, a channel is formed from the source region to the drain region along the surface of each groove 101$G_1$ in the Si substrate 101.

Therefore, by the operation shown previously in FIGS. 3A, 3B, 4A, or 4B, binary information may be written to, erased from, or read out from the electric charge storing film 102 formed of the ONO film in the form of an electric charge.

Meanwhile, as shown in FIG. 9B, in the peripheral circuit region 100B, the surface of the Si substrate 101 is covered with a thin gate oxide film 104 different from the electric charge storing film 102. Another gate electrode film (pattern) 105 of layers of the same polysilicon film 103A and WSi film 103B as employed for the gate electrode 103 is formed on the gate insulating film 104.

Further, as shown in FIG. 10C, a groove 101$G_3$ is formed in the pumping circuit region 100C so as to have the same depth as the groove 101$G_2$. A thermal oxide film 106 equal to the gate oxide film 104 is formed on the groove 101$G_3$ so as to have the same film thickness as the gate oxide film 104. The thermal oxide film 106 extends to cover the surface of the Si substrate 101 as well in the pumping circuit region 100C. Further, the groove 101$G_3$ is filled, through the thermal oxide film 106, with a capacitor electrode 107 formed of the polysilicon film 103A and the WSi film 103B.

FIGS. 11A through 30 are diagrams showing a process for manufacturing a flash memory integrated circuit device according to the first embodiment of the present invention.

Figure 11B:
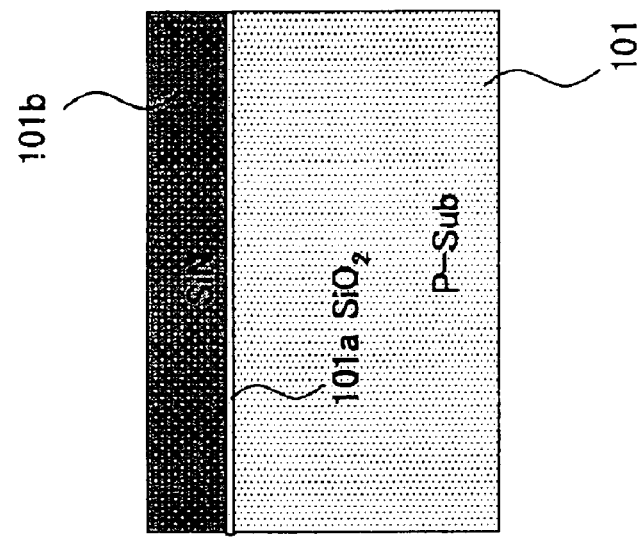
FIGS. 11A and 11B are diagrams showing a process for manufacturing the SONOS-type flash memory integrated circuit device according to the first embodiment of the present invention.
Figure 11A:
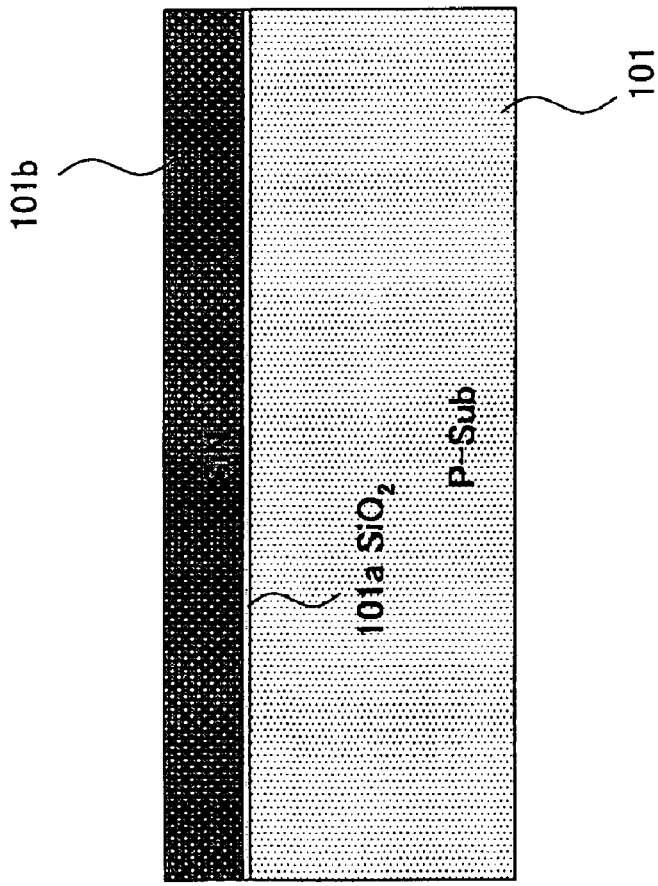
Figure 12A:
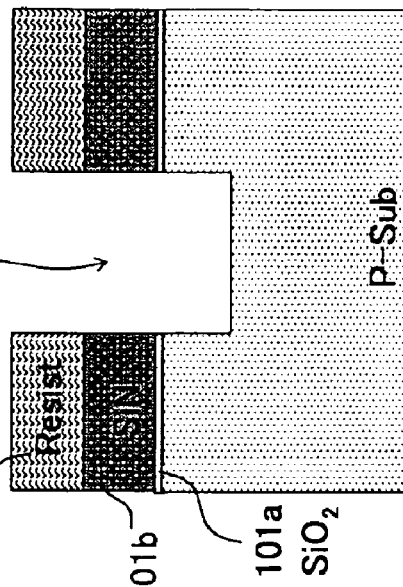
FIGS. 12A and 12B are diagrams showing the process for manufacturing the SONOS-type flash memory integrated circuit device according to the first embodiment of the present invention.
Figure 12B:
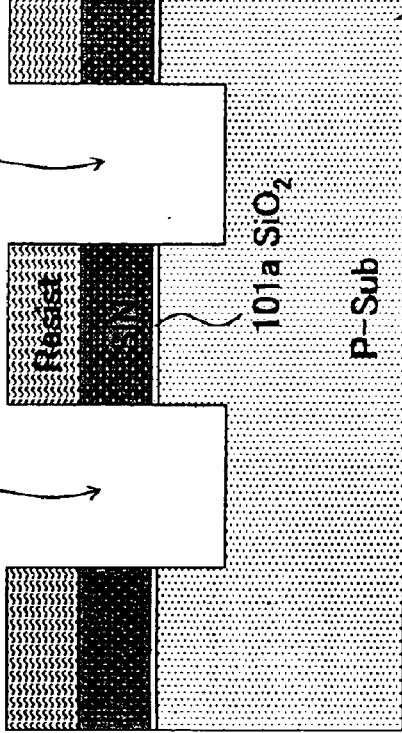

Referring to FIGS. 11A and 11B, in the memory cell region 100A, the peripheral circuit region 100B, and the pumping circuit region 100C, a thermal oxide film 101$a$ and a SiN film 101$b$ are formed on the surface of the Si substrate 101 so as to have film thicknesses of 10 through 20 nm and 100 through 150 nm, respectively. Further, in the process of FIGS. 12A and 12B, dry etching is performed on the SiN film 101$b$, the thermal oxide film 101$a$ thereunder, and the Si substrate 101 with a resist pattern R1 formed on the SiN film 101$b$ being employed as a mask. As a result, the grooves 101$G_1$ through 101$G_3$ of 50 through 100 nm in depth are formed in the Si substrate 101 so as to correspond to the openings in the resist pattern R1.

Figures 13A, 13B:
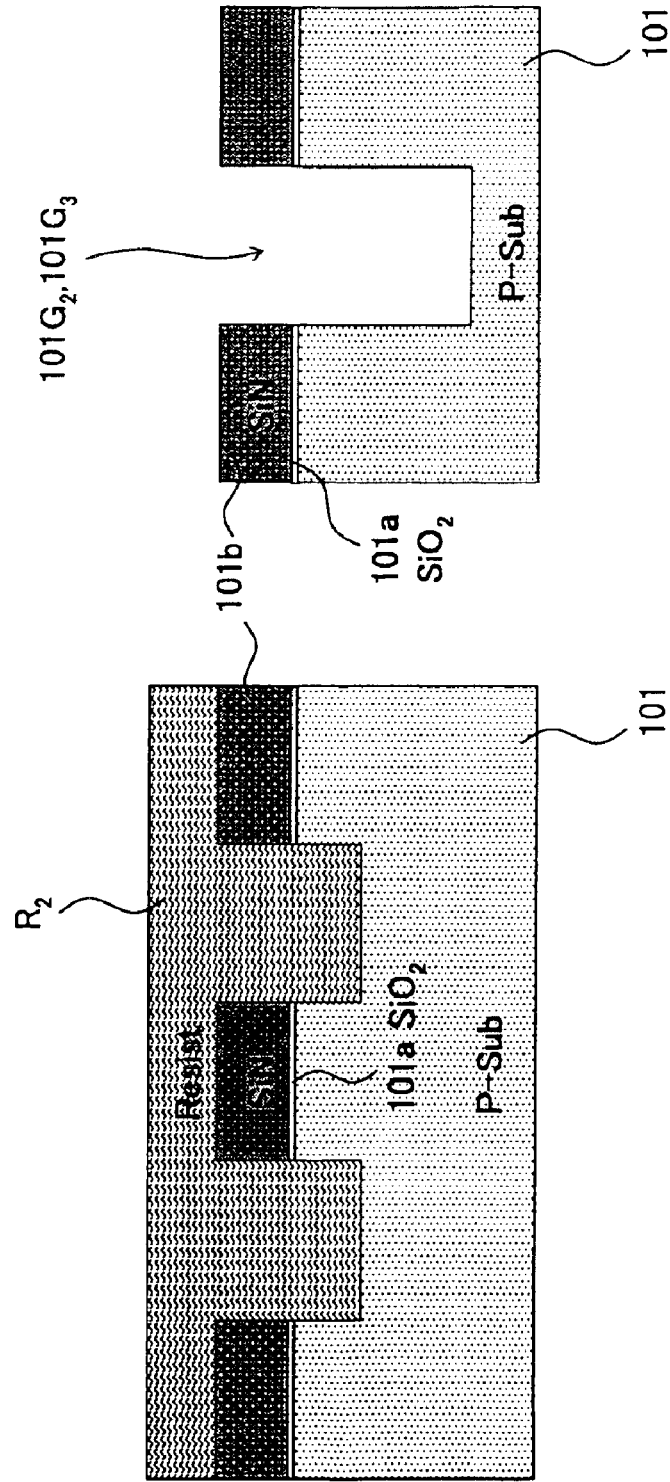
FIGS. 13A and 13B are diagrams showing the process for manufacturing the SONOS-type flash memory integrated circuit device according to the first embodiment of the present invention.

Next, in the process of FIGS. 13A and 13B, the resist pattern R1 is removed. A resist pattern R2 is formed on the Si substrate 101 so as to cover the memory cell region 100A and expose the peripheral circuit region 100B and the pumping circuit region 100C. Dry etching is performed on the Si substrate 101, employing as a mask the resist pattern R2 in the memory cell region 100A and the SiN film 101$b$ in the peripheral circuit region 100B and the pumping circuit region 100C. Thereby, the grooves 101$G_2$ and 101$G_3$ are formed so as to be 200 through 400 nm in depth when measured from the surface of the Si substrate 101.

In the process of FIGS. 13A and 13B, the grooves 101$G_2$ and 101$G_3$ are thus made deeper than the grooves 101$G_1$, using the resist pattern R2 different from the resist pattern R1. However, the structure of FIGS. 13A and 13B where the grooves 101$G_2$ and 101$G_3$ are formed to be deeper than the grooves 101$G_1$ can be formed by a single process using the single resist pattern R1 and a microcoating technology in the process of FIGS. 12A and 12B.

Next, in the process of FIGS. 14A and 14B, the resist pattern R2 is removed. Further, the thermal oxide film 101$t$ is formed on the surfaces of the grooves 101$G_1$ through 101$G_3$ so as to be 10 through 20 nm in thickness by a thermal oxidation process at temperatures of 800 through 900° C. Further, by CVD using TEOS as material, for instance, a CVD-$SiO_2$ film (not shown in the drawings) as thick as 400 through 700 nm is deposited on the SiN film 101$b$ so as to fill the grooves 101$G_1$ through 101$G_3$. Furthermore, by CMP using the SiN film 101$b$ as a stopper, the CVD-$SiO_2$ film deposited on the SiN film 101$b$ is removed, so that $SiO_2$ patterns 101$s$ are formed on the thermal oxide film 101$t$ in the grooves 101$G_1$ and the $SiO_2$ patterns 101S are formed on the thermal oxide film 101$t$ in the grooves 101G$_2$ and 101G$_3$. The SiO$_2$ pattern 101S thus formed in the groove 101G$_2$ forms an STI structure. In the process of FIGS. 14A and 14B, the impurity element of a conductivity type opposite to the channel conductivity type of the MOS transistors formed in the peripheral circuit region 100B may be introduced into the bottom part of the groove 101G$_2$ by ion implantation as a channel stopper before the groove 101G$_2$ is filled with the CVD-SiO$_2$ film in the peripheral circuit region 100B.

Figure 15B:
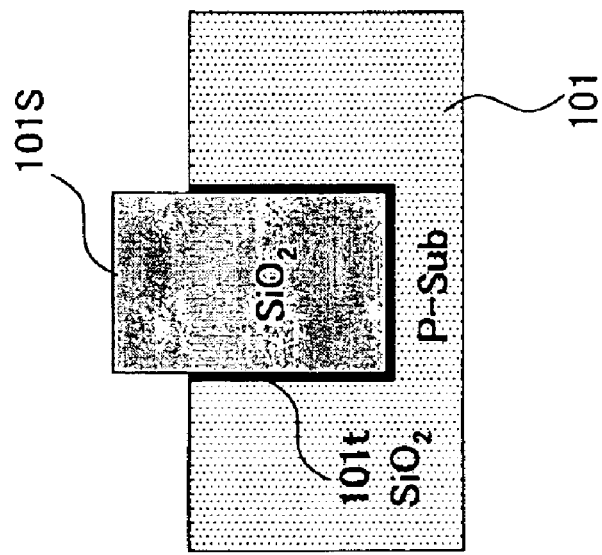
FIGS. 15A and 15B are diagrams showing the process for manufacturing the SONOS-type flash memory integrated circuit device according to the first embodiment of the present invention.
Figure 15A:
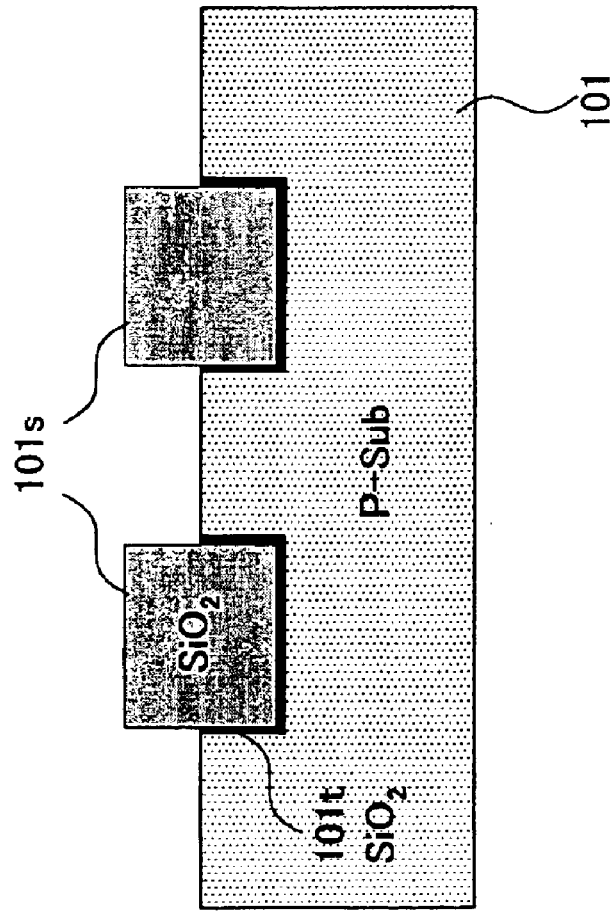

Next, in the process of FIGS. 15A and 15B, the SiN film 101$b$ and the thermal oxide film 101$a$ thereunder are removed by wet etching. Further, in the process of FIGS. 16A and 16B, a thermal oxide film 101$v$ is formed on the surface of the Si substrate 101 by a thermal oxidation process at temperatures of 800 through 900° C. in the regions 100A through 100C.

Figure 17A:
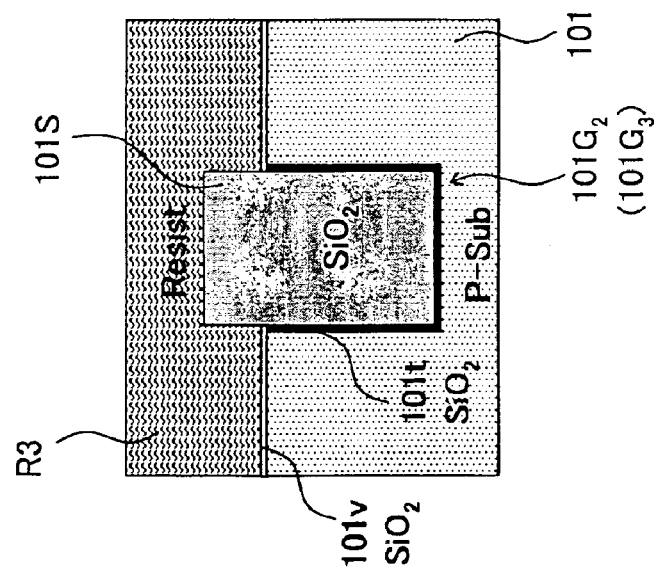
FIGS. 17A and 17B are diagrams showing the process for manufacturing the SONOS-type flash memory integrated circuit device according to the first embodiment of the present invention.
Figure 17B:
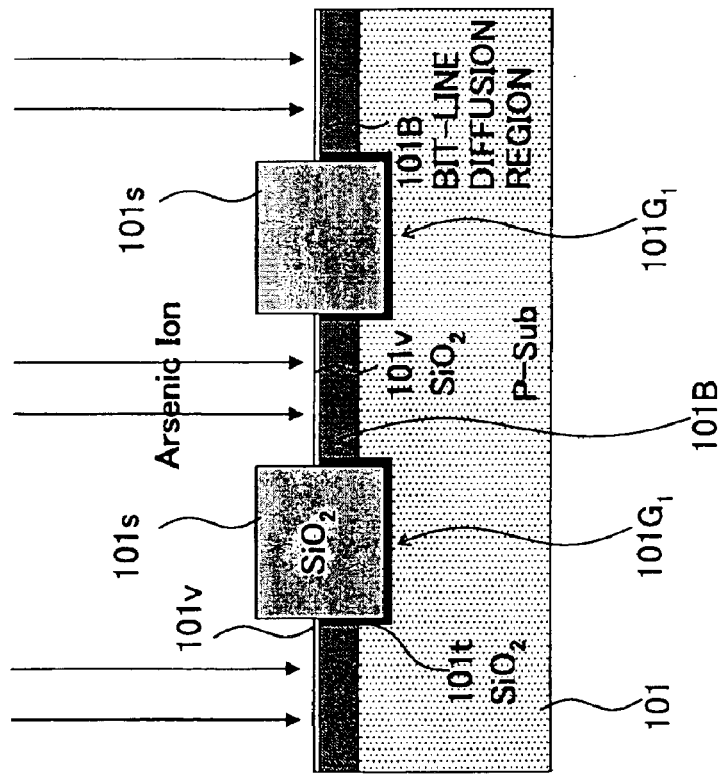

Next, in the process of FIGS. 17A and 17B, the peripheral circuit region 100B and the pumping circuit region 100C are covered with a resist pattern R3. Then, using the SiO$_2$ patterns 101$s$ as a mask, As ions are implanted through the thermal oxide film 101$v$ into the memory cell region 100A with doses of 1~3×10$^{15}$ cm$^{-2}$ under acceleration voltages of 60 through 80 keV, for instance. Thereby, the bit-line diffusion regions 101B are formed on the surface of the Si substrate 101, separated from each other by the grooves 101G$_1$.

Figure 18B:
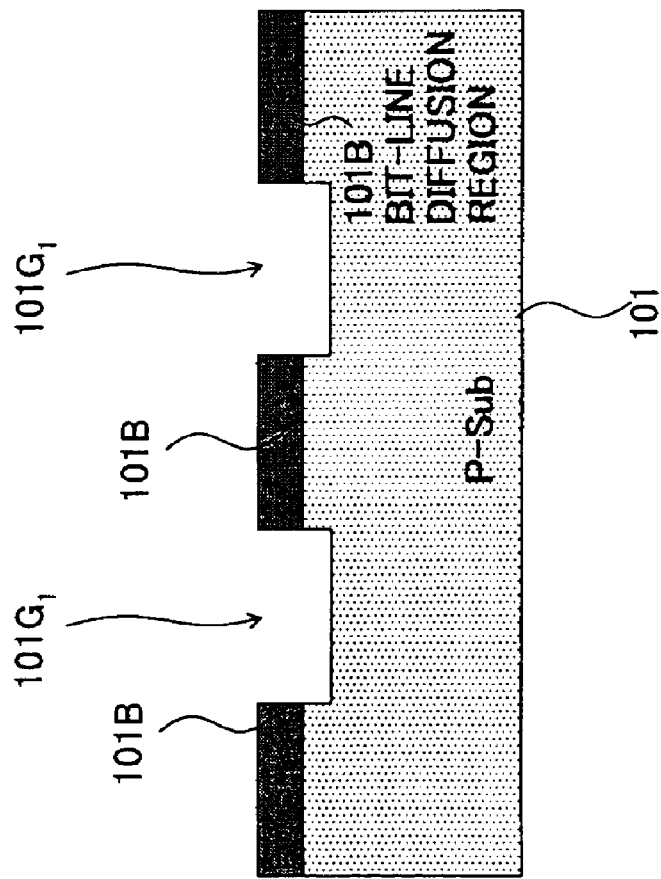
FIGS. 18A and 18B are diagrams showing the process for manufacturing the SONOS-type flash memory integrated circuit device according to the first embodiment of the present invention.
Figure 18A:
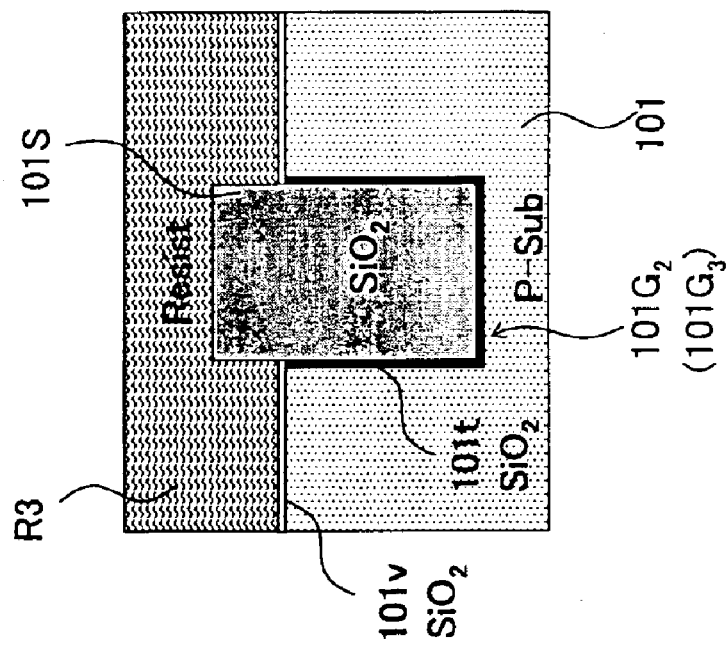

Next, in the process of FIGS. 18A and 18B, using the resist pattern R3 as a mask, the SiO$_2$ patterns 101$s$ and the thermal oxide film 101$t$ are removed by wet etching using HF in the memory cell region 100A, so that the surfaces of the grooves 101G$_1$ are exposed.

Further, in the process of FIGS. 19A and 19B, the resist pattern R3 is removed. Further, by performing thermal oxidation, depositing a SiN film by CVD, and performing thermal oxidation on the surface of the Si substrate 101, the ONO film 102 is formed in the memory cell region 100A so as to cover the surface of the Si substrate 101 and the surfaces of the grooves 101G$_1$. In the process of FIGS. 19A and 19B, the ONO film 102 is also formed over the peripheral circuit region 100B and the pumping circuit region 100C.

Figure 21:
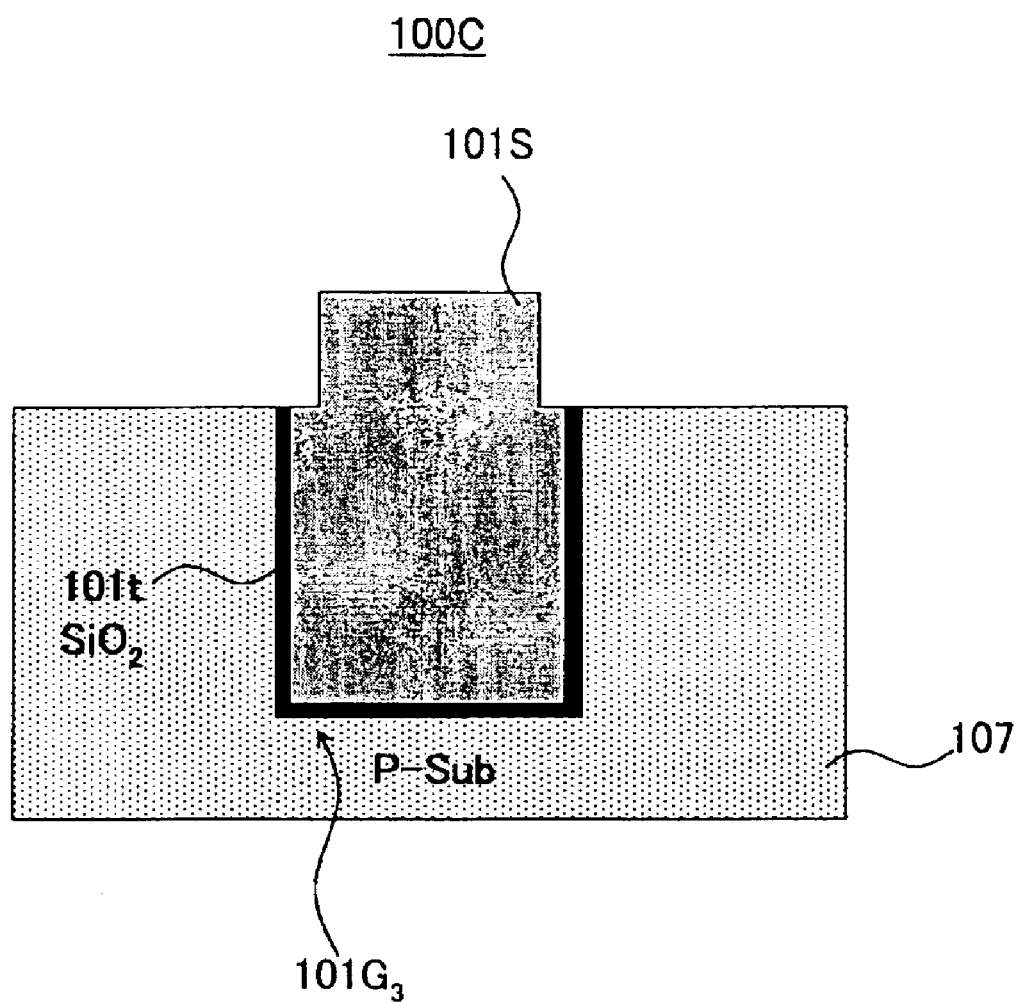
FIG. 21 is a diagram showing the process for manufacturing the SONOS-type flash memory integrated circuit device according to the first embodiment of the present invention.

Further, in the process of FIGS. 20A, 20B, and 21, the memory cell region 100A is covered with a resist pattern R4, and the ONO film 102 is removed from the peripheral circuit region 100B and the pumping circuit region 100C.

Figure 22B:
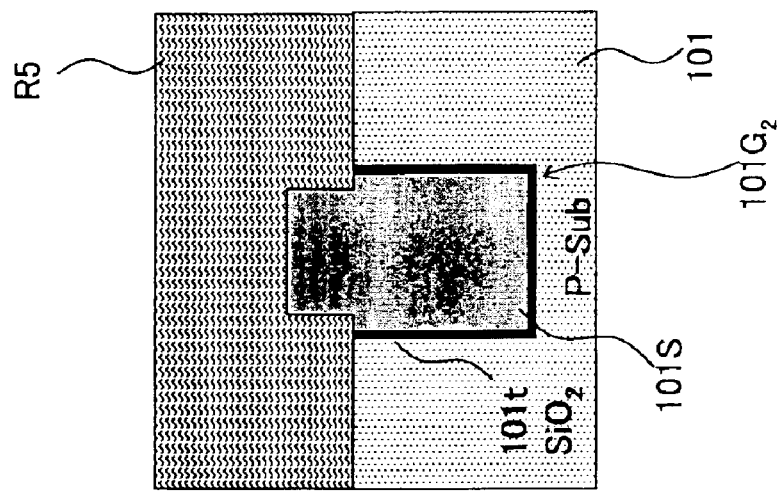
FIGS. 22A and 22B are diagrams showing the process for manufacturing the SONOS-type flash memory integrated circuit device according to the first embodiment of the present invention.
Figure 22A:
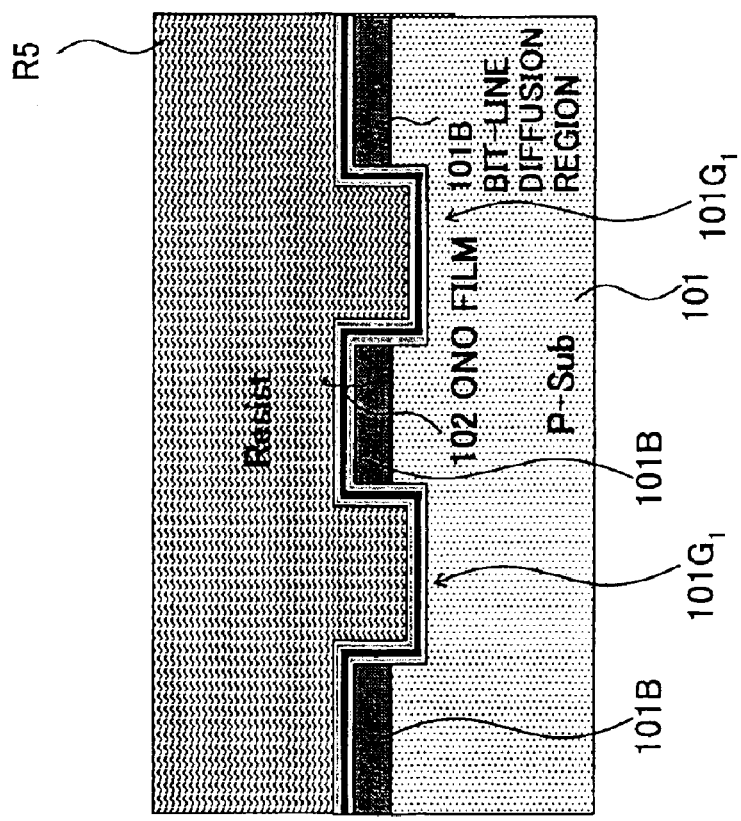
Figure 23:
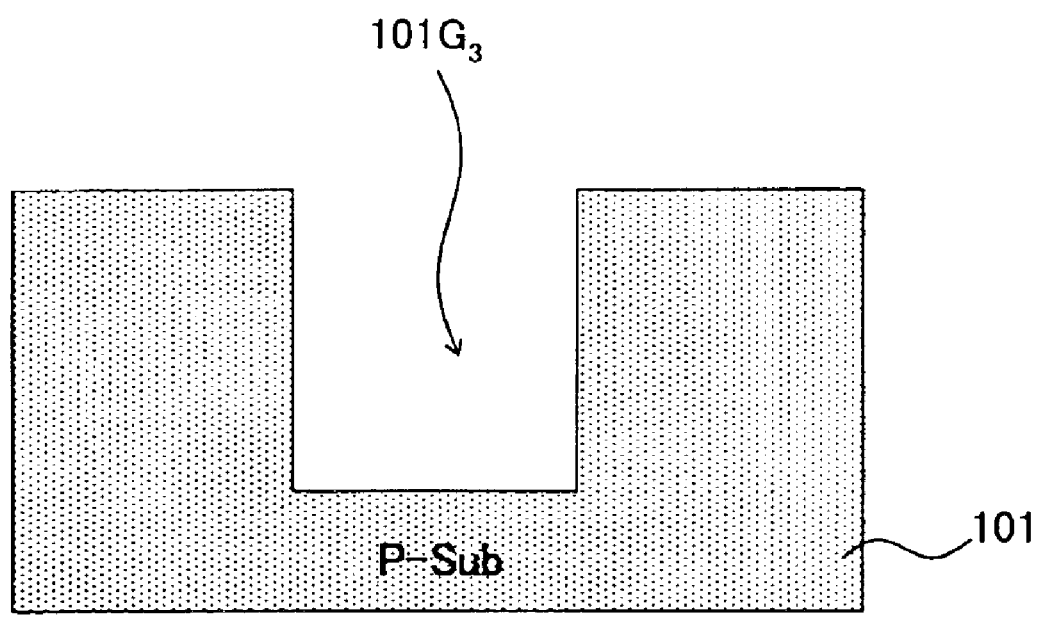
FIG. 23 is a diagram showing the process for manufacturing the SONOS-type flash memory integrated circuit device according to the first embodiment of the present invention.

Next, in the process of FIGS. 22A, 22B, and 23, a resist pattern R5 is formed on the Si substrate 101 so as to cover the memory cell region 100A and the peripheral circuit region 100B. The SiO$_2$ pattern 101S and the thermal oxide film 101$t$ are removed from the exposed pumping circuit region 100C by wet etching using HF. Thereby, the groove 101G$_3$ is exposed in the pumping circuit region 100C.

Figure 24B:
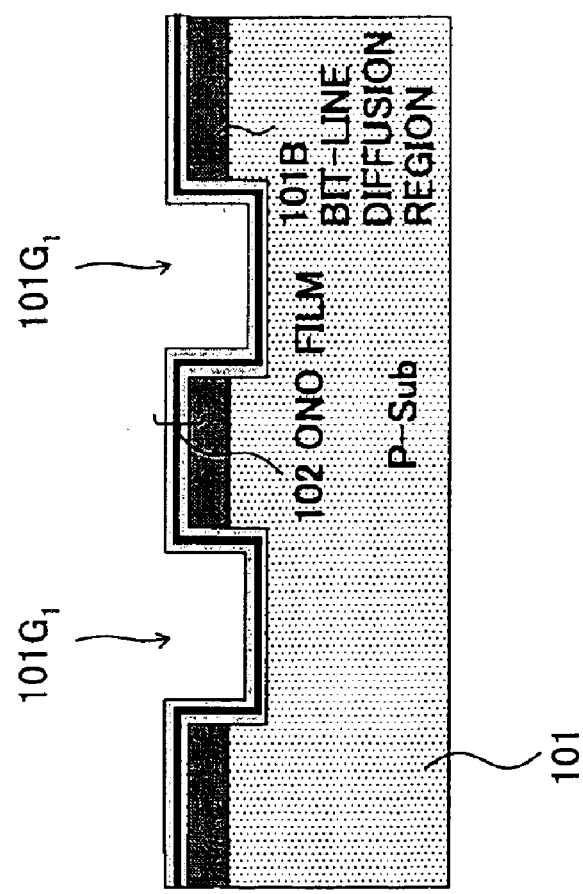
FIGS. 24A and 24B are diagrams showing the process for manufacturing the SONOS-type flash memory integrated circuit device according to the first embodiment of the present invention.
Figure 24A:
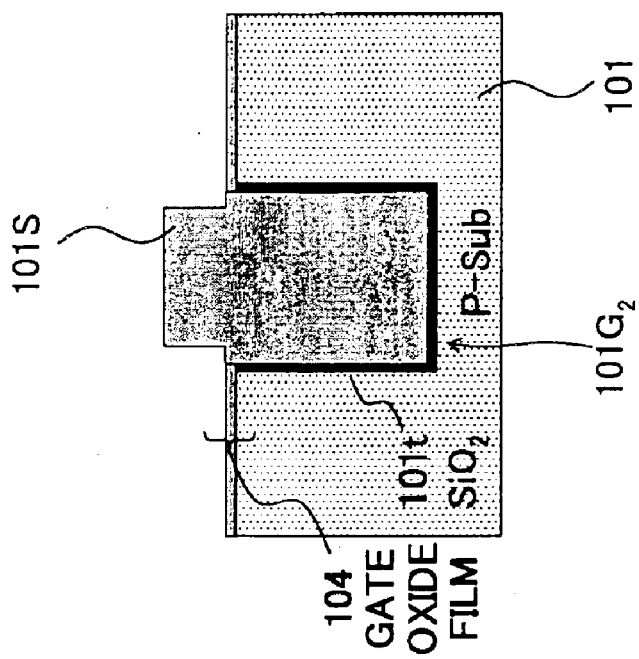
Figure 25:
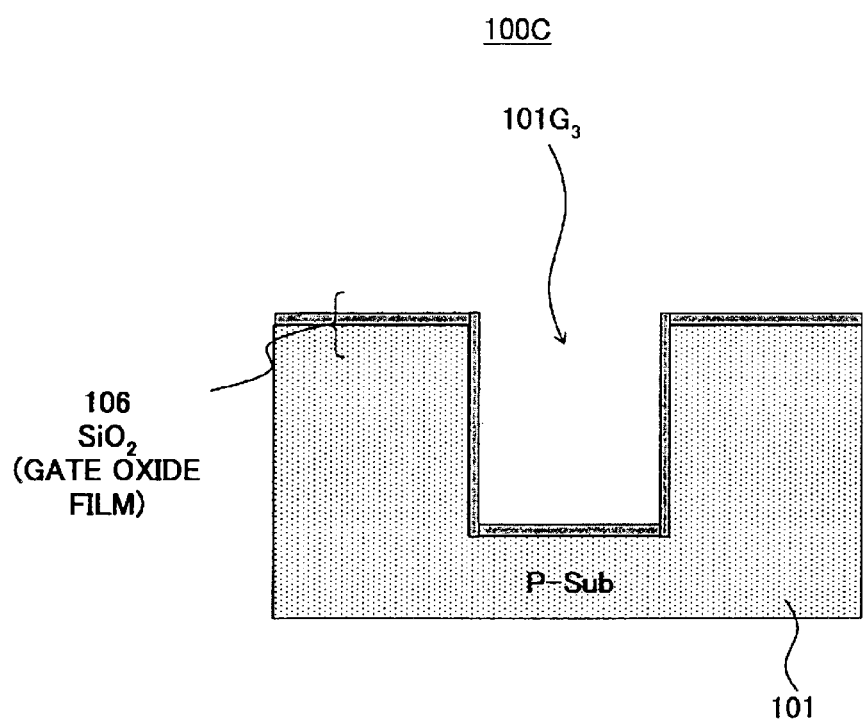
FIG. 25 is a diagram showing the process for manufacturing the SONOS-type flash memory integrated circuit device according to the first embodiment of the present invention.
Figure 26:
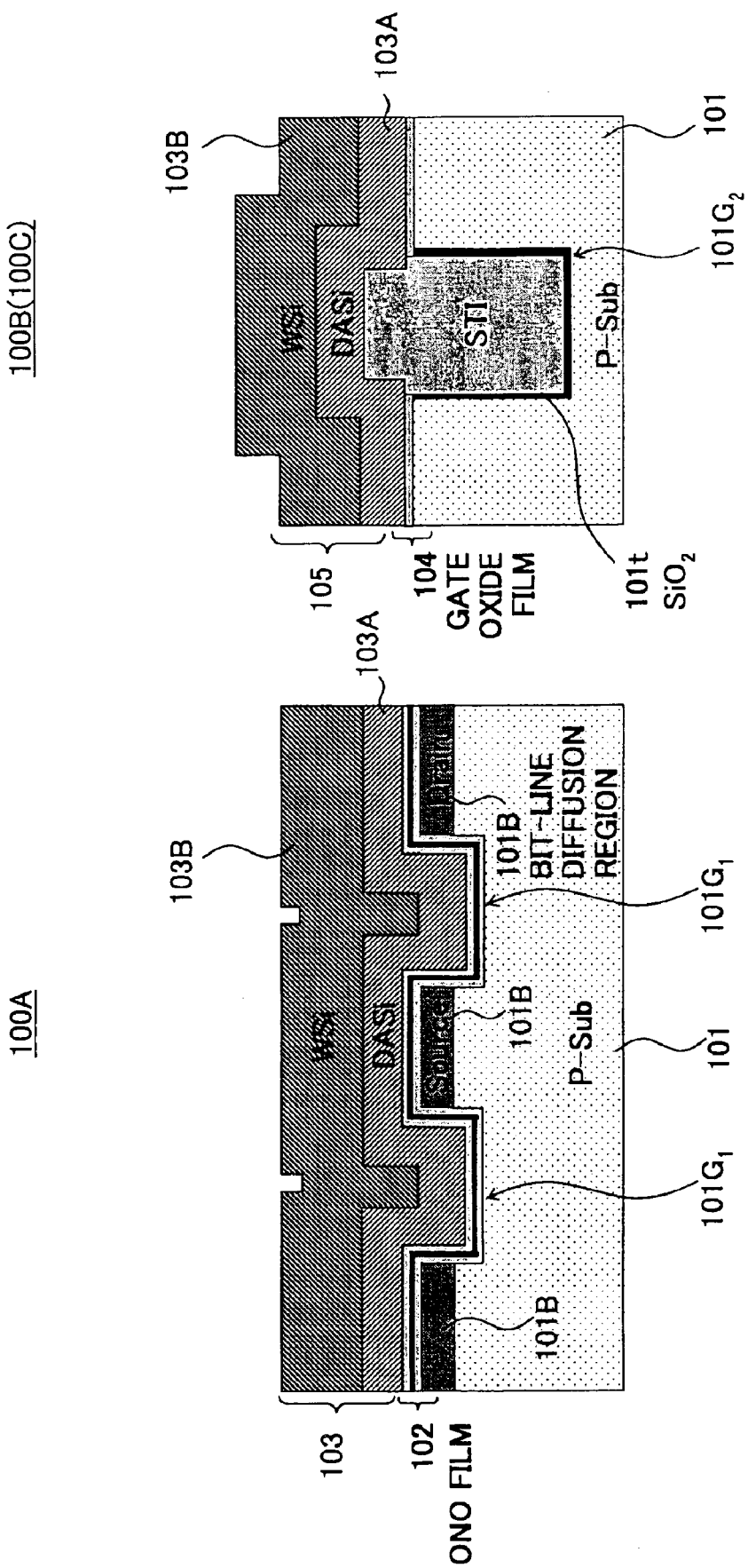
FIGS. 26A and 26B are diagrams showing the process for manufacturing the SONOS-type flash memory integrated circuit device according to the first embodiment of the present invention.

Next, in the process of FIGS. 24A, 24B, and 25, the resist pattern R5 is removed. Further, by performing a thermal oxidation process at temperatures of 800 through 1100° C., the gate oxide film 104 is formed on the surface of the substrate 101 so as to be 5 through 10 nm in thickness in the peripheral circuit region 100B. At the same time, the thermal oxide film 106 having the same thickness as the gate oxide film 104 is formed in the pumping circuit region 100C so as to cover the surface of the Si substrate 101 and the surface of the groove 101G$_3$. In the process of FIGS. 24A, 24B, and 25, a gate oxide film of 3 through 7 nm in film thickness corresponding to a low-voltage transistor may be formed as required by partially removing the gate oxide film 104 by a resist process and performing another thermal oxidation process at temperatures of 800 through 1100° C. In this case, the thickness of the remaining gate oxide film 104 is increased by the thickness of the gate oxide film for a low-voltage transistor, so that a thick gate oxide film corresponding to a high-voltage transistor is formed.

Figure 27:
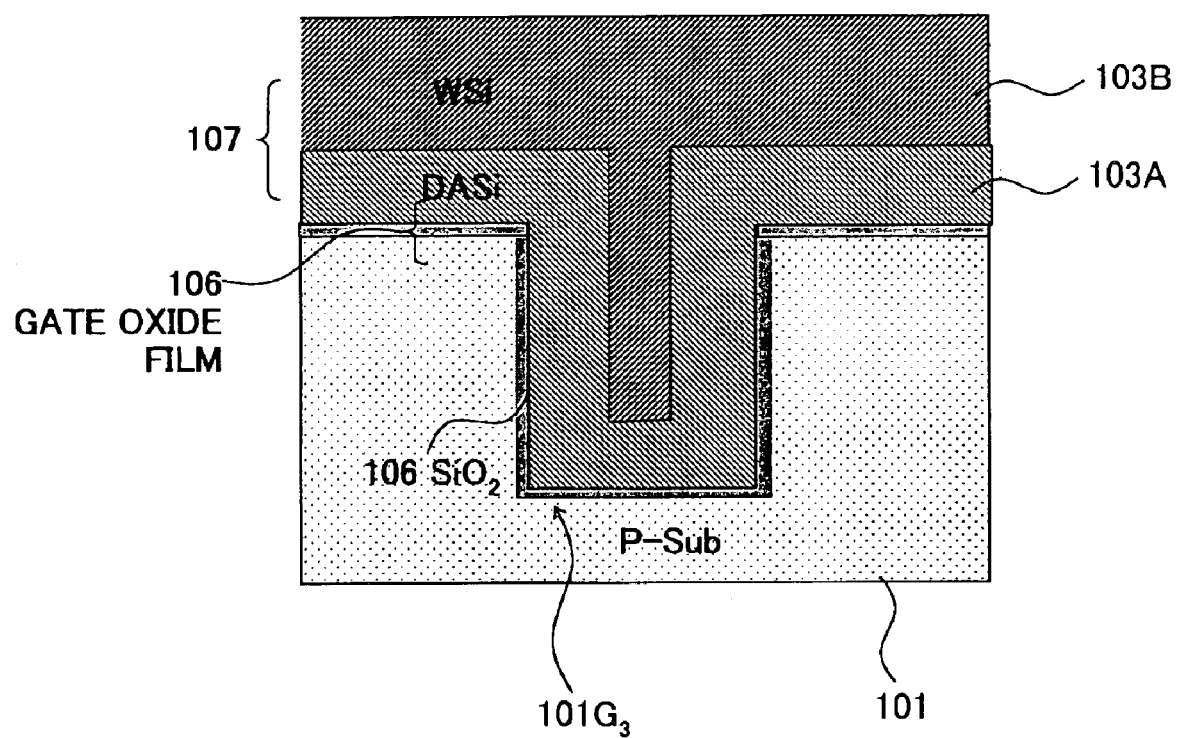
FIG. 27 is a diagram showing the process for manufacturing the SONOS-type flash memory integrated circuit device according to the first embodiment of the present invention.

Further, in the process of FIGS. 26A, 26B, and 27, the polysilicon film 103A and the WSi film 103B are formed on the structure of FIGS. 24A, 24B, and 25, so that the gate electrode films 103 and 105, and the capacitor electrode 107 are formed.

Figure 28:
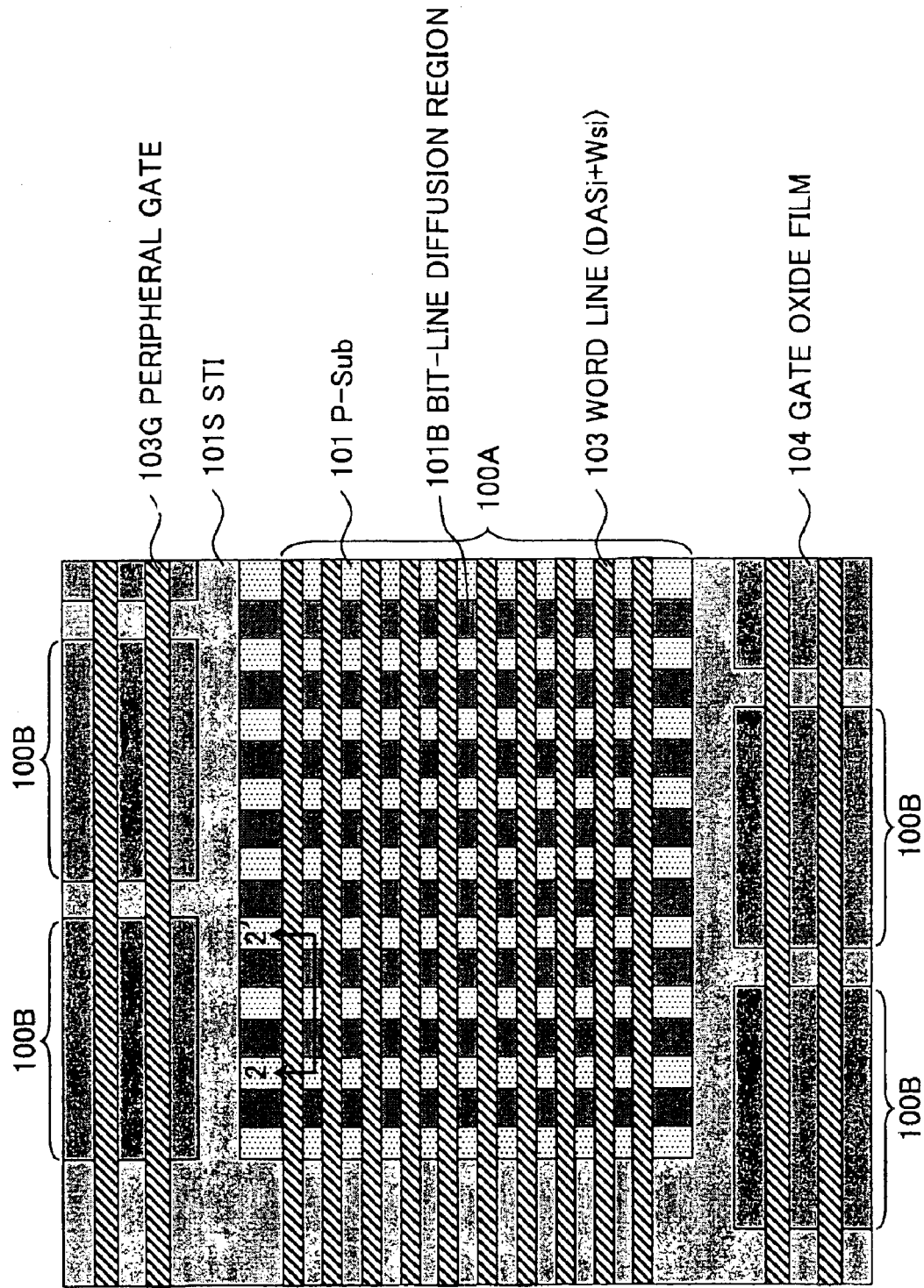
FIG. 28 is a diagram showing the process for manufacturing the SONOS-type flash memory integrated circuit device according to the first embodiment of the present invention.

Further, patterning is performed on the thus formed gate electrode films 103 and 105, and the capacitor electrode 107. Thereby, as shown in FIG. 28, a plurality of gate electrode patterns forming word lines (also referred to by reference numeral 103) are formed in the memory cell region 100A parallel to one another so as to extend in the direction perpendicular to the direction in which the bit-line diffusion regions 101B extend. FIG. 28 also shows that a plurality of gate electrodes 103G of the peripheral circuit transistors are formed in the peripheral circuit region 100B as a result of the patterning on the gate electrode film 105. The pumping circuit region 100C is not shown in FIG. 28.

Figure 29:
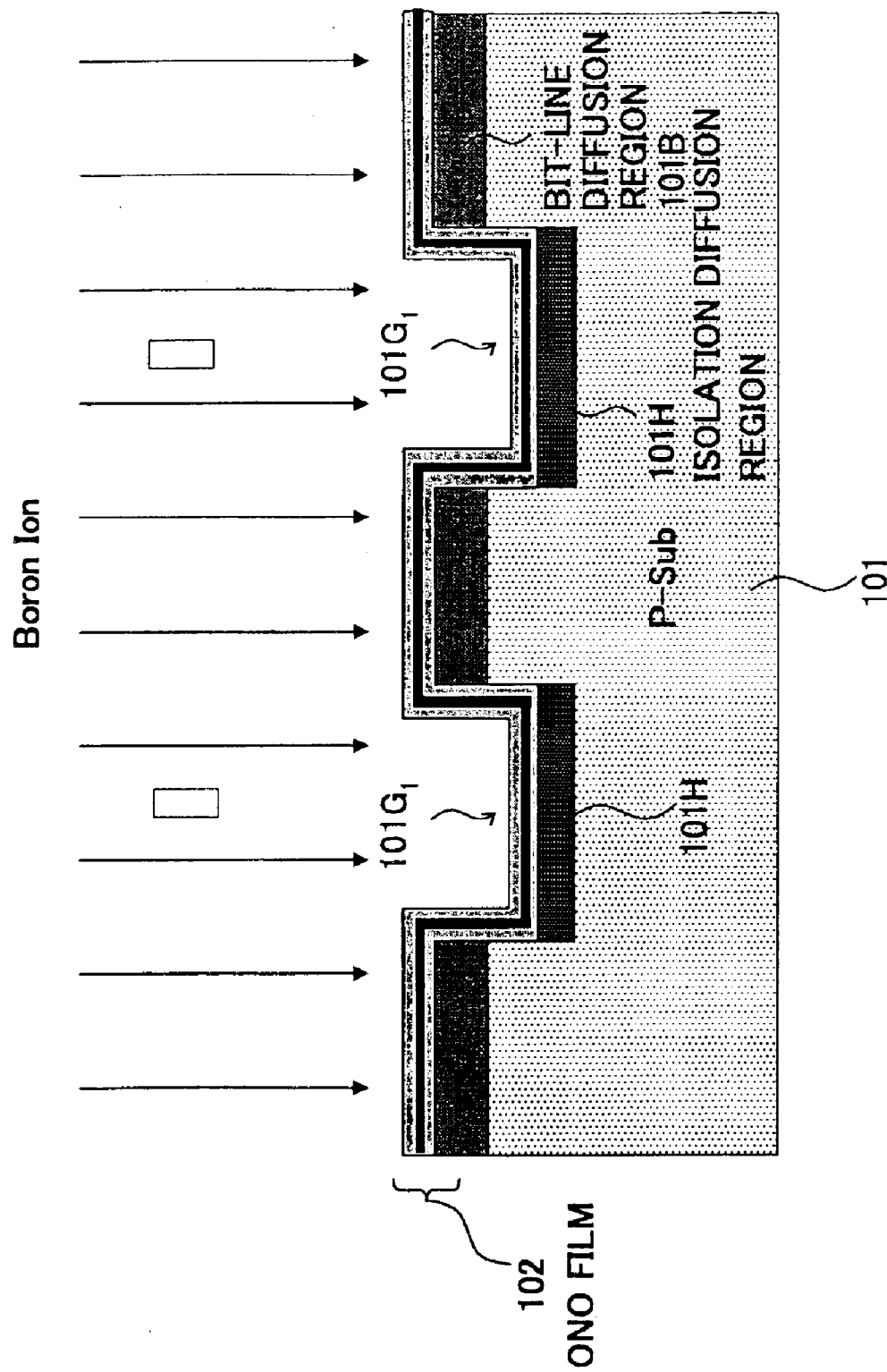
FIG. 29 is a diagram showing the process for manufacturing the SONOS-type flash memory integrated circuit device according to the first embodiment of the present invention.

Further, in the process of FIG. 29, by implanting B ions into the structure of FIG. 28, p-type channel-cut regions (an isolation diffusion layer) 101H are formed at the bottom of the grooves 101G$_1$. FIG. 29 is a sectional view of the structure of FIG. 28 taken along the line 2–2'.

Figure 30:
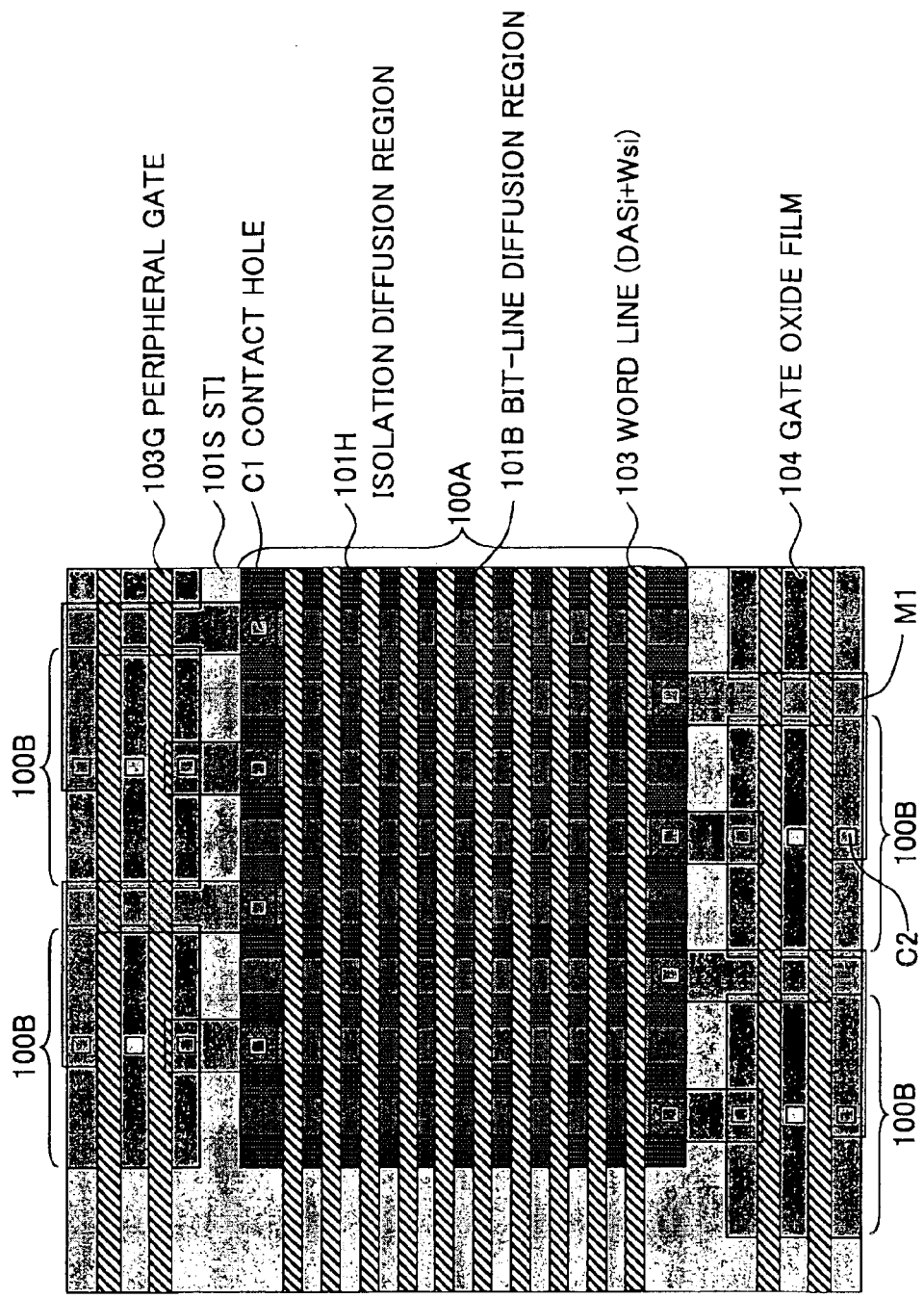
FIG. 30 is a diagram showing the process for manufacturing the SONOS-type flash memory integrated circuit device according to the first embodiment of the present invention.

FIG. 30 is a plan view of the thus formed flash memory integrated circuit device 100 corresponding to FIGS. 9A and 9B.

FIG. 30 shows that the isolation diffusion layer 101H is formed in the exposed part of the Si substrate 101 in the structure of FIG. 28.

According to the structure of FIG. 30, an interlayer insulating film (not shown in the drawing) is formed on the surface of the Si substrate 101 so as to cover the word-line patterns 103 and the gate electrode patterns 103G of the peripheral circuit transistors. Further, metal interconnect patterns M1 formed on the interlayer insulating film contact the bit-line diffusion regions 101B in the memory cell region 100A and the diffusion regions in the peripheral circuit region 100B via contact holes C1 and C2 formed in the interlayer insulating film, respectively.

The grooves 101G$_1$, 101G$_2$, and 101G$_3$ are formed in the memory cell region 100A, the peripheral circuit region 100B, and the pumping circuit region 100C (not shown in the drawing), respectively, with the same mask. At this point, therefore, there is no need to use different masks for forming the fine contact holes C1 and C2, which can be formed with high accuracy by a single mask aligning process.

[Second Embodiment]

FIGS. 31A and 31B are sectional views of a flash memory integrated circuit device 200 including a SONOS-type flash memory according to a second embodiment of the present invention. FIG. 31A and FIG. 31B show the configuration of a memory cell region 200A and the configuration of a peripheral circuit region 200B, respectively, of the flash memory integrated circuit device 200.

Referring to FIG. 31A, a plurality of grooves 201G$_1$ are formed on a p-type Si substrate 201 parallel to each other in the memory cell region 200A. Meanwhile, an isolation groove 201G$_2$ deeper than the groove 201G$_1$ is formed in the peripheral circuit region 200B.

In the memory cell region 200A, p-type punch-through preventing diffusion regions 201A and n-type bit-line diffusion regions 201B are formed at the bottom of the grooves 201G$_1$. The p-type diffusion regions 201A are formed by the introduction of B having a large diffusion coefficient so as to cover the n-type bit-line diffusion regions 201B, which are formed by the introduction of As.

Further, in the memory cell region 200A, an ONO film 202 is formed successively along the surfaces of the grooves 201G$_1$ on the surface of the Si substrate 201 as the electric charge storing film of the SONOS-type flash memory. A gate electrode 203 of a polysilicon film 203A and a WSi film 203B is formed on the ONO film 202 so as to extend in a direction to cross the direction in which the grooves 201G$_1$ extend.

On the other hand, in the peripheral circuit region 200B, the surface of the groove 201G$_2$ is covered with a thermal oxide film 201t, and the groove 201G$_2$ is filled with a CVD-SiO$_2$ pattern 201S forming an STI structure.

In the peripheral circuit region 200B, a thermal oxide film 204 is formed on the surface of the Si substrate 201 as the gate insulating film of the MOS transistors formed in the peripheral circuit region 200B. Further, a gate electrode 205 of layers of the polysilicon film 203A and the WSi film 203B is formed on the gate oxide film 204.

Figures 32A, 32B:
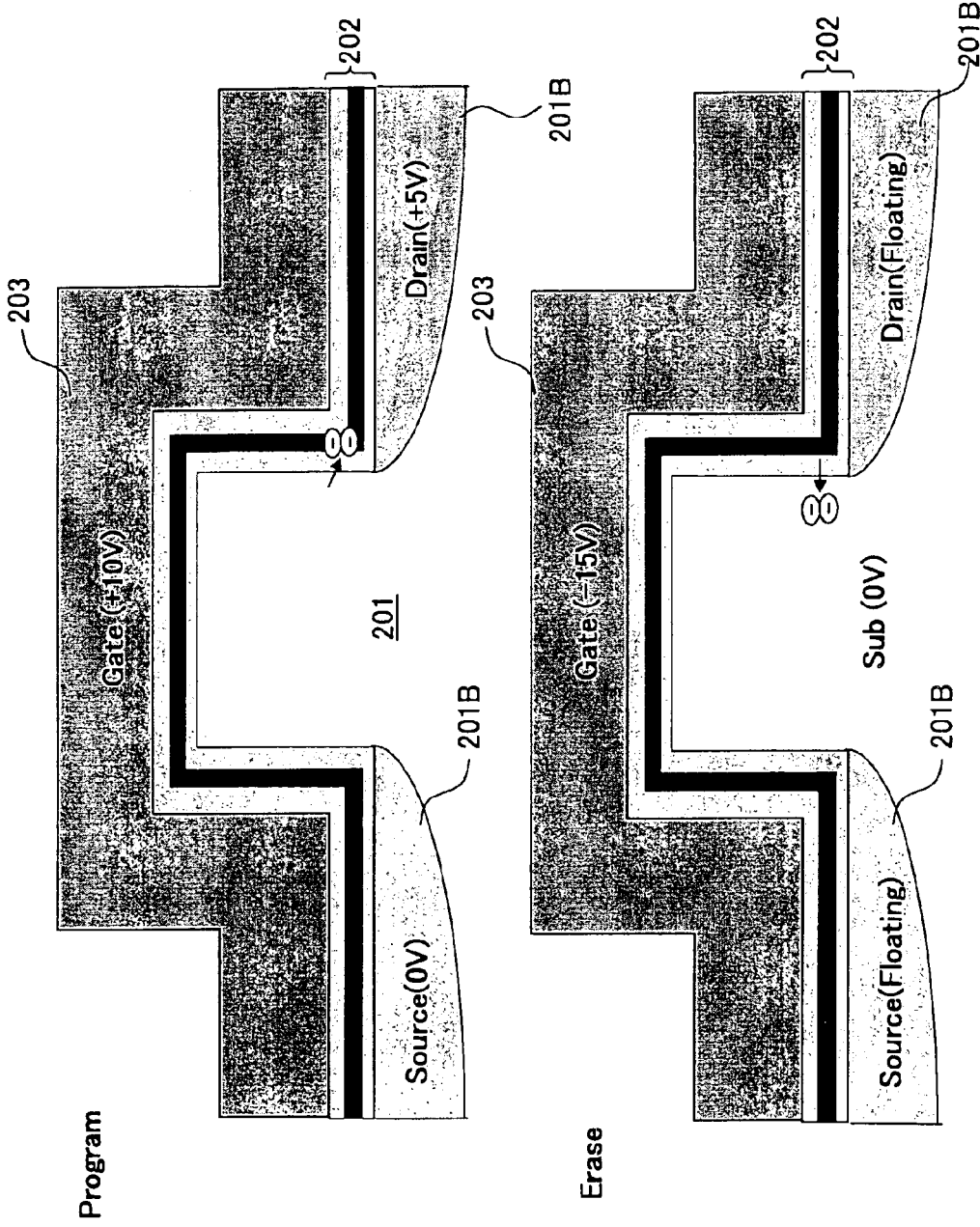
FIGS. 32A and 32B are diagrams for illustrating the principles of operation of the SONOS-type flash memory integrated circuit device of FIGS. 31A and 31B according to the second embodiment of the present invention.

FIGS. 32A and 32B are diagrams for illustrating the writing (programming) operation and the erasing operation of the SONOS-type flash memory formed in the memory cell region 200A.

Referring to FIG. 32A, at the time of writing, a high voltage of, for instance, +10 V is applied to the gate electrode 203, and in this state, one of the bit-line diffusion regions 201B which one serves as a source region is grounded while a driving voltage of +5 V is applied to the adjacent bit-line diffusion region 201B serving as a drain region.

As a result, electrons flow along the surfaces of the grooves 201G$_1$ and the si substrate 201 which surfaces are covered with the ONO film 202 from the source region 201B to the drain region 201B in the Si substrate 201. The hot electrons accelerated in the proximity of the drain end of the channel are injected into and captured in the ONO film 202. Further, by applying a driving voltage of +5 V to the source region 201B while grounding the drain region 201B, a negative electric charge may be injected as information into the ONO film 202 on its source-region side in FIG. 32A. Thus, two bits may also be stored per cell in the SONOS-type flash memory according to the second embodiment. Further, writing may be performed with avalanche hot electrons.

On the other hand, at the time of erasing shown in FIG. 32B, the bit-line diffusion regions 201B are set to be in a floating state, and a high voltage of −15 V is applied to the gate electrode 203 with the substrate 201 being grounded. Thereby, the negative electric charge captured in the ONO film 202 is ejected to the substrate 201 so that the stored information can be erased. By the process of FIG. 32B, the electric charge retained in the ONO film 202 in its source region 201B side in FIG. 32B is also ejected to the Si substrate 201. Further, erasing may be performed as required by the injection of hot holes by interband tunneling or the injection of avalanche hot holes.

Next, a description will be given, with reference to FIGS. 33A through 47B, of a process for manufacturing the flash memory integrated circuit device 200 according to the second embodiment of the present invention.

Figure 33B:
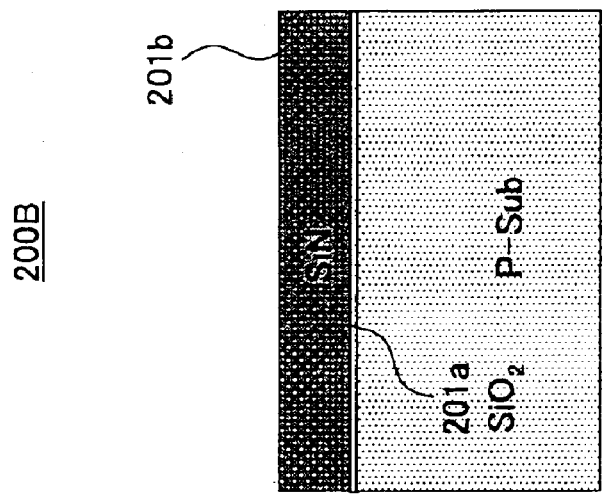
FIGS. 33A and 33B are diagrams showing a process for manufacturing the SONOS-type flash memory integrated circuit device according to the second embodiment of the present invention.
Figure 33A:
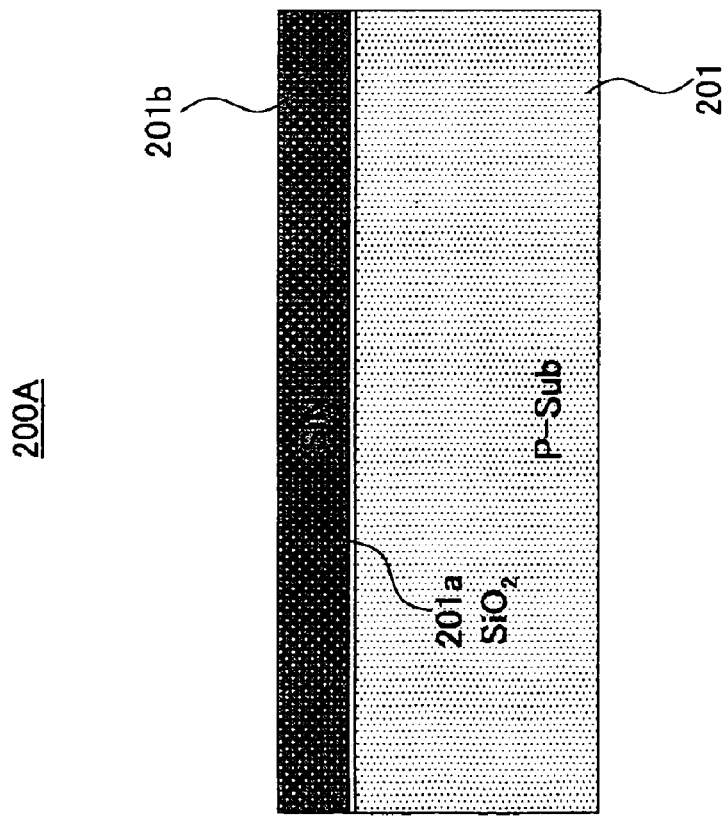

Referring to FIGS. 33A and 33B, a thermal oxide film 201a as thick as 10 through 20 nm is formed on the surface of the Si substrate 201 so as to successively cover the memory cell region 200A and the peripheral circuit region 200B. Further, a SiN film 201b is formed by CVD on the thermal oxide film 201a so as to be 100 through 150 nm in thickness.

Figure 34A:
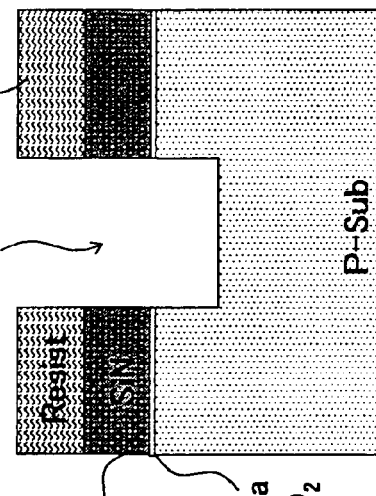
FIGS. 34A and 34B are diagrams showing the process for manufacturing the SONOS-type flash memory integrated circuit device according to the second embodiment of the present invention.
Figure 34B:
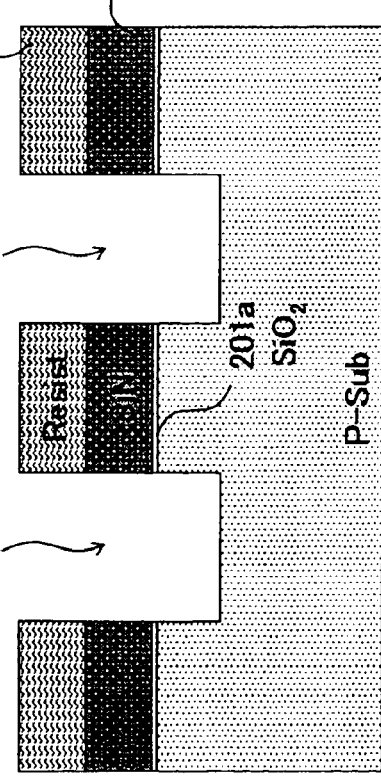

Next, in the process of FIGS. 34A and 34B, a resist pattern R11 is formed on the structure of FIGS. 33A and 33B. Using the resist pattern R11 as a mask, dry etching is performed on the SiN film 201b, the thermal oxide film 201a, and the surface of the Si substrate 201. Thereby, the grooves 201G$_1$ and 201G$_2$ are simultaneously formed in the memory cell region 200A and the peripheral circuit region 200B, respectively. Since the grooves 201G$_1$ and 201G$_2$ are formed with the same mask, there is ideal positioning agreement between the grooves 201G$_1$ and 201G$_2$.

Next, in the process of FIGS. 35A and 35B, the resist pattern R11 is removed, and a resist pattern R12 is formed so as to cover the memory cell region 200A and expose the peripheral circuit region 200B. Further, in the process of FIGS. 35A and 35B, using the SiN film 201b as a mask in the peripheral circuit region 200B, the dry etching of the Si substrate 201 is continued so that the depth of the groove 201G$_2$ reaches 200 through 400 nm when measured from the surface of the Si substrate 201.

Further, in the process of FIGS. 36A and 36B, the resist pattern R12 is removed, and thermal oxidation is performed on the surfaces of the grooves 201G$_1$ and 201G$_2$ at temperatures of 800 through 900° C. so that a thermal oxide film 201t as thick as 10 through 20 nm is formed. Further, in the process of FIGS. 36A and 36B, a CVD-SiO$_2$ film (not shown in the drawings) employing TEOS as material is formed to be 400 through 700 nm in thickness so as to fill the grooves 201G$_1$ and 201G$_2$ on which the thermal oxide film 201t is formed. Further, using the SiN film 201b as a stopper, the CVD-SiO$_2$ film on the SiN film 201b is removed by CMP so that SiO$_2$ patterns 201s and a SiO$_2$ pattern 201S are formed in the grooves 201G$_1$ and 201G$_2$, respectively. The SiO$_2$ pattern 201S forms an STI structure in the groove 201G$_2$.

Figure 37B:
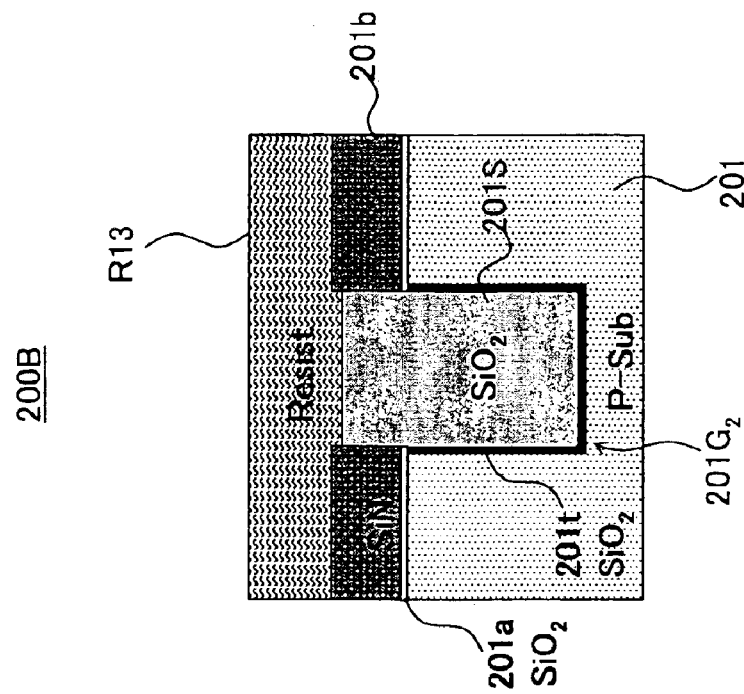
FIGS. 37A and 37B are diagrams showing the process for manufacturing the SONOS-type flash memory integrated circuit device according to the second embodiment of the present invention.
Figure 37A:
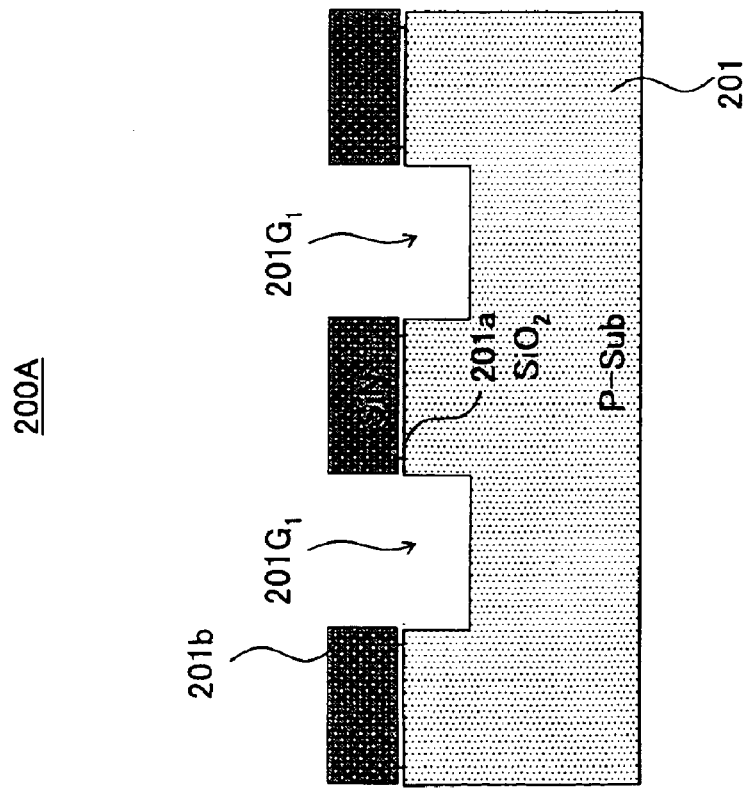

Next, in the process of FIGS. 37A and 37B, the peripheral circuit region 200B is protected by a resist pattern R13 so that the SiO$_2$ patterns 201s are removed from the memory cell region 200A. As a result, in the process of FIGS. 37A and 37B, the grooves 201G$_1$ are exposed in the memory cell region 200A.

Figure 38A:
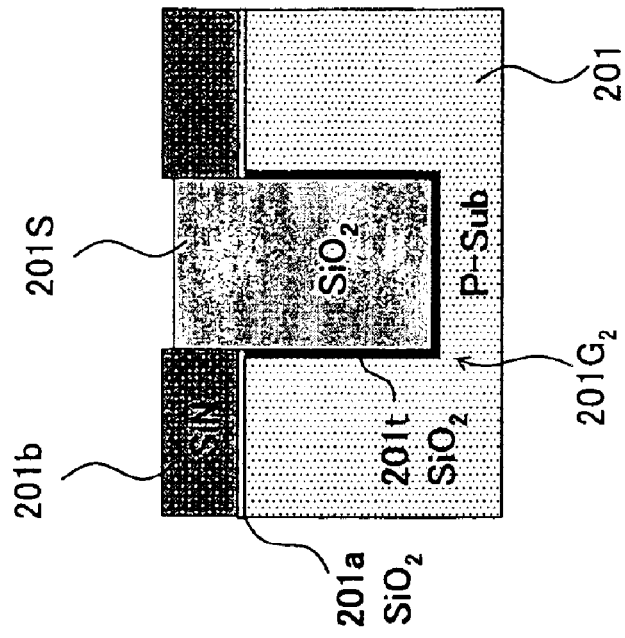
FIGS. 38A and 38B are diagrams showing the process for manufacturing the SONOS-type flash memory integrated circuit device according to the second embodiment of the present invention.
Figure 38B:
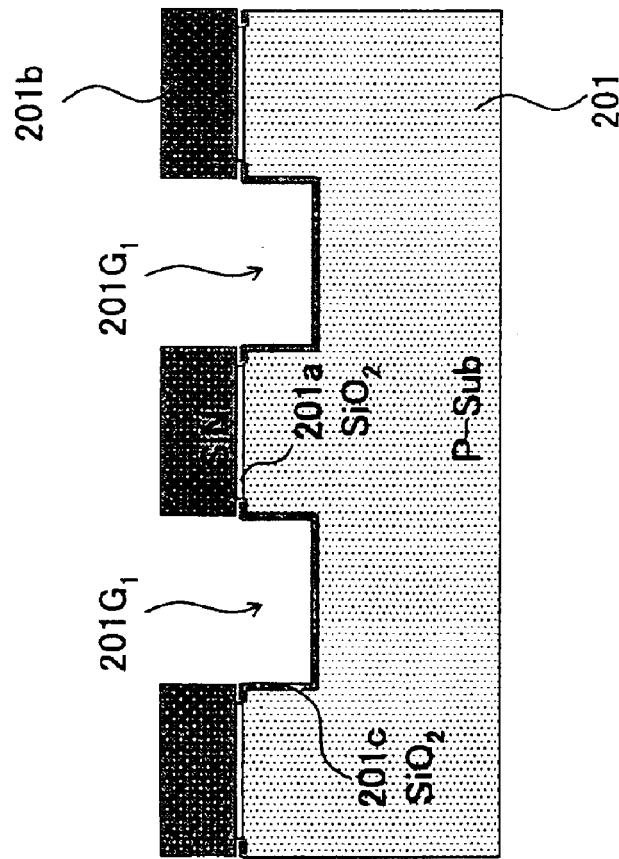

Next, in the process of FIGS. 38A and 38B, the resist pattern R13 is removed, and thermal oxidation is performed at temperatures of 800 through 900° C. so that a thermal oxide film 201c is formed on the surfaces of the grooves 201G$_1$.

Figure 39B:
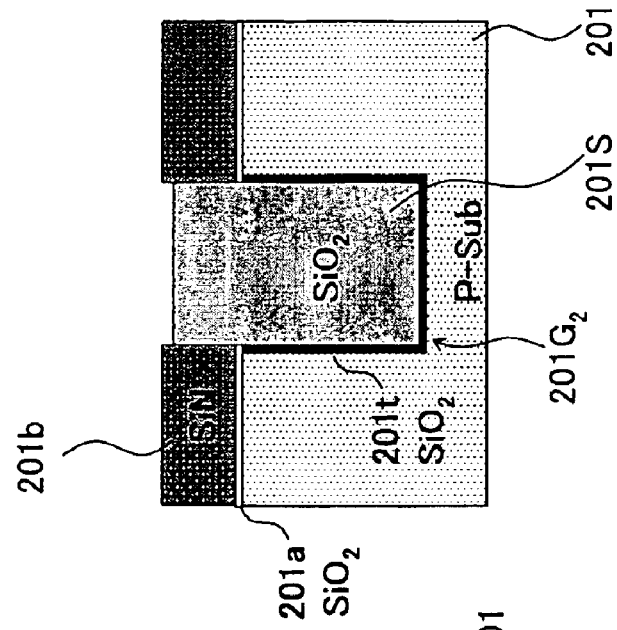
FIGS. 39A and 39B are diagrams showing the process for manufacturing the SONOS-type flash memory integrated circuit device according to the second embodiment of the present invention.
Figure 39A:
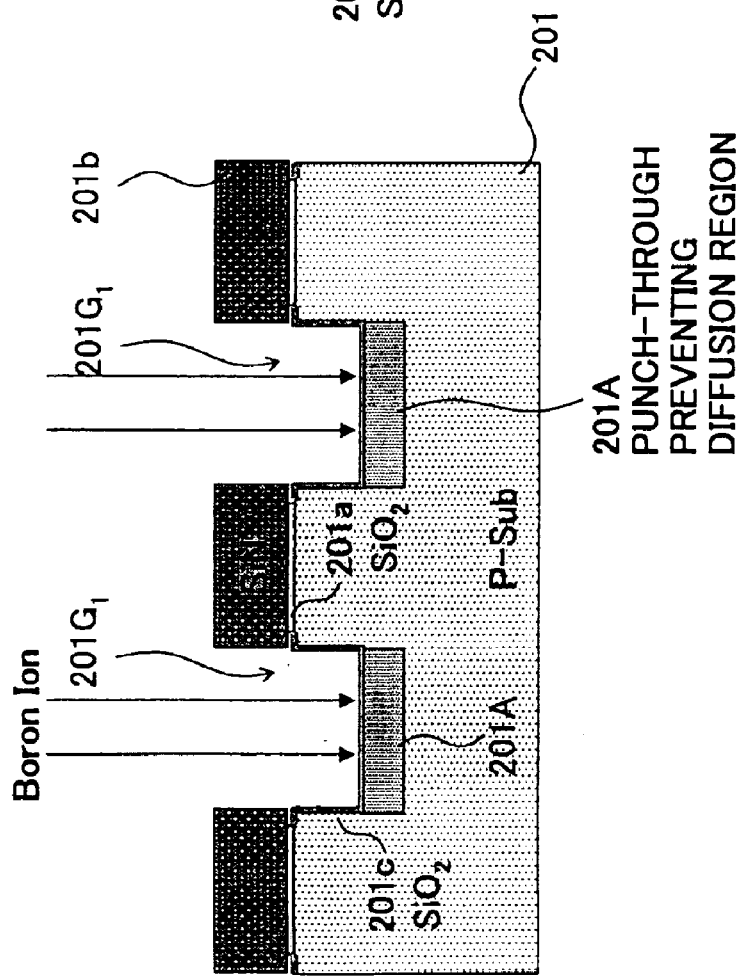

Next, in the process of FIGS. 39A and 39B, using the SiN film 201b and the STI pattern 201S as a self-alignment mask, B ion implantation, for instance, is performed with doses of 1~3×10$^{13}$ cm$^{-2}$ under acceleration voltages of 50 through 70 keV so that the p-type punch-through preventing diffusion regions 201A are formed at the bottom of the grooves 201G$_1$.

Figures 40A, 40B:
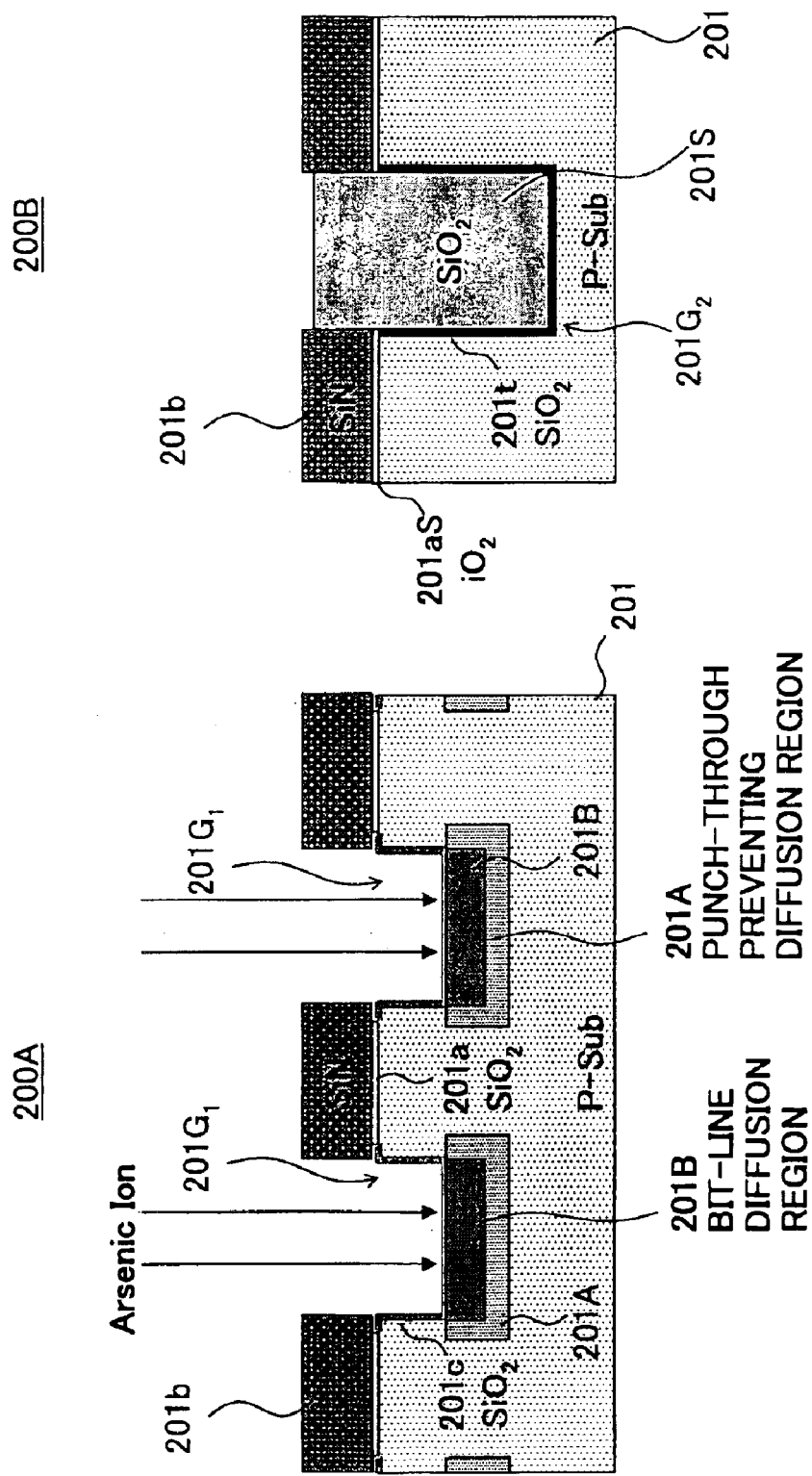
FIGS. 40A and 40B are diagrams showing the process for manufacturing the SONOS-type flash memory integrated circuit device according to the second embodiment of the present invention.

Successively thereafter, the process of FIGS. 40A and 40B is performed in this embodiment. As in the process of FIGS. 39A and 39B. As ion implantation is performed with doses of 1~3×10$^{15}$ cm$^{-2}$ under acceleration voltages of 60 through 80 keV so that n-type diffusion regions forming the bit-line diffusion regions 201B are formed at the bottom of the grooves 201G$_1$. At this point, B, which has a large diffusion coefficient, is diffused beyond the n-type diffusion regions 201B, so that the p-type punch-through preventing diffusion regions 201A covering the n-type bit-line diffusion regions 201B are formed.

In the process of FIGS. 39A and 39B and the process of FIGS. 40A and 40B, no ion is implanted into the peripheral circuit region 200B covered with the SiN pattern 201b and the STI pattern 201S.

Figure 41B:
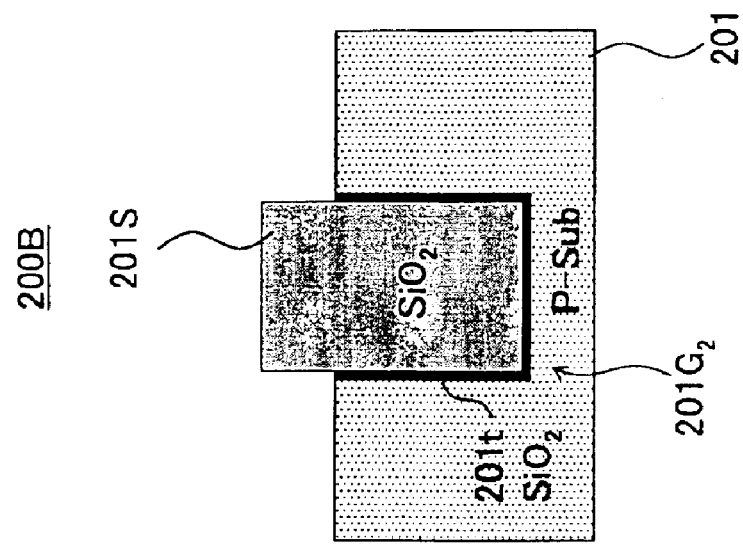
FIGS. 41A and 41B are diagrams showing the process for manufacturing the SONOS-type flash memory integrated circuit device according to the second embodiment of the present invention.
Figure 41A:
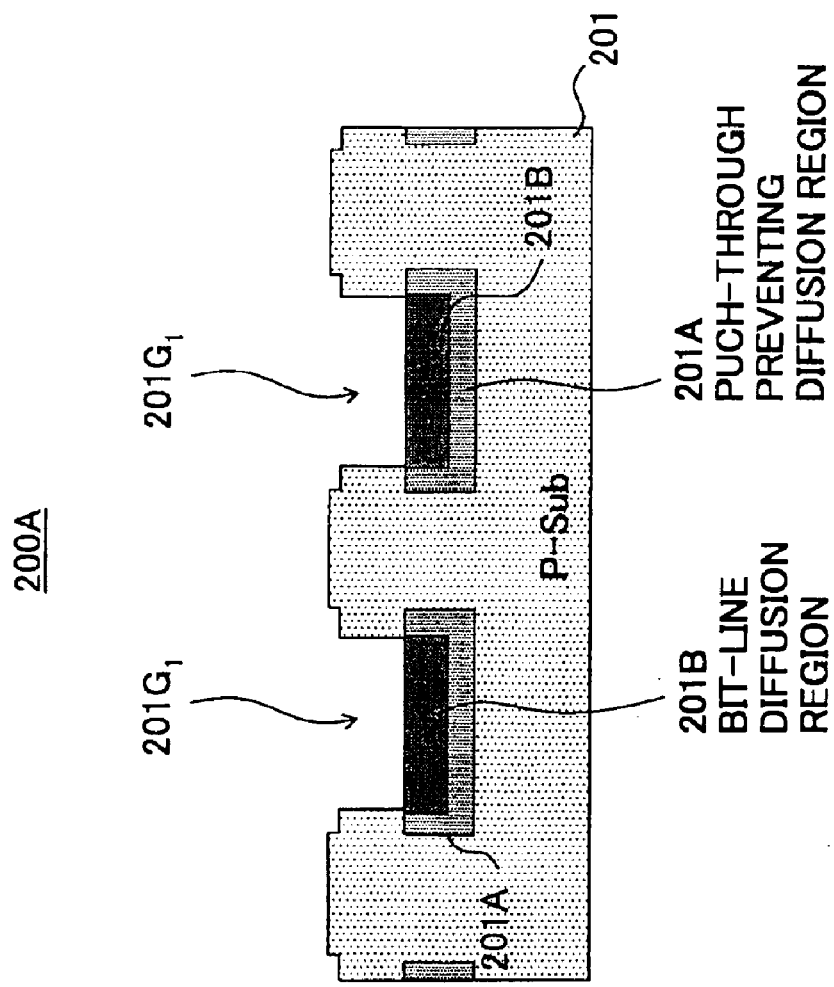

Next, in the process of FIGS. 41A and 41B, the SiN film 201b is removed. Further, the thermal oxide film 201a under the SiN film 201b and the thermal oxide film 201c formed on the surfaces of the grooves $201G_1$ are removed. In the process of FIGS. 42A and 42B, the ONO film 202 is formed on the Si substrate 201 so as to uniformly cover the grooves $201G_1$ in the memory cell region 200A.

Figure 43B:
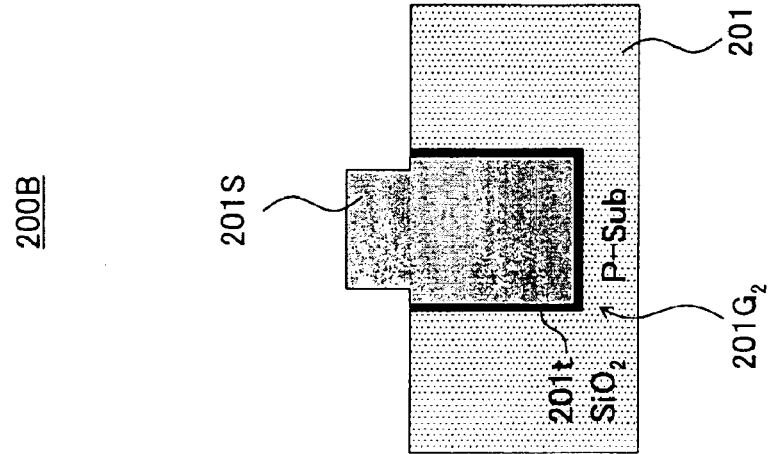
FIGS. 43A and 43B are diagrams showing the process for manufacturing the SONOS-type flash memory integrated circuit device according to the second embodiment of the present invention.
Figure 43A:
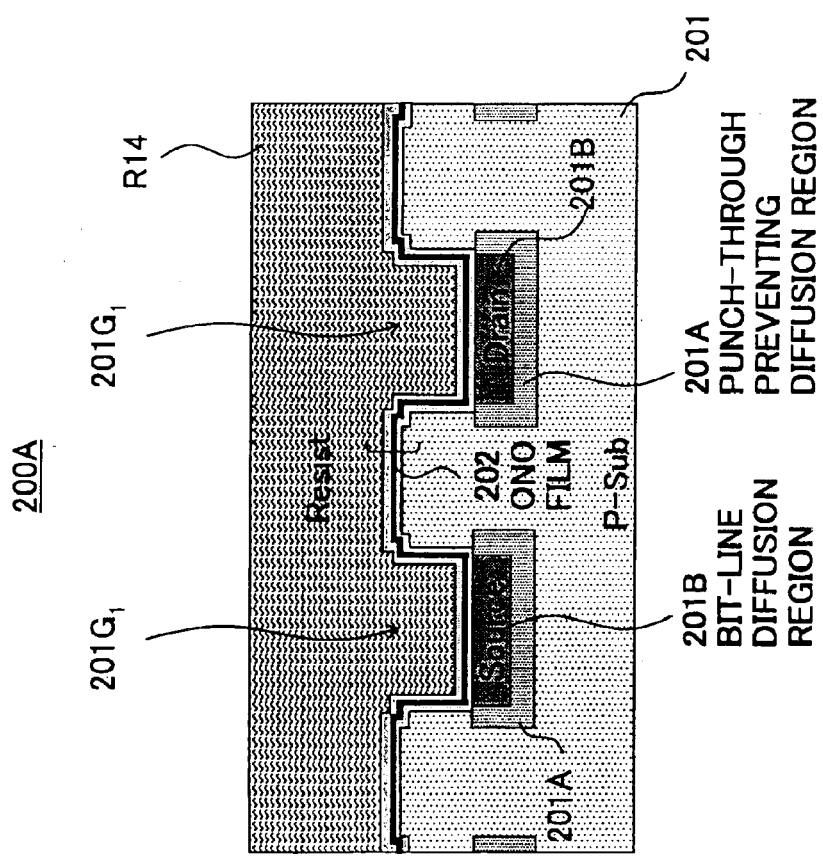

Next, in the process of FIGS. 43A and 43B, the ONO film 202 is removed from the peripheral circuit region 200B by wet etching with the memory cell region 200A being protected by a resist pattern R14.

Further, in the process of FIGS. 44A and 44B, the resist pattern R14 is removed. By subjecting the obtained substrate to thermal oxidation at temperatures of 800 through 1100° C., in the peripheral circuit region 200B, the thermal oxide film 204 is formed on the surface of the Si substrate 201 so as to be, for instance, 5 through 10 nm in thickness as the gate insulating film of the peripheral transistors formed in the peripheral circuit region 200B. As in the previous embodiment, a gate insulating film having a smaller film thickness for a low-voltage transistor and a gate insulating film having a larger film thickness for a high-voltage transistor may also be formed in the peripheral circuit region 200B in this embodiment.

Further, in the process of FIGS. 45A and 45B, the polysilicon film 203A and the WSi film 203B are successively formed on the structure of FIGS. 44A and 44B, and patterning is performed on the obtained conductive film. Thereby, in the memory cell region 200A, the gate electrode 203 of the SONOS-type flash memory is formed so as to cross the bit-line diffusion regions 201B, that is, the grooves $201G_1$. Further, in the peripheral circuit region 200B, the gate electrode 205 of the peripheral transistors is formed.

Figure 46A:
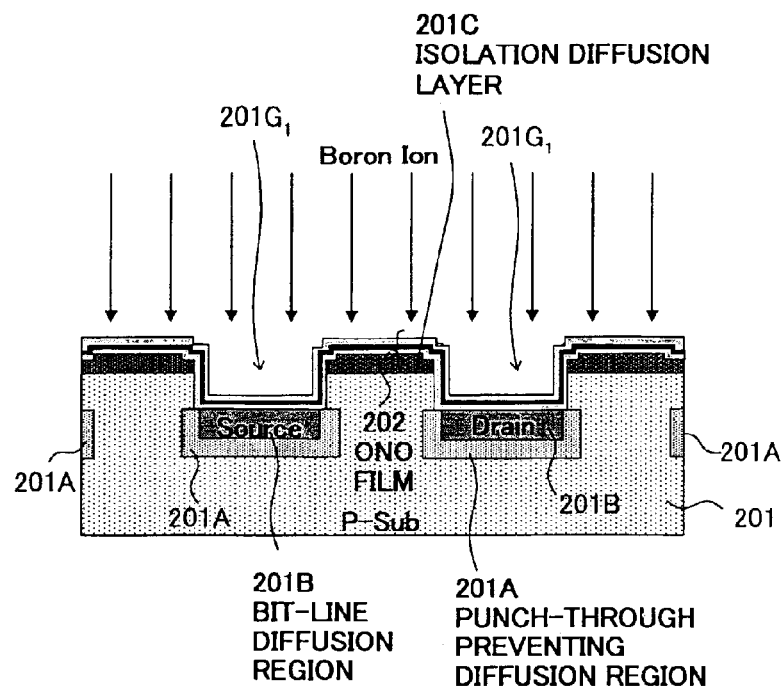
FIGS. 46A and 46B are diagrams showing the process for manufacturing the SONOS-type flash memory integrated circuit device according to the second embodiment of the present invention.

Next, in the process of FIG. 46A, with the peripheral circuit region 200B being protected by a resist pattern (not shown in the drawing), B ion implantation is performed with doses of $5 \times 10^{12}$ through $1 \times 10^{13}$ cm$^{-2}$ under acceleration voltages of 20 through 40 keV in the memory cell region 200A. Thereby, a p-type isolation diffusion layer 201C is formed in a part between the adjacent gate electrodes 203 in the region between the adjacent grooves $201G_1$ on the surface of the Si substrate 201.

Figure 46B:
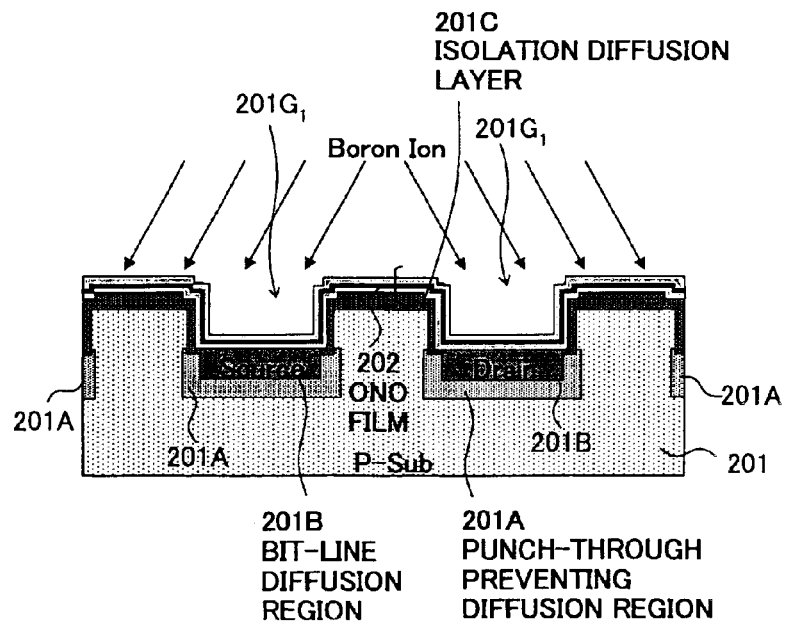

Alternatively, as shown in FIG. 46B, the ion implantation process for forming the isolation diffusion region 201C may be performed with tilt angles of 7° through 15° so that the isolation diffusion region 201C is formed successively over the sidewall faces of the grooves $201G_1$ and under the ONO film 202.

In this embodiment, the grooves $201G_1$ and $201G_2$ are also formed simultaneously with the same mask in the memory cell region 200A and the peripheral circuit region 200B, respectively. Therefore, there is ideal positioning agreement between the SONOS-type flash memory cells formed in self-alignment with the grooves $201G_1$ in the memory cell region 200A and the peripheral circuit transistors formed in self-alignment with the isolation groove $201G_2$ in the peripheral circuit region. In the case of forming interconnect patterns on this memory integrated circuit and connecting the interconnect patterns with the flash memory cells or the peripheral circuit transistors by fine contact holes, the contact holes can be positioned by direct positioning using a single mask.

[Third Embodiment]

FIGS. 47A and 47B are sectional views of a flash memory integrated circuit device 300 including a SONOS-type flash memory according to a third embodiment of the present invention. FIGS. 47A and 47B show a memory cell region 300A and a peripheral circuit region 300B, respectively, of the flash memory integrated circuit device 300. In the drawings, the same elements as those previously described are referred to by the same numerals, and a description thereof will be omitted.

Referring to FIG. 47A, the grooves $201G_1$ are formed on the p-type Si substrate 201 parallel to each other in the memory cell region 300. Meanwhile, the isolation groove $201G_2$ deeper than the grooves $201G_1$ is formed in the peripheral circuit region 300B.

In the memory cell region 300A, the p-type punch-through preventing diffusion regions 201A and the n-type bit-line diffusion regions 201B are formed at the bottom of the grooves $201G_1$. The p-type diffusion regions 201A are formed by the introduction of B having a large diffusion coefficient so as to cover the n-type bit-line diffusion regions 201B, which are formed by the introduction of As.

Further, in the memory cell region 300A, the ONO film 202 is formed successively along the surfaces of the grooves $201G_1$ on the surface of the Si substrate 201 as the electric charge storing film of the SONOS-type flash memory. The gate electrode 203 of the polysilicon film 203A and the WSi film 203B is formed on the ONO film 202 so as to extend in a direction to cross the direction in which the grooves $201G_1$ extend.

Further, in this embodiment, n-type channel-doping regions 201D are formed along the ONO film 202 on the sidewall faces of the grooves $201G_1$ in the memory cell region 300A.

Meanwhile, in the peripheral circuit region 300B, the surface of the groove $201G_2$ is covered with the thermal oxide film 201t, and the groove $201G_2$ is filled with the CVD-SiO$_2$ pattern 201S forming an STI structure.

Further, in the peripheral circuit region 300B, the thermal oxide film 204 is formed on the surface of the Si substrate 201 as the gate insulating film of the MOS transistors formed in the peripheral circuit region 300B. The gate electrode 205 of layers of the polysilicon film 203A and the WSi film 203B is formed on the gate oxide film 204.

The peripheral circuit region 300B has the same configuration as the peripheral circuit region 200B of the second embodiment.

The operations of the SONOS-type flash memory formed in the memory cell region 300A in this embodiment are equal to those described with reference to FIGS. 32A and 32B.

Next, a description will be given, with reference to FIGS. 48A through 52B, of a process for manufacturing the flash memory integrated circuit device 300 according to the third embodiment of the present invention.

Figure 48B:
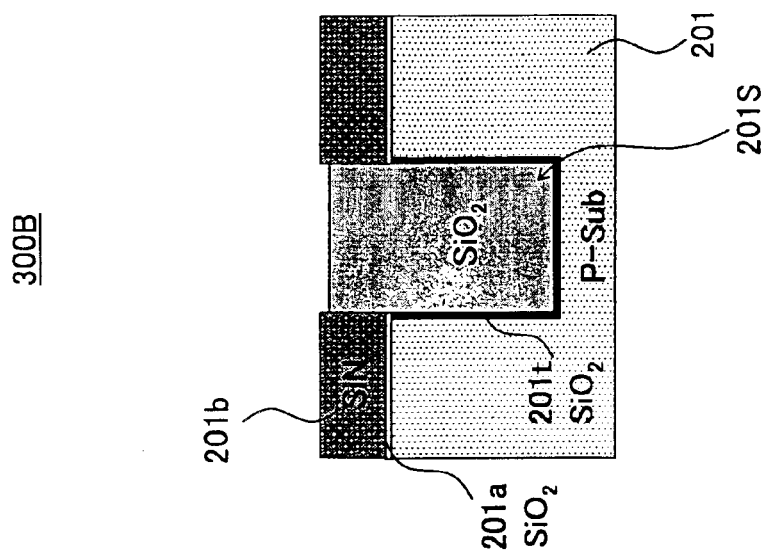
FIGS. 48A and 48B are diagrams showing a process for manufacturing the SONOS-type flash memory integrated circuit device according to the third embodiment of the present invention.
Figure 48A:
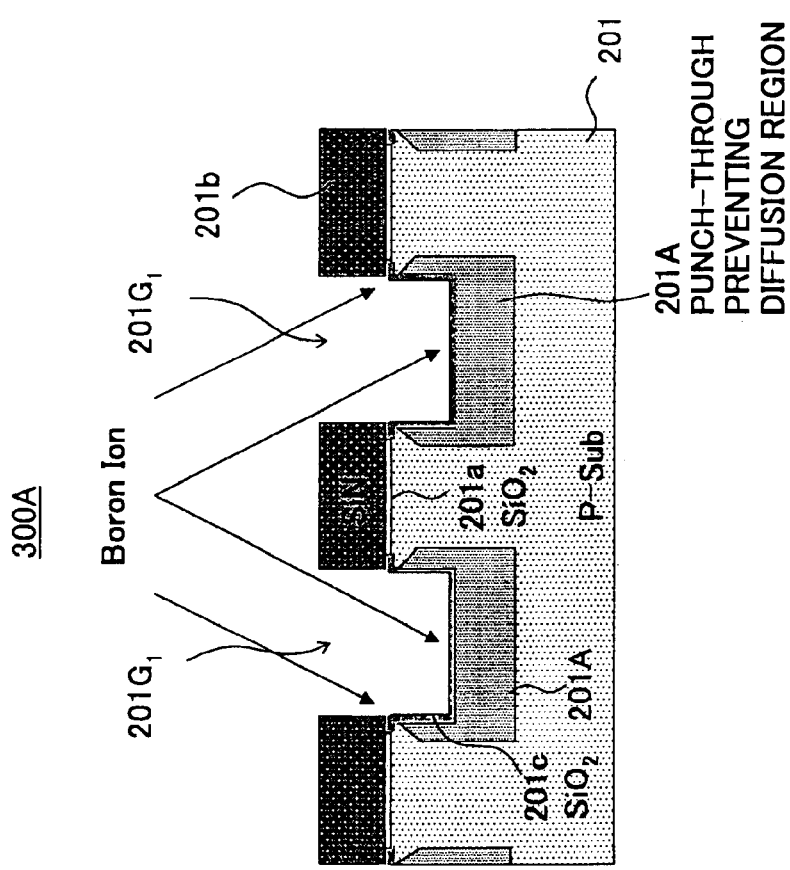

Referring to FIGS. 48A and 48B, the same structure as that of FIGS. 38A and 38B is formed by the same process as in the second embodiment. Further, in the process of FIGS. 48A and 48B, the p-type punch-through preventing diffusion regions 201A are formed on the sidewall faces and the bottom faces of the grooves $201G_1$ in the memory cell region 300A by performing B ion implantation at an angle thereon through the thermal oxide film 201c covering the surfaces of the grooves $201G_1$, using the SiN film 201b as a mask. The B ion implantation process is performed, for instance, at tilt angles of 15° through 30° with doses of $1\sim3\times10^{13}$ cm$^{-2}$ under acceleration voltages of 50 through 70 keV. Since the SiN film 201$b$ and the STI structure 201S are only exposed in the peripheral circuit region 300B, no B ions are introduced into the Si substrate 201 by this ion implantation.

Figure 49B:
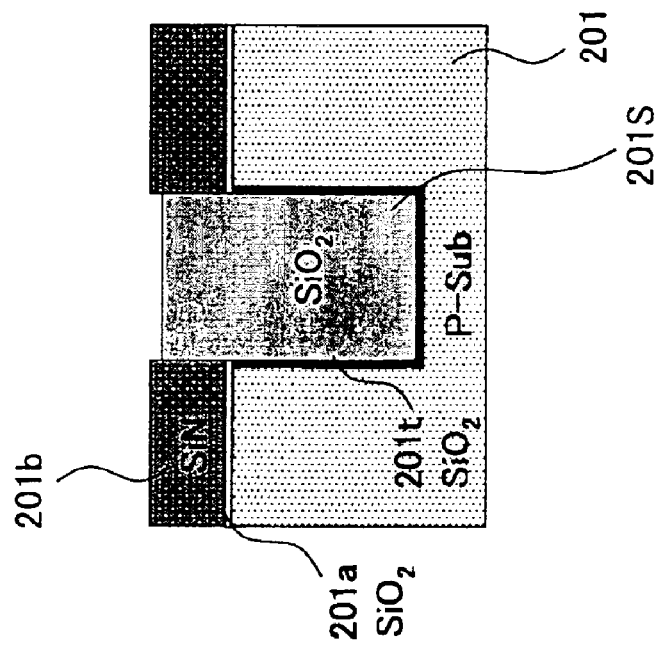
FIGS. 49A and 49B are diagrams showing the process for manufacturing the SONOS-type flash memory integrated circuit device according to the third embodiment of the present invention.
Figure 49A:
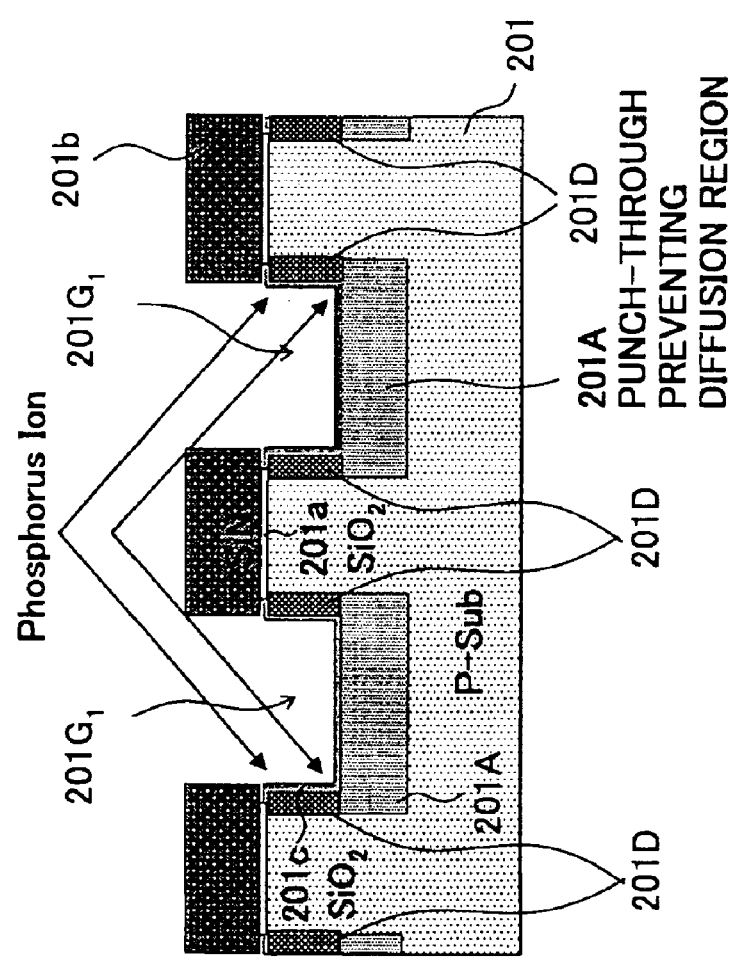

Next, in the process of FIGS. 49A and 49B, with the SiN film 201$b$ being kept employed as a mask, P ion implantation is performed at an angle on the memory cell region 300A with doses of $5\times10^{12}$ through $2\times10^{13}$ cm$^{-2}$ under acceleration voltages of 50 through 70 keV. Thereby, the n-type channel-doping diffusion regions 201D are formed on the sidewall faces of the grooves 201G$_1$ so as to eliminate the earlier formed p-type punch-through preventing diffusion regions 201A. At this point, the tilt angle at the time of performing the P ion implantation is set so that the P ions are implanted into only the sidewall faces of the grooves 201G$_1$.

Figure 50B:
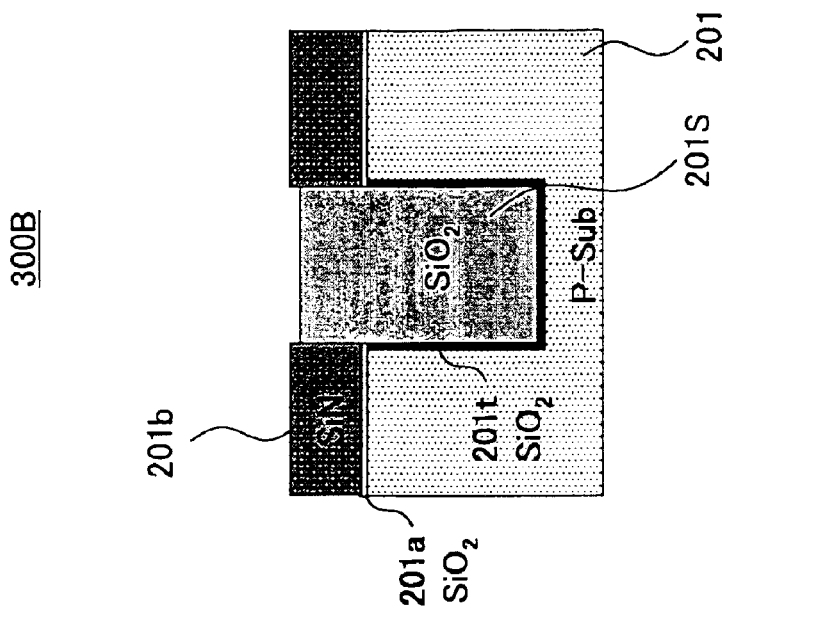
FIGS. 50A and 50B are diagrams showing the process for manufacturing the SONOS-type flash memory integrated circuit device according to the third embodiment of the present invention.
Figure 50A:
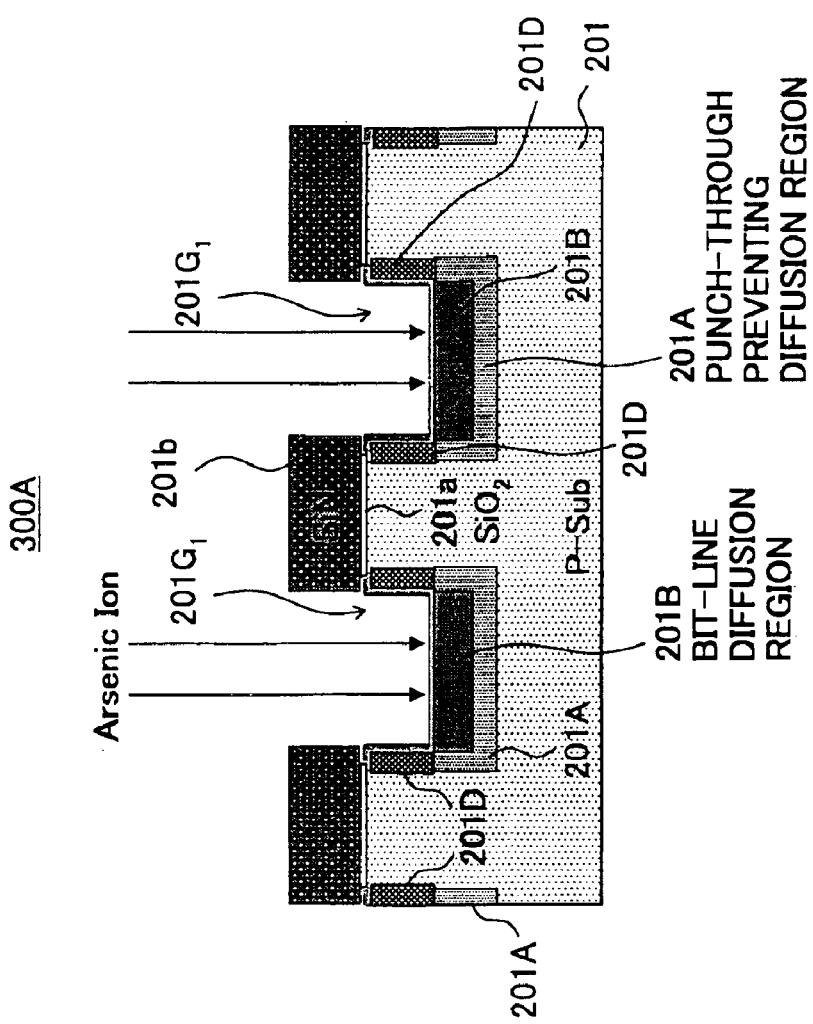

Next, in the process of FIGS. 50A and 50B, As ion implantation is further performed vertically on the Si substrate 201 with doses of $1\sim3\times10^{15}$ cm$^{-2}$ under acceleration voltages of 60 through 80 keV. Thereby, the n-type bit-line diffusion regions 201B are formed at the bottom of the grooves 201G$_1$ in the memory cell region 300A as in the process of FIGS. 40A and 40B.

After the process of FIGS. 50A and 50B, the processes of FIGS. 41A and 41B through 45A and 45B of the second embodiment are performed so that the structure of FIGS. 51A and 51B is obtained.

Figure 52A:
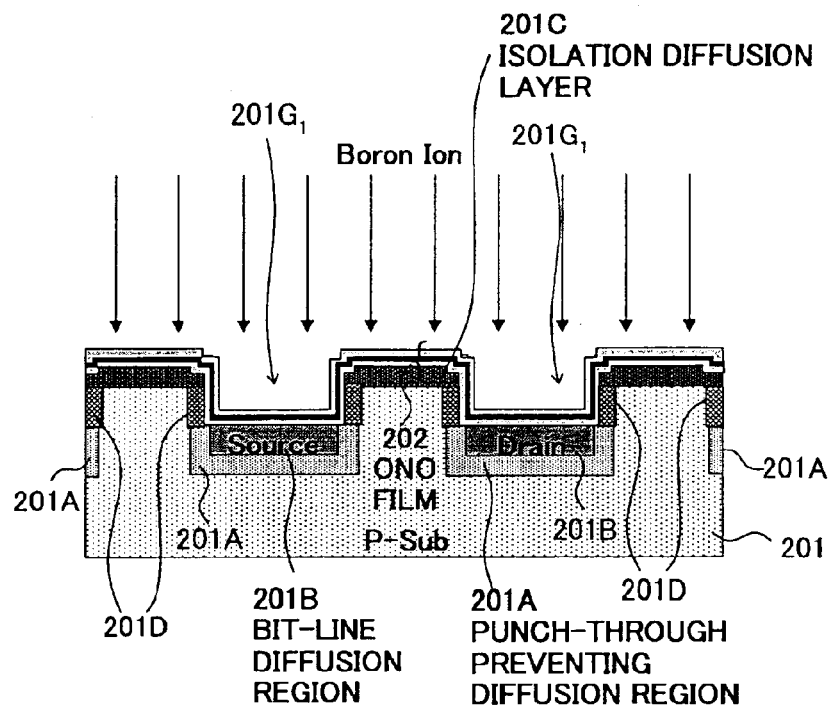
FIGS. 52A and 52B are diagrams showing the process for manufacturing the SONOS-type flash memory integrated circuit device according to the third embodiment of the present invention.
Figure 52B:
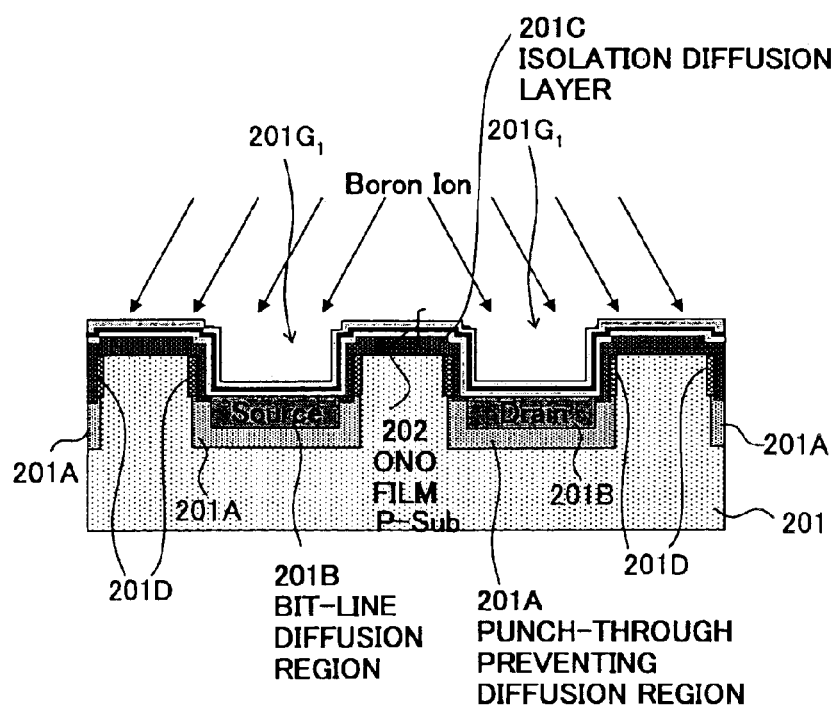

Further, the ion implantation process corresponding to the process of FIGS. 46A or 46B in the second embodiment is performed in the process of FIGS. 52A or 52B. Thereby, the p-type isolation diffusion layer 201C is formed on the surface of the Si substrate 201 as shown in FIG. 52A or is formed on the surface of the Si substrate 201 and the sidewall faces of the grooves 201G$_1$ so as to be partially superimposed over the channel-doping diffusion regions 201D as shown in FIG. 52B.

[Fourth Embodiment]

FIGS. 53A and 53B are sectional views of a flash memory integrated circuit device 400 including a SONOS-type flash memory according to a fourth embodiment of the present invention. FIGS. 53A and 53B show a memory cell region 400A and a peripheral circuit region 400B, respectively, of the flash memory integrated circuit device 400. In the drawings, the same elements as those previously described are referred to by the same numerals, and a description thereof will be omitted.

Referring to FIG. 53A, in the memory cell region 400A, an n-type well 201N and a p-type well 201P are formed so that the p-type well 201P is included in the n-type well 201N. The grooves 201G$_1$ are formed on the p-type well 201P parallel to each other. On the other hand, the isolation groove 201G$_2$ deeper than the grooves 201G$_1$ is formed in the peripheral circuit region 400B.

In the memory cell region 400A, the p-type punch-through preventing diffusion regions 201A and the n-type bit-line diffusion regions 201B are formed at the bottom of the grooves 201G$_1$. The p-type diffusion regions 201A are formed by the introduction of B having a large diffusion coefficient so as to cover the n-type bit-line diffusion regions 201B, which are formed by the introduction of As.

Further, in the memory cell region 400A, the ONO film 202 is formed successively along the surfaces of the grooves 201G$_1$ on the surface of the Si substrate 201 as the electric charge storing film of the SONOS-type flash memory. The gate electrode 203 of the polysilicon film 203A and the WSi film 203B is formed on the ONO film 202 so as to extend in a direction to cross the direction in which the grooves 201G$_1$ extend.

Meanwhile, in the peripheral circuit region 400B, the surface of the groove 201G$_2$ is covered with the thermal oxide film 201$t$, and the groove 201G$_2$ is filled with the CVD-SiO$_2$ pattern 201S forming an STI structure.

Further, in the peripheral circuit region 400B, the thermal oxide film 204 is formed on the surface of the Si substrate 201 as the gate insulating film of the MOS transistors formed in the peripheral circuit region 400B. The gate electrode 205 of layers of the polysilicon film 203A and the WSi film 203B is formed on the gate oxide film 204.

The peripheral circuit region 400B has the same configuration as those of the previous embodiments.

Figures 54A, 54B:
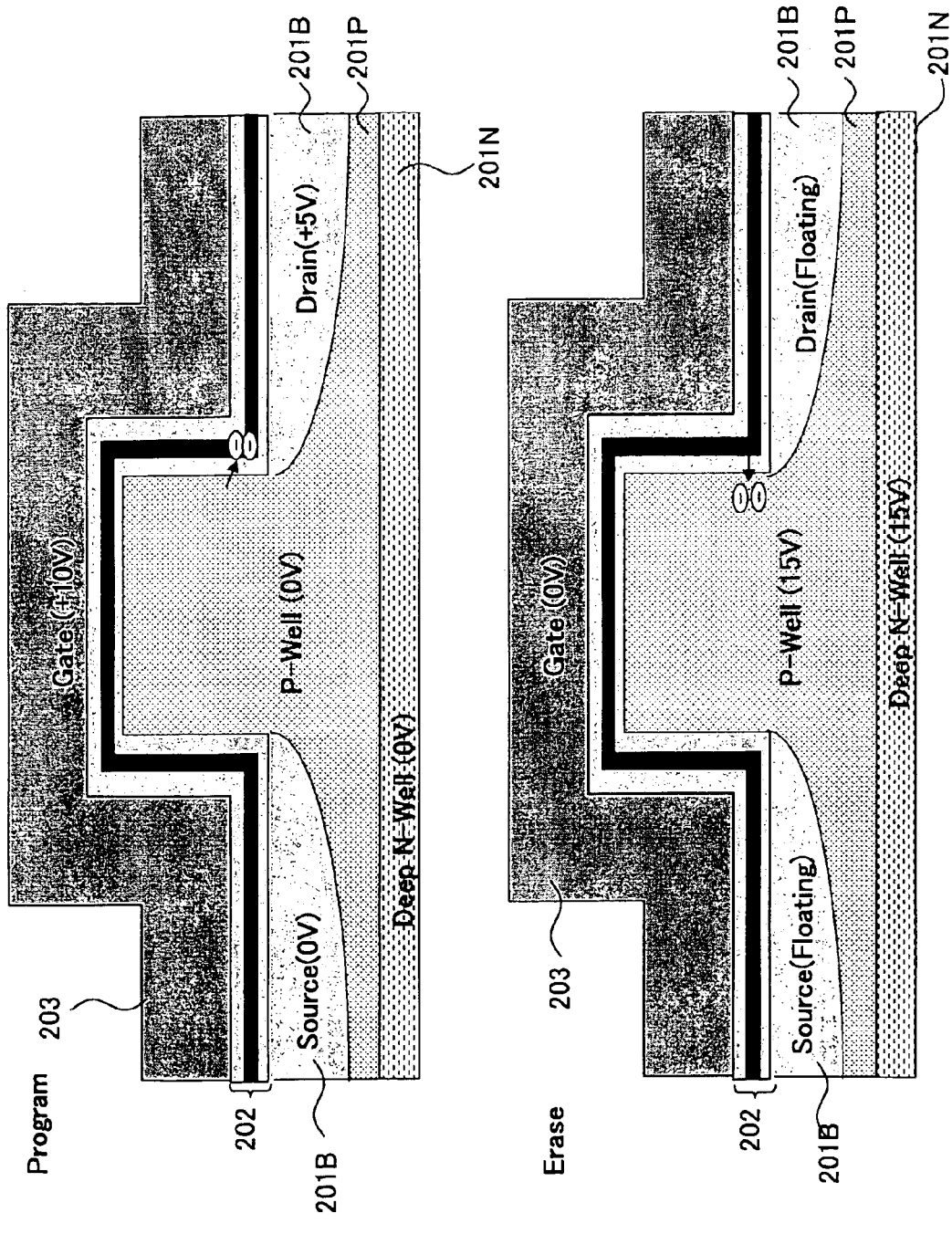
FIGS. 54A and 54B are diagrams for illustrating the operations of the SONOS-type flash memory integrated circuit device according to the fourth embodiment of the present invention.

FIGS. 54A and 54B are diagrams for illustrating the writing (programming) operation and the erasing operation of the SONOS-type flash memory of the fourth embodiment.

Referring to FIG. 54A, in the case of writing information by injecting electrons into the bit-line diffusion region 201B on the right side in the drawing, the n-type well 201N and the left-side bit-line diffusion region 201B employed as a source region are grounded while a driving voltage of +5 V is applied to the right-side bit-line diffusion region 201B. Further, by applying a writing voltage of +10 V to the gate electrode 203, hot electrons are injected from the p-type well 201P where a channel is formed into the ONO film 202 in the proximity of the drain region. Likewise, by applying a driving voltage of +5 V to the left-side bit-line diffusion region 201B are grounding the right-side bit-line diffusion region 201B, hot electrons can be injected into the ONO film 202 in the proximity of the left-side bit-line diffusion region 201B.

In this embodiment, writing may also be performed by the injection of avalanche hot electrons.

Meanwhile, at the time of erasing, as shown in FIG. 54B, the right and left bit-line diffusion regions 201B are set to be in a floating state, the gate electrode 203 is grounded, and an erasing voltage of +15 V is applied to the n-type well 201N. In this embodiment, the n-type well 201N is formed in the p-type Si substrate 201. Therefore, at the time of erasing, a large positive voltage can be applied to the n-type well 201N. As a result, the electrons captured in the ONO film 202 are extracted in the form of an FN-type tunnel current into the p-type well 201P. Further, in this embodiment, erasing may also be performed through an interband tunnel or by the injection of avalanche hot electrons.

Figure 55B:
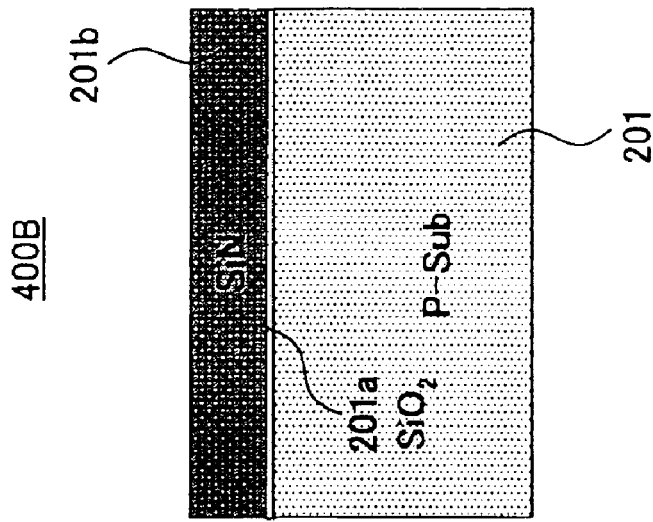
FIGS. 55A and 55B are diagrams showing a process for manufacturing the SONOS-type flash memory integrated circuit device according to the fourth embodiment of the present invention.
Figure 55A:
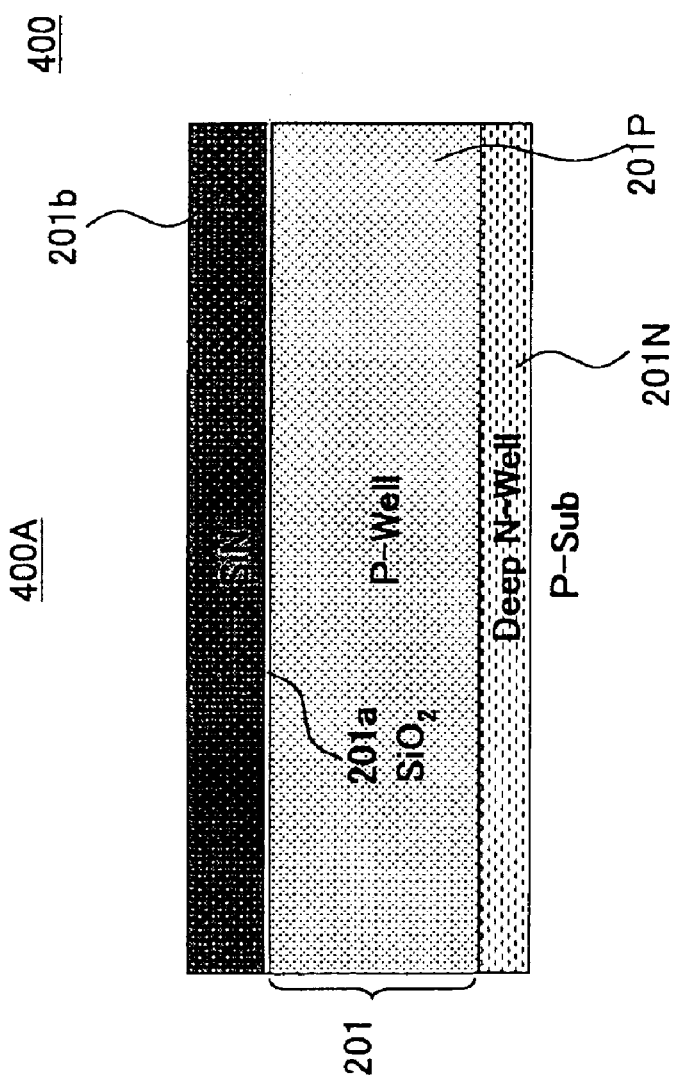

Next, a description will be given, with reference to FIGS. 55A and 55B, of a process for manufacturing the flash memory integrated circuit device 400 of this embodiment.

referring to FIGS. 55A and 55B, the n-type well 201N and the p-type well 201P are formed in the Si substrate 201 in the memory cell region 400A. Further, the thermal oxide film 201$a$ is formed on the surface of the p-type well 201P in the memory cell region 400A and on the p-type Si substrate 201 in the peripheral circuit region 400B. The SiN film 201$b$ is further formed on the thermal oxide film 201$a$.

Further, by performing the processes of FIGS. 48A and 48B through 52A and 52B in the third embodiment, the flash memory integrated circuit device 400 having the n-type well 201N in the memory cell region 400A shown in FIGS. 53A and 53B is obtained.

[Fifth Embodiment]

The above-described embodiments relate to a method of manufacturing a memory integrated circuit divide including a SONOS-type flash memory. The method of the present invention, however, is not limited to the SONOS-type flash memory, but is also effective in manufacturing a memory integrated circuit device including a flash memory of a stacked gate type.

Figure 56A:
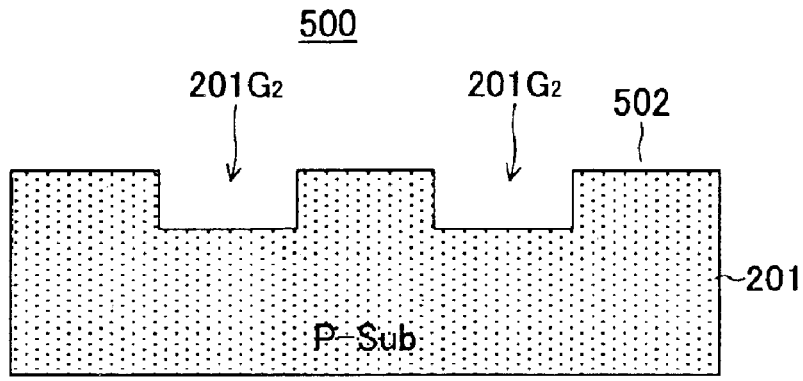
FIGS. 56A through 56F are diagrams showing a process for manufacturing a stacked gate-type flash memory integrated circuit device according to a fifth embodiment of the present invention.
Figure 56B:
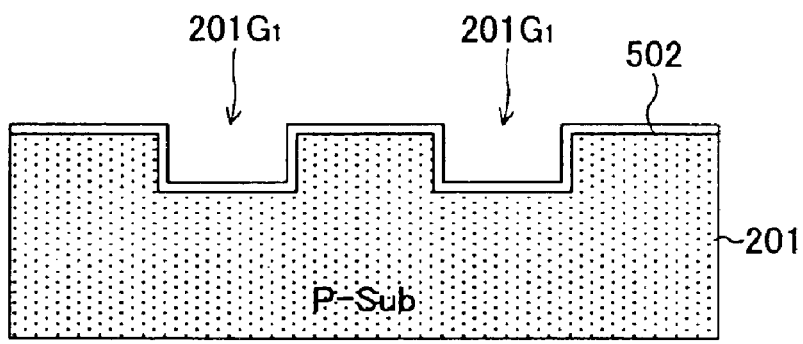
Figure 56C:
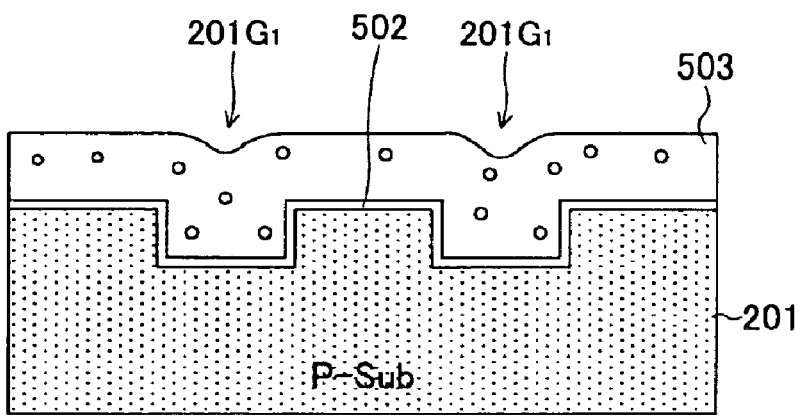
Figure 56D:
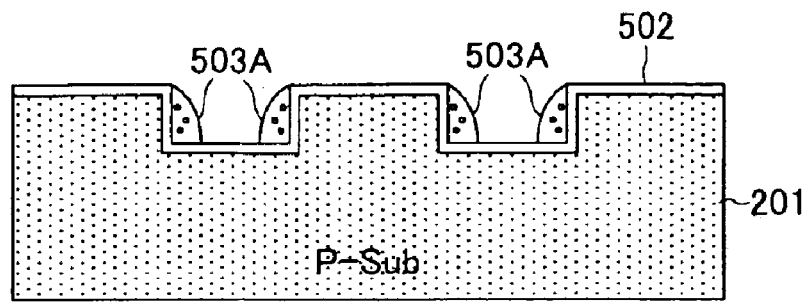
Figure 56E:
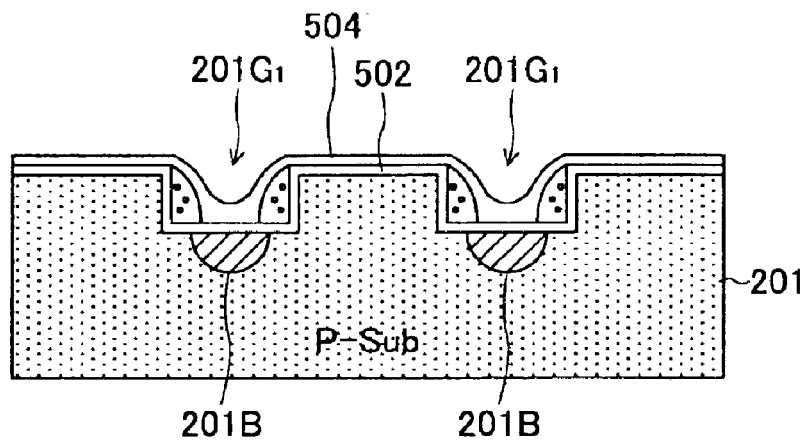
Figure 56F:
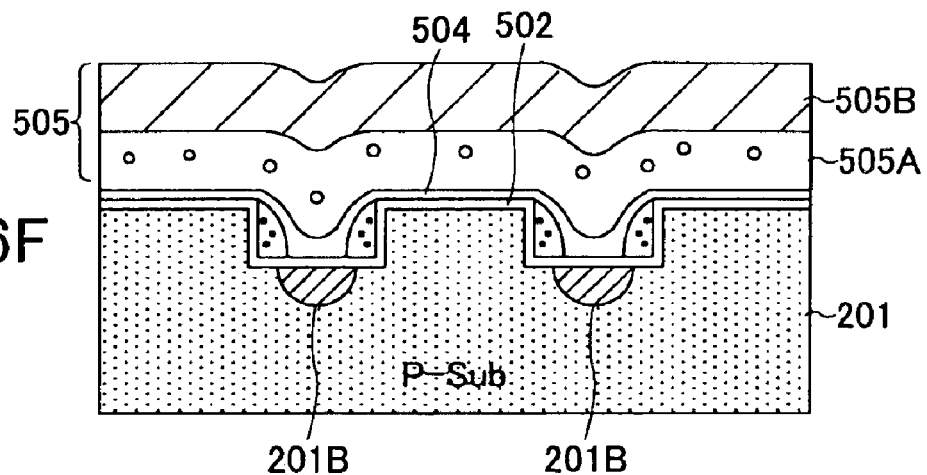

FIGS. 56A and 56F are diagrams showing a method of manufacturing a memory integrated circuit device including stacked-type flash memory cells in a memory cell region 500 thereof according to a fifth embodiment of the present invention. In the following, a description will be given only of the memory cell region 500, and a description of the peripheral circuit region or the pumping circuit region of the memory integrated circuit device will be omitted. In the drawings, the same elements as those previously described are referred to by the same numerals, and a description thereof will be omitted.

In this embodiment, first, the structure of FIG. 56A having the grooves $201G_1$ is formed by the processes of FIGS. 33A and 33B through 38A and 38B. Next, in the process of FIG. 56B, a thermal oxidation process is performed on the structure of FIG. 56A so that a thermal oxide film 502 is formed thereon as a tunnel insulating film.

Next, in the process of FIG. 56C, a polysilicon film 503 is deposited on the structure of FIG. 56B so as to fill the grooves $201G_1$. Further, in the process of FIG. 56D, the polysilicon film 503 is etched back so that polysilicon patterns 503A are formed along the sidewall faces of the grooves $201G_1$ as floating electrodes.

Further, in the process of FIG. 56E, using the polysilicon patterns 503A as a self-alignment mask, an impurity element is ion-implanted into the Si substrate 201, so that the bit-line diffusion regions 201B each acting as a source or drain are formed in the Si substrate 201.

Next, in the process of FIG. 56E, an ONO film 504 is formed on the structure of FIG. 56D. Further, in the process of FIG. 56F, a polysilicon film 505A and a WSi film 505B are deposited on the structure of FIG. 56E and subjected to patterning so that a control electrode 505 is formed.

In this embodiment, the grooves $201G_1$ and the groove $201G_2$ in the peripheral circuit region are also formed simultaneously with the same mask. Further, the bit-line diffusion regions 201B are formed in the memory cell region 500 in self-alignment with the grooves $201G_1$. Therefore, there is ideal positioning agreement formed between the stacked-type flash memory in the memory cell region 500 and the peripheral transistors formed in the peripheral circuit region.

Thus, the present invention is not limited to the manufacturing of a memory integrated circuit device including a SONOS-type flash memory, but is also applicable to the manufacturing of a memory integrated circuit device including a stacked gate-type flash memory or to the manufacturing of a DRAM integrated circuit device including a trench capacitor.

Thus, according to the present invention, a first groove and a second groove are simultaneously formed in the memory cell region and the peripheral circuit region, respectively. Therefore, it is possible to form a device in the memory cell region and a device in the peripheral circuit region in ideal positioning agreement with each other without separately forming and positioning a mask for the memory cell region and a mask for the peripheral circuit region.

Further, according to the present invention, after forming an electric charge storing insulating film or a tunnel insulating film as a first insulating film in the memory cell region, the first insulating film is removed from the peripheral circuit region, and a second insulating film is newly formed as a gate insulating film in the peripheral circuit region. Therefore, the degradation of the film quality of the gate insulating film or a capacitor insulating film in the peripheral circuit region is avoidable.

The present invention is not limited to the specifically disclosed embodiments, but variations and modifications may be made without departing from the scope of the present invention.

What is claimed is:

1. A method of manufacturing a memory integrated circuit device including a memory cell region and a peripheral circuit region on a semiconductor substrate, the method comprising the steps of:
   (a) forming a first groove in the memory cell region on the semiconductor substrate;
   (b) forming a second groove in the peripheral circuit region on the semiconductor substrate; and
   (c) forming a memory cell transistor in self-alignment with the first groove in the memory cell region and forming a peripheral circuit transistor in the peripheral circuit region using the second groove as an isolation groove,
   wherein said steps (a) and (b) are performed simultaneously.

2. The method as claimed in claim 1, wherein said steps (a) and (b) are performed using a single mask.

3. The method as claimed in claim 1, further comprising the step of (d) increasing a depth of the second groove with respect to a depth of the first groove.

4. The method as claimed in claim 1, wherein said step (c) comprises the steps of:
   (d) filling the second groove with an isolation insulating pattern in the peripheral circuit region;
   (e) forming a first insulating film on a surface of the semiconductor substrate so that the first insulating film successively covers the surface of the semiconductor substrate so that the of the first groove in the memory cell region;
   (f) removing the first insulating film from the surface of the semiconductor substrate except for the memory cell region;
   (g) forming a second insulation film on the surface of the semiconductor substrate in the peripheral circuit region; and
   (h) forming a conductive film on the semiconductor substrate so that the conductive film covers the first insulating film in the memory cell region and the second insulating film in the peripheral circuit region.

5. The method as claimed in claim 4, further comprising the step of (i) forming a first gate electrode in the memory cell region and a second gate electrode in the peripheral circuit region by performing patterning on the conductive film in the memory cell region and the peripheral circuit region using a single mask.

6. The method as claimed in claim 4, further comprising the step of (j) forming a thermal oxide film on a surface of the second groove before said step (d).

7. The method as claimed in claim 4, wherein:
   the first insulating film includes a nitride film and forms an electric charge storing layer: and
   the conductive film is formed in contact with the first insulating film.

8. The method as claimed in claim 4, further comprising the step of (i) forming a conductive diffusion region of a first conduction type on the surface of the semiconductor substrate except for the first groove in the memory cell region and except for the peripheral circuit region before said step (e) after said step (d).

9. The method as claimed in claim 8, wherein:
said steps (a) and (b) comprise the steps of:
(j) forming a mask layer on the semiconductor substrate and forming openings corresponding to the first and second grooves in the mask layer; and
(k) forming the first and second groove corresponding to the openings by etching the semiconductor substrate using the mask layer as a mask;
said step (d) comprises the steps of:
(l) depositing an isolation insulating film on the mask layer so that the isolation insulating film fills the first and second grooves, and polishing and removing the isolation insulating film deposited on the mask layer using the mask layer as a stopper; and
(m) removing the mask layer; and
said step (i) is performed by performing ion implantation of an impurity element of the first conduction type using film patterns of the isolation insulating film as a self-alignment mask, the film patterns remaining in the first and second grooves.

10. The method as claimed in claim 9, further comprising the step of (n) forming a conductive diffusion region of a second conduction type at the bottom of the first groove in the semiconductor substrate in the memory cell region.

11. The method as claimed in claim 4, further comprising the step of (i) selectively forming a conductive diffusion region of a first conduction type on a bottom face of the first groove after said step (d) before said step (e).

12. The method as claimed in claim 11, further comprising the step of (j) selectively forming a conductive diffusion region of a second conduction type on the bottom face of the first groove after said step (d) before said step (i).

13. The method as claimed in claim 12, wherein:
said steps (a) and (b) comprises the steps of:
(k) forming a mask layer on the semiconductor substrate and forming opening corresponding to the first and second grooves in the mask layer; and
(l) forming the first and second grooves corresponding to the openings by etching the semiconductor substrate using the mask layer as a mask;
said step (d) comprises the steps of:
(m) depositing an isolation insulating film on the mask layer so that the isolation insulating film fills the first and second grooves, and polishing and removing the isolation insulating film deposited on the mask layer using the mask layer as a stopper; and
(n) removing the isolation insulating film from the first groove; and
said step (i) is performed by performing ion implantation of an impurity element of the first conduction type using the mask layer as a self-alignment mask.

14. The method as claimed in claim 12, wherein said step (j) comprises the step of (k) performing ion implantation of an impurity element of the second conduction type at an angle on a sidewall face of the fist groove.

15. The method as claimed in claim 14, further comprising the step of (l) performing ion implantation of an impurity element of the first conduction type at an angle on the sidewall face of the first groove after said step (k).

16. The method as claimed in claim 4, further comprising the steps of:
(i) depositing an additional conductive film so that the additional conductive film covers the first insulating film;
(j) forming a sidewall insulating film on a sidewall face of the first groove as a floating gate electrode by etching back the additional conductive film, the sidewall insulating film being formed of the additional conductive film; and
(k) depositing an additional insulating film so that the additional insulating film covers the sidewall insulating film,
wherein:
said steps (i), (j), and (k) are performed before said step (h) after said step (e); and
the conductive film is formed in contact with the additional insulating film.

17. The method as claimed in claim 1, wherein the semiconductor substrate further includes a pumping circuit region, the method further comprising the steps of:
(d) forming a third groove in the pumping circuit region on the semiconductor substrate simultaneously with said steps (a) and (b) using a single mask; and
(e) forming a pumping capacitor in the third groove in the pumping circuit region.

* * * * *